US012801818B2

(12) United States Patent
Chi et al.

(10) Patent No.: US 12,801,818 B2
(45) Date of Patent: Nov. 17, 2026

(54) METHOD AND SYSTEM FOR EMULATING IC DESIGN WITH FPGA, AND STORAGE MEDIUM

(71) Applicant: SHANGHAI UNIVISTA INDUSTRIAL SOFTWARE GROUP CO., LTD., Shanghai (CN)

(72) Inventors: Jingxuan Chi, Shanghai (CN); Jiong Cao, Shanghai (CN); Cheng Li, Shanghai (CN)

(73) Assignee: SHANGHAI UNIVISTA INDUSTRIAL SOFTWARE GROUP CO., LTD., Shanghai (CN)

( * ) Notice: Subject to any disclaimer, the term of this patent is extended or adjusted under 35 U.S.C. 154(b) by 749 days.

(21) Appl. No.: 18/276,737

(22) PCT Filed: Jul. 25, 2023

(86) PCT No.: PCT/CN2023/109188
§ 371 (c)(1),
(2) Date: Aug. 10, 2023

(87) PCT Pub. No.: WO2024/041290
PCT Pub. Date: Feb. 29, 2024

(65) Prior Publication Data

US 2025/0005247 A1 Jan. 2, 2025

(30) Foreign Application Priority Data

Aug. 24, 2022 (CN) ......................... 202211018303.7
Jun. 5, 2023 (CN) ......................... 202310658622.2

(51) Int. Cl.
*G06F 30/347* (2020.01)

(52) U.S. Cl.
CPC .................................. *G06F 30/347* (2020.01)

(58) Field of Classification Search
CPC ............... G06F 30/347; G06F 2119/12; G06F 30/3312; G06F 30/396; G06F 30/331
See application file for complete search history.

(56) References Cited

U.S. PATENT DOCUMENTS

| | | | |
|---|---|---|---|
| 5,825,658 | A | 10/1998 | Ginetti et al. |
| 6,127,864 | A | 10/2000 | Mavis et al. |

(Continued)

FOREIGN PATENT DOCUMENTS

| | | | |
|---|---|---|---|
| CN | 104866678 | A | 8/2015 |
| CN | 105138774 | A | 12/2015 |
| CN | 111370040 | A | 7/2020 |

OTHER PUBLICATIONS

Cao, HDL Code Performance Valuation and PAITS Optimization, Jun. 23, 2016 at https://libthesis.xidian.edu.cn/docinfo.action?id1=3a338e35a9a9cb6dcd3a63cb2677cb86&id2=hz8Rja5fPoY%253D.

(Continued)

*Primary Examiner* — Nha T Nguyen

(57) ABSTRACT

The invention relates to the technical field of electronic design automation (EDA), especially relates to a method and a system for emulating an IC design with an FPGA, and a storage medium. It is characterized by substituting clock models for the sequential cells; adding a user enable to an external port of a clock model compared to the port of a sequential cell in the IC design, through a user clock to which a user enable of a clock model is connected and a primary clock' to which a clock input of a clock model is connected, a clock model$_{[CA]}$ reproducing the function of the sequential cell in the IC design by controlling outputting time of a data sample, and the clock model$_{[CB]}$ reproducing the function of the sequential cell in the IC design by controlling data sampling time; and configuring phase shifts for primary clocks' by which the clock model$_{[CA]}$ and the clock model$_{[CB]}$ are driven, so as to solve the technical (Continued)

problem of sampling error due to presence of the user clock while ensuring the functions of the original sequential cells.

27 Claims, 23 Drawing Sheets

(56) References Cited

U.S. PATENT DOCUMENTS

| | | | | |
|---|---|---|---|---|
| 10,740,532 | B1 | 8/2020 | Reece et al. | |
| 10,755,009 | B1 * | 8/2020 | Bradley | G06F 30/3312 |
| 2004/0225978 | A1 | 11/2004 | Fan et al. | |
| 2014/0325463 | A1 | 10/2014 | Bahadra et al. | |
| 2017/0147725 | A1 * | 5/2017 | Larzul | G06F 30/331 |
| 2019/0138677 | A1 * | 5/2019 | Peng | G06F 30/327 |
| 2022/0067251 | A1 * | 3/2022 | McIlwain et al. | G06F 30/34 |

OTHER PUBLICATIONS

Yu et al., An Analysis of the Spaceborne RFSCAT Acquisition Numbers, Space Electronic Technology, 2009, 67-72, vol. 2, Xian, China.

Love Cederström, EDA Environments for 3D Chip Stacks, 3D Stacked Chips: From Emerging Processes to Heterogeneous Systems, 2016, Ch. 9, Switzerland.

* cited by examiner

METHOD AND SYSTEM FOR EMULATING IC DESIGN WITH FPGA, AND STORAGE MEDIUM

RELATED APPLICATIONS

The application is the U.S. national phase of PCT/CN2023/109188 filed Jul. 25, 2023, which claims the benefit of CN202211018303.7 filed Aug. 24, 2022 and CN202310658622.2 filed Jun. 5, 2023, each of which is incorporated herein by reference in its entirety.

FIELD OF THE INVENTION

The invention relates to the technical field of electronic design automation (EDA), specially relates to a method and a system for emulating an IC design with an FPGA, and a storage medium.

BACKGROUND OF THE INVENTION

Integrated circuit design (IC design) is a design flow with IC or super-large-scale IC as target. IC design comprises application specific integrated circuit (ASIC) design, and ASIC is IC designed and manufactured according to requirements of specific users and needs of specific electronic systems. After the IC design is completed, it will enter tape-out stage, the cost of the tape-out is very high, and once there is a problem, it can result in tape-out failure. In order to reduce the risk of tape-out failure, it is necessary to fully validate software and hardware in the IC before tape-out, so as to timely discover some problems that are difficult to find in the design process and timely adjust the design to ensure the smooth progress of the tape-out. Common verification tools include simulation and emulation. Emulation refers to simulating hardware actually used in the chip design by the user and then emulate it. Emulation is mostly based on field programmable gate array (FPGA) chip for design. The FPGA chip comprises components such as lookup table (LUT) and register, and different functions can be realized by configuring electrical signals of corresponding components through software.

Because the physical structures of IC and FPGA are different, IC design is based on a standard cell library, and FPGA is based on a macro-cell module (lookup table) provided by a manufacturer, if you want to verify the IC design with the FPGA, a certain conversion must be made on the IC design to transplant it on the FPGA. The biggest difference between the cores of an IC and an FPGA chip is a clock structure. The clock structure in an IC includes at least one clock tree, and each clock tree has a clock tree structure composed of a primary clock and a plurality of generated clocks. In an IC design before wiring design, due to circuit delay, glitches are present in the generated clocks generated by combinatorial logic operations. If the generated clocks with glitches are connected to a clock input of a sequential cell, because the clock input of the sequential cell is sensitive to glitches, the sequential cell is mistakenly triggered to sample signals from the data input, resulting in error of the data sample output by a data output of the sequential cell. In order to solve the glitch problem, the delay of combination logic input signal can be controlled by strict wiring design in IC design, and then the generation of glitch can be controlled. However, if IC design is directly applied on FPGA, since FPGA is a pre-wired semi-custom circuit, the generation of glitches cannot be controlled in the manner of controlling delay by controlling wiring length, and the problem of glitch-caused error data sample output by the sequential cell cannot be avoided.

OBJECTS AND SUMMARY OF THE INVENTION

It is an object of the claimed invention to overcome some or all of these shortcomings.

For this, according to the first aspect, the present invention provides a method for emulating an IC design with an FPGA, comprising the steps of:

S1) identifying in the IC design: a primary clock, a subcircuit, a plurality of generated clocks and a plurality of sequential cells, wherein the plurality of generated clocks are derived from the primary clock after being processed by the subcircuit, and a user clock being connected to one of the plurality of sequential cells is the primary clock or one of the plurality of generated clocks.

S2) converting the IC design into a directed graph, including: 2.1) converting the plurality of sequential cells to a plurality of nodes, and 2.2) constructing the directed graph by connecting the plurality of nodes.

Wherein, S2.1 includes converting a sequential cell in the plurality of sequential cells to a node, including: i) identifying on the sequential cell: a user clock by which the sequential cell is driven; a data input; a user-clock input and a data output, wherein the user clock is connected to the user-clock input; ii) converting the sequential cell into a node, including: defining a logic path having a pair of endpoints, wherein: the user-clock input constitutes one of the pair of endpoints; and the data output constitutes the other one of the pair of endpoints; defining a node on the logic path between the pair of endpoints; and defining another logic path and defining a node on the other logic path between its pair of endpoints.

S3), configuring the plurality of nodes on the directed graph which includes exactly a root node and a plurality of leaf nodes, including: 3.1) inserting a clock model at a node on the directed graph, and 3.2) configuring a phase shift for a primary clock'.

Wherein, S3.1 includes 3.1.1) labeling on the directed graph at least a node as group A and at least another node as group B; 3.1.2) modifying the nodes that are labeled as group A; and 3.1.3) modifying the nodes that are labeled as group B.

Further, S3.1.2 includes i) configuring the clock $\text{model}_{[CA]}$, which includes a data $\text{input}_{[CA]}$, a data $\text{output}_{[CA]}$, a user $\text{enable}_{[CA]}$ and a clock $\text{input}_{[CA]}$.

ii) modifying a $\text{node}_{[A]}$ in the plurality of nodes being labeled as group A, including:

ii.1) identifying a logic path by which the $\text{node}_{[A]}$ is defined in view of S2, wherein: an endpoint of the logic path is located at a user-clock $\text{input}_{[A]}$; the other endpoint of the logic path is located at a data $\text{output}_{[A]}$; and the user $\text{clock}_{[A]}$ is connected to the user-clock $\text{input}_{[A]}$; ii.2) inserting a clock $\text{model}_{[CA]}$ at the $\text{node}_{[A]}$, including: connecting the data $\text{input}_{[CA]}$ to what was connected to the data $\text{input}_{[A]}$; connecting the data $\text{output}_{[CA]}$ to what was connected to the data $\text{output}_{[A]}$; connecting the user $\text{enable}_{[CA]}$ to what was connected to the user-clock $\text{input}_{[A]}$; and connecting the clock $\text{input}_{[CA]}$ to a primary clock' which is equal to or greater than the primary clock in frequencies; and ii.3) configuring the clock $\text{model}_{[CA]}$, including: sampling a signal from the data $\text{input}_{[CA]}$ at an active edge of the primary clock' to obtain a data sample for a period of the primary clock' led by the active edge; when an N-th active edge is occurring on the user $clock_{[A]}$: obtaining a data $sample_{[N]}$ for a contemporary period of the primary clock'; and outputting to the data $output_{[CA]}$ the data $sample_{[N]}$ until an N+1-th active edge occurs on the user $clock_{[A]}$; and when the N+1-th active edge is occurring on the user $clock_{[A]}$: obtaining a data $sample_{[N+1]}$ for a contemporary period of the primary clock'; and outputting to the data $output_{[CA]}$ the data $sample_{[N+1]}$ until an N+2-th active edge occurs on the user $clock_{[A]}$.

iii) modifying the rest of $nodes_{[A]}$ in the plurality of nodes being labeled as group A.

Further, S3.1.3 Includes:

i) configuring the clock $model_{[CB]}$, which includes a data $input_{[CB]}$, a data $output_{[CB]}$, a user $enable_{[CB]}$ and a clock $input_{[CB]}$.

ii) modifying a $node_{[B]}$ in the plurality of nodes being labeled as group B, including: ii.1) identifying a logic path by which the $node_{[B]}$ is defined in view of S2, wherein: an endpoint of the logic path is located at a user-clock $input_{[B]}$; the other endpoint of the logic path is located at a data $output_{[B]}$; and the user $clock_{[B]}$ is connected to the user-clock $input_{[B]}$; ii.2) inserting the clock $model_{[CB]}$ at the $node_{[B]}$, including: connecting the data $input_{[CB]}$ to what was connected to the data $input_{[B]}$; connecting the data $output_{[CB]}$ to what was connected to the data $output_{[B]}$; connecting the user $enable_{[CB]}$ to what was connected to the user-clock $input_{[B]}$; and connecting the clock $input_{[CB]}$ to a primary clock' which is equal to or greater than the primary clock in frequencies; and ii.3) configuring the clock $model_{[CB]}$, including: when an active edge is occurring on the user $clock_{[B]}$ and when an active edge is occurring on the primary clock': sampling a signal from the data $input_{[CB]}$ to obtain a data sample for a period of the primary clock' led by the active edge; and; and when no active edge occurs on the user $clock_{[B]}$ or no active edge occurs on the primary clock': sampling nothing from the data $input_{[CB]}$; and outputting nothing to the data $output_{[CB]}$.

iii) modifying the rest of $nodes_{[B]}$ in the plurality of nodes being labeled as group B.

Wherein, S3.2 includes: 3.2.1) identifying a path on the directed graph and configuring a phase shift for the primary clock' to which a node on the path is connected; 3.2.2) numbering a total of K nodes on the path, wherein a $node_{[\#1]}$ is the root node and a $node_{[\#K]}$ is one of the leaf nodes; and 3.2.3) identifying another path on the directed graph and configuring a phase shift for a primary clock' to which a node on the other path is connected.

Wherein, S3.2.2 includes i) configuring a phase shift for the primary clock' to which a node being labeled as group B is connected, including: i.1) identifying on the path a set of nodes that are labeled as group B, which includes a $node_{[\#M]}$ and a $node_{[\#N]}$; and i.2) letting $F(x-t_M)=F(x-t_N)$, wherein: $t_M>t_N$; $1\leq N<M\leq K$; $F(x-t_M)$ represents a waveform of the primary clock' to which the $node_{[\#M]}$ is connected; $t_M$ is a phase shift; $F(x-t_N)$ represents a waveform of the primary clock' to which the $node_{[\#N]}$ is connected; and ty is a phase shift; ii) configuring a phase shift for the primary clock' to which a node being labeled as group A is connected, including: ii.1) identifying on the path a set of nodes that are labeled as group A, which includes a $node_{[\#U]}$; ii.2) when $1<U<K$: identifying a nearest set of nodes to the $node_{[\#U]}$ that are labeled as group B, which includes a $node_{[\#R]}$ and a $node_{[\#S]}$, wherein: $R<U<S$; and letting exactly one of the two propositions be true: $F(x-t_U)=F(x-t_R)$, wherein $t_U\geq t_R$; and $F(x-t_U)=F(x-t_S)$, wherein $t_S\geq t_U$; ii.3) when U=1: identifying a nearest set of nodes to the $node_{[\#1]}$ that are labeled as group B, which includes a $node_{[\#S]}$; and letting $F(x-t_U)=F(x-t_S)$, wherein $t_S\geq t_U$; and ii.4) when U=K: identifying a nearest set of nodes to the $node_{[\#K]}$ that are labeled as group B, which includes $node_{[\#R]}$; and letting $F(x-t_U)=F(x-t_R)$, wherein $t_U\geq t_R$, wherein: $F(x-t_R)$ represents a waveform of the primary clock' to which the $node_{[\#R]}$ is connected; $t_R$ indicates the waveform's phase; $F(x-t_U)$ represents a waveform of the primary clock' to which the $node_{[\#U]}$ is connected; $t_U$ indicates the waveform's phase; $F(x-t_S)$ represents a waveform of the primary clock' to which the $node_{[\#S]}$ is connected; and $t_S$ indicates the waveform's phase.

The second aspect, the present invention provides a system for emulating an IC design with an FPGA, comprising a processor and a computer-readable storage medium in communication with the processor, wherein: the system implements the method in claim 1 when the processor executes a program in the computer-readable storage medium.

The third aspect, the present invention provides a non-transitory computer-readable storage medium in which at least one instruction or at least one program is stored, wherein: the at least one instruction or the at least one program is loadable and executable by a processor to implement the method for emulating an IC design with an FPGA.

The present invention has at least the following beneficial effects:

The present invention provides a method for emulating an IC design with an FPGA, comprising the steps of: extracting a directed graph by identifying logic paths of the sequential cells in an IC design, and substituting clock models for the sequential cells corresponding to nodes in the directed graph; adding a user enable to an external port of a clock model compared to the port of a sequential cell in the IC design, through a user clock to which a user enable of a clock model is connected and a primary clock' to which a clock input of a clock model is connected, a clock $model_{[CA]}$ reproducing the function of the sequential cell in the IC design by controlling outputting time of a data sample, and the clock $model_{[CB]}$ reproducing the function of the sequential cell in the IC design by controlling data sampling time; and configuring phase shifts for primary clocks' by which the clock $model_{[CA]}$ and the clock $model_{[CB]}$ are driven to ensure normal operation of a circuit. The primary clocks' are directly connected to the clock inputs of the clock $model_{[CA]}$ and the clock $model_{[CB]}$ and contain no glitch, the user clock is connected to user enables of the clock $model_{[CA]}$ and the clock $model_{[CB]}$, but the user enable is non-sensitive to glitch-containing user clock, so that the invention can solve the technical problem of sampling error due to presence of the user clock while ensuring the functions of the original sequential cells.

BRIEF DESCRIPTION OF FIGURES

Other advantages, objectives and features of the present invention are in non-limiting description in at least one specific example for describing a method and a system for emulating an IC design with an FPGA and a storage medium and according to the figures, wherein:

FIG. 3 is comparison diagram of a sequential cell before and after being to what a clock model is substituted for;

DETAILED DESCRIPTION OF THE EMBODIMENTS

In an IC design before wiring design, glitches are present in the generated clocks generated by combinatorial logic operations due to circuit delay.

Figure 6:
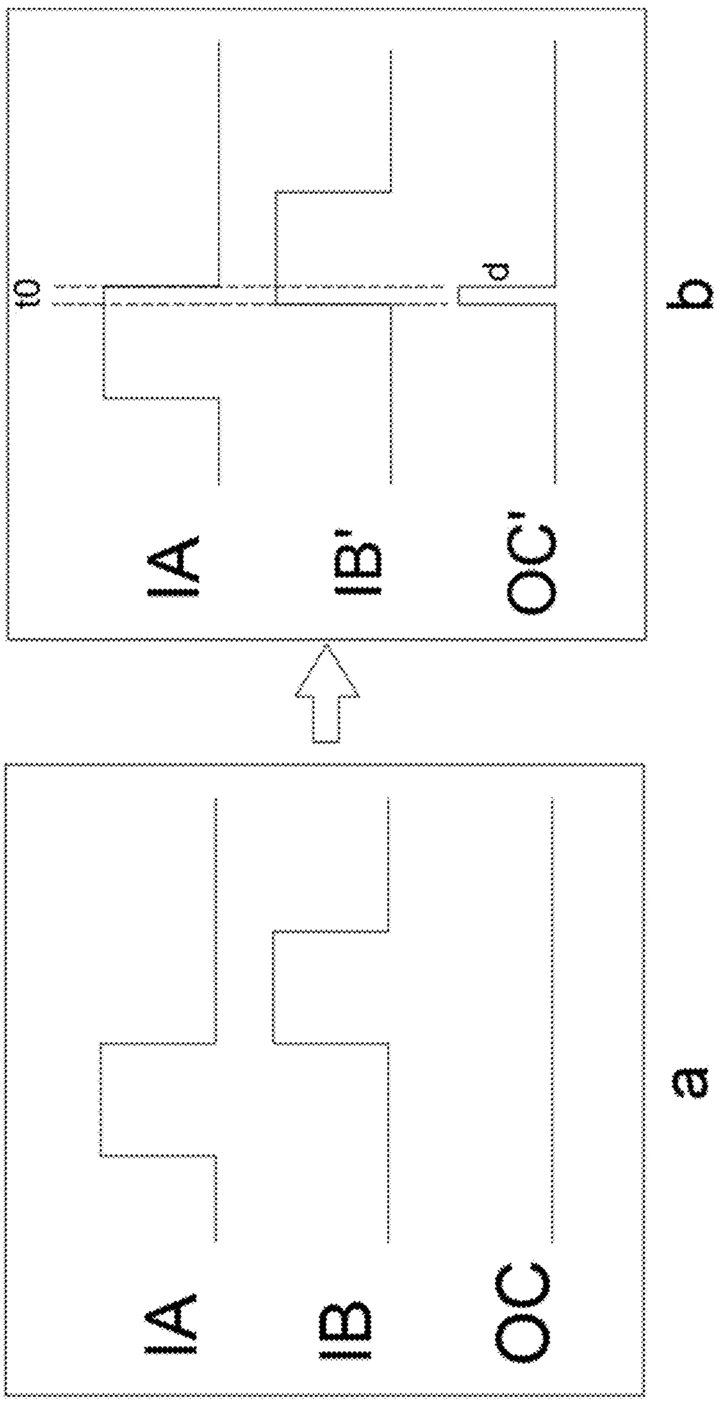
FIG. 6 is comparison schematic drawing of ideal condition in prior art to actually generated glitches.

In an IC design before wiring design, glitches are present in the generated clocks generated by combinatorial logic operations due to circuit delay. To better understand where glitches come from, an AND gate circuit with two inputs is adopted for example for description, referring to FIG. 6. In FIG. 6, the two inputs of the AND gate circuit are respectively inputs with a wave signal IA and a wave signal IB, and the wave signal output from the output of the AND gate is OC. However, in the case of delay control without wiring design, due to the delay caused by wiring length or the delay caused by the operation of the previous-level circuit, it cannot guarantee that the signals from the two inputs of the AND gate circuit flip according to a preset time interval. When delays of the waveform signals input by the two inputs of the AND gate circuit are inconsistent, as shown in FIG. 6, and if the delay time of the waveform signal IB' input by the AND gate circuit is t0 compared to the waveform signal IA, at this time, the waveform signal output by the AND gate circuit is OC' with d, wherein, compared with the ideal waveform signal OC, it appears d which should not appear in OC', and d is the glitch. That is to say, due to the delay, the arrival times of a plurality of signals that should be input at the same time have a sequential relationship, forming a competition relationship, and the error output generated by the competition is glitch. If the generated clocks having glitches are connected to a clock input of a sequential cell, because the clock input of the sequential cell is sensitive to glitches, the sequential cell is mistakenly triggered to sample signals from the data input, and it cannot avoid the problem of outputting error data sample from the data output of the sequential cell. In order to solve the glitch problem, the delay of combination logic input signal can be controlled by strict wiring design in IC design, and then the generation of glitches can be controlled. However, if IC design is directly applied on an FPGA, since the FPGA is a pre-wired semi-custom circuit, the generation of glitches cannot be controlled in the manner of controlling delay by controlling wiring length.

In order to solve the problem of sampling error caused by inputting glitch-containing generated clock to a clock input of a sequential cell and realize application of the sequential cell in IC design on FPGA at the same time, sequential cells in an IC design are extracted, and then logic paths in each sequential cell is extracted with the path from a clock input to a data output in a sequential cell as a logic path. A node is defined on the logic path. The flowing direction from a data output of the contemporary node to a clock input of a next node as a directed edge, and a directed graph is obtained by connecting nodes with the edge. The directed graph includes a root node, a plurality of leaf nodes, and a plurality of intermediate nodes between the root node and the plurality of leaf nodes. At least one path is present between the root node and each leaf node. The root node in the directed graph corresponds to the root node in a clock tree. A user clock by which the root node is driven is a primary clock, and the user clocks by which other nodes are driven are generated clocks. Logic paths in all sequential cells of a clock tree in an IC design and the relationship among the logic paths are characterized by all nodes in the directed digraph and the connection relationship among the nodes.

After extracting the directed graph, sequential cells represented by a node of a plurality of nodes in the directed graph as a whole are needed to be substituted with clock models in FPGA with equivalent logic function, including clock models$_{[CA]}$ and clock models$_{[CB]}$. In order to solve the glitch problem, a new primary clock' is introduced. The primary clock' directly is connected to the clock input of the clock model$_{[CA]}$ or the clock model$_{[CB]}$, there is no combinatorial logic between the primary clock' and the clock input of the clock model$_{[CA]}$ or the clock input of the clock model$_{[CB]}$, and no delay is introduced, so that there is no glitch at the clock inputs of the clock model$_{[CA]}$ and the clock model$_{[CB]}$, solving the glitch problem. The user clock is used as a user enable to be connected to the clock model$_{[CA]}$ or the clock model$_{[CB]}$, since the user clock of the user enable needs to meet the requirements of setup time and retention time, wherein the setup time refers to the time when the data remains stable until an active edge of primary clock' arrives, the retention time refers to the time when the data remains stable after the active edge of the primary clock' arrives, while the glitch has generally short retention time, which cannot meet the requirements of setup time and retention time, and can be shielded, so that the glitch is no longer harmful and will not affect data sampling, and the user enable is non-sensitive to glitch. The clock model$_{[CA]}$ and the clock model$_{[CB]}$ are driven by coordination of the primary clock' and the user clock for data sampling to ensure function recurrence of the sequential cells in an IC design. The invention provides two types of clock models. The clock model$_{[CA]}$ emulates the function of sequential cells in an IC design by controlling a user clock to drive the clock model$_{[CA]}$ to output a data sample from a data output, and the clock model$_{[CB]}$ emulates the function of sequential cells in an IC design by controlling a user clock to sample and output data at a data input in cooperation with the primary clock'. Finally, an appropriate phase shift is configured to the primary clock' such that the modified circuit can be in normal operation.

Based on this, the invention provides the following three examples. In the scheme provided in example 1, at least one sequential cell is substituted with a clock model$_{[CA]}$ and at least another sequential cell is substituted with a clock model$_{[CB]}$. In the scheme provided in example 2, all sequential cells are substituted with clock models$_{[CA]}$. In the scheme provided in example 3, all sequential cells are substituted with clock models$_{[CB]}$.

Example 1

Figure 7:
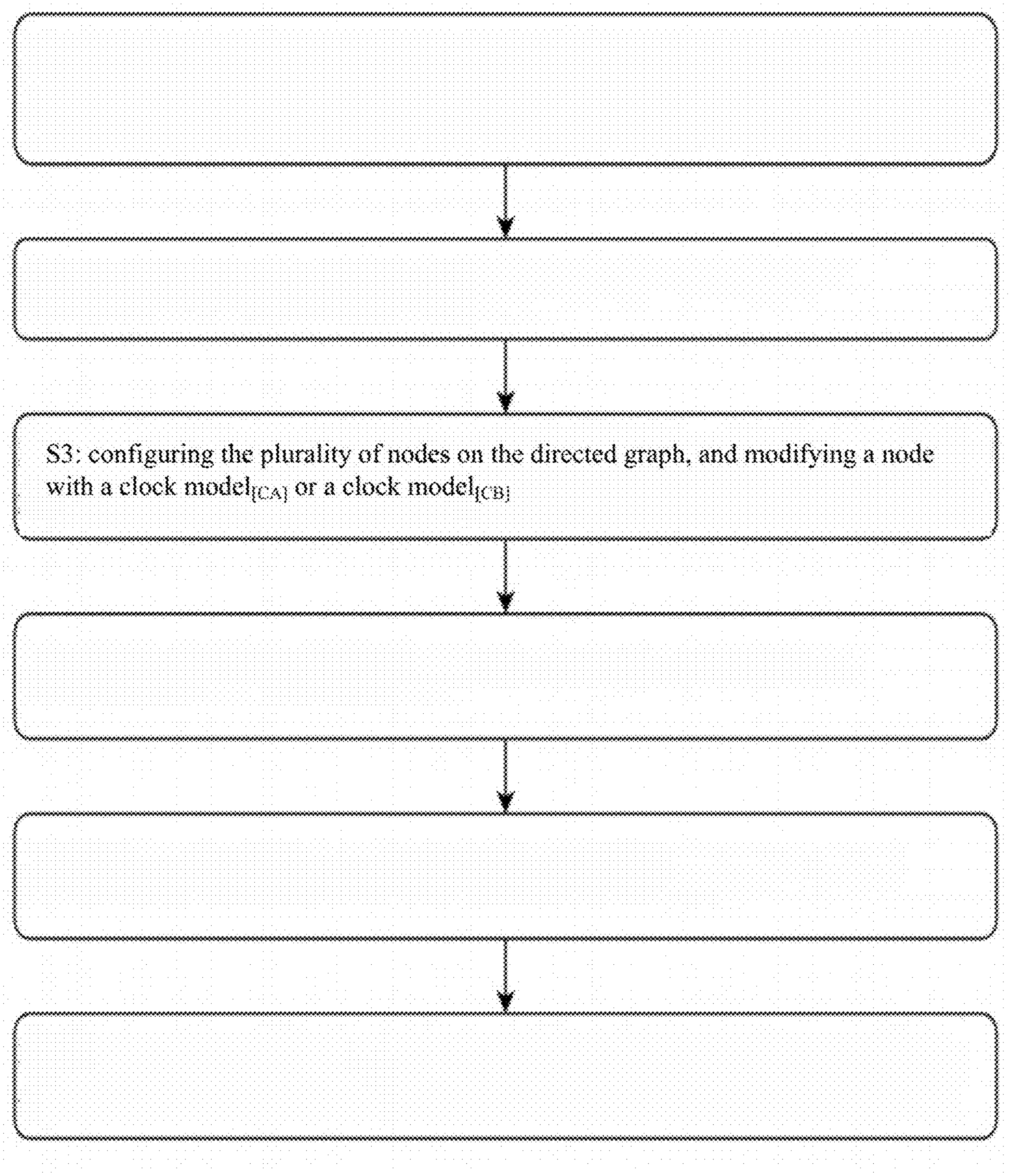
FIG. 7 is a flow diagram of a method for emulating an IC design based on FPGA provided by an example of the present invention.

Referring to FIG. 7, a method for emulating an IC design with an FPGA proposed by the present invention is described in detail by combining with FIG. 7. The method comprises the steps of:

S1) identifying in the IC design: a primary clock; a subcircuit; a plurality of generated clocks, which are derived from the primary clock after being processed by the subcircuit; and a plurality of sequential cells, wherein a user clock being connected to one of the plurality of sequential cells is the primary clock or one of the plurality of generated clocks.

Preferably, the primary clock is a clock input source of an IC design, and usually represents a physical clock.

Preferably, the subcircuit is a combinational logic circuit, a sequential logic circuit or hybrid circuit of a combinational logic circuit and a sequential logic circuit. As an example, the subcircuit can be a frequency divider, a gate clock or a multiplexer, wherein the frequency divider is a sequential logic circuit, and the gate clock and the multiplexer are combinational logic circuits.

Wherein, the generated clocks are derived from the primary clock or a previous-level generated clock after being processed by the subcircuit. Different generated clocks are derived from the primary clock by being processed by different subcircuits, and next-level generated clocks can be also derived from the generated clocks after being processed by another subcircuit, and so on, the primary clock and the topologic structure of the generated clocks form a clock tree structure. The generated clocks are used to be connected to the clock inputs of a plurality of sequential cells to drive the sequential cells for data sampling.

Wherein, the sequential cell comprises a user-clock input, a data input and a data output. When an active edge is occurring on a user clock connected to the user-clock input, the sequential cell is triggered to sample data signal from the data input, and data sample is output by the data output. The active edge of the user clock is used as driving signal to drive the sequential cell for sampling. Under the action of the driving signal, the data input to the sequential cell is sampled and output to obtain the generated clocks. The data sample output from the data output of a sequential cell can be used as clock input signal of the clock input of another sequential cell, and can also be used as data input signal of the data input of another sequential cell.

Figure 3:
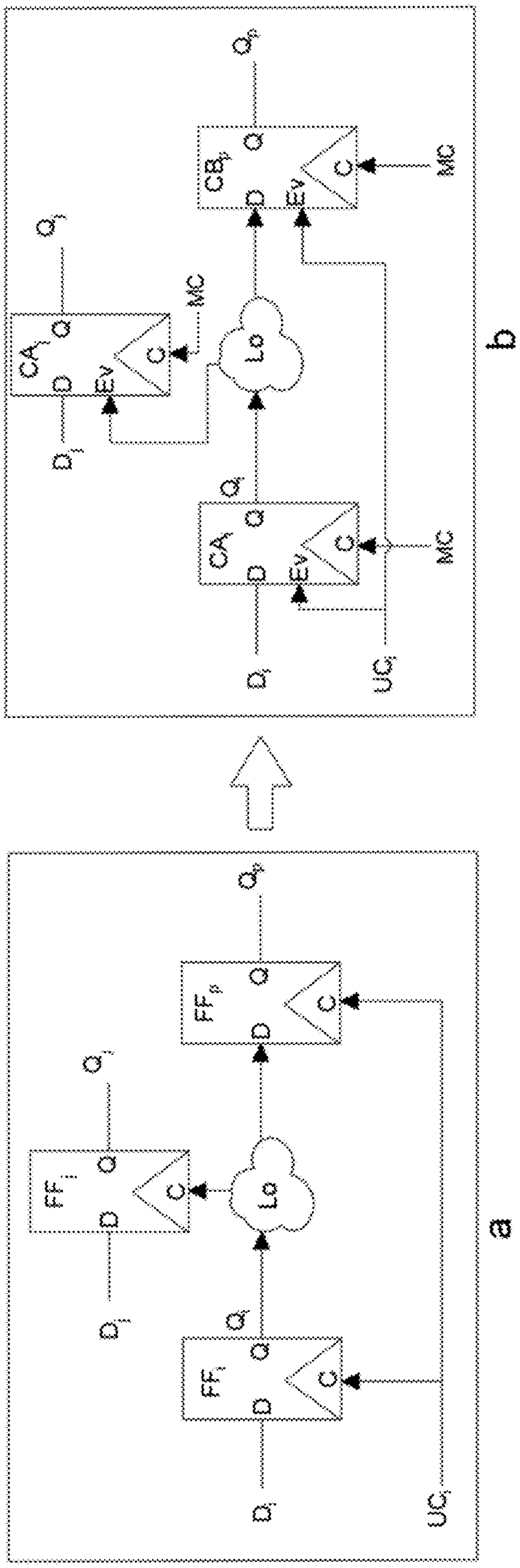

Wherein, the sequential cells are connected by cascade connection or series connection, referring to FIG. 3. in FIG. 3, the part a is possible connection structure among sequential cells in an IC design, wherein, each sequential cell includes a data input$_{[D]}$, a clock input$_{[C]}$ and a data output$_{[Q]}$, the cascade connection is that the data signal$_{[Qi]}$ output from the data output$_{[Q]}$ of the i-th sequential cell$_{[FFi]}$ is connected to the clock input$_{[C]}$ of the j-th sequential cell, and the serial connection is that the data signal$_{[Qi]}$ output from the data output$_{[Q]}$ of the i-th sequential cell$_{[FFi]}$ is connected to the data input$_{[D]}$ of the p-th sequential cell.

Preferably, the sequential cell is configured to be a latch, a trigger, a register, a shifting register or a memory. Other combined units having the same function in prior art fall within the protection scope of the prevent invention.

Figure 8:
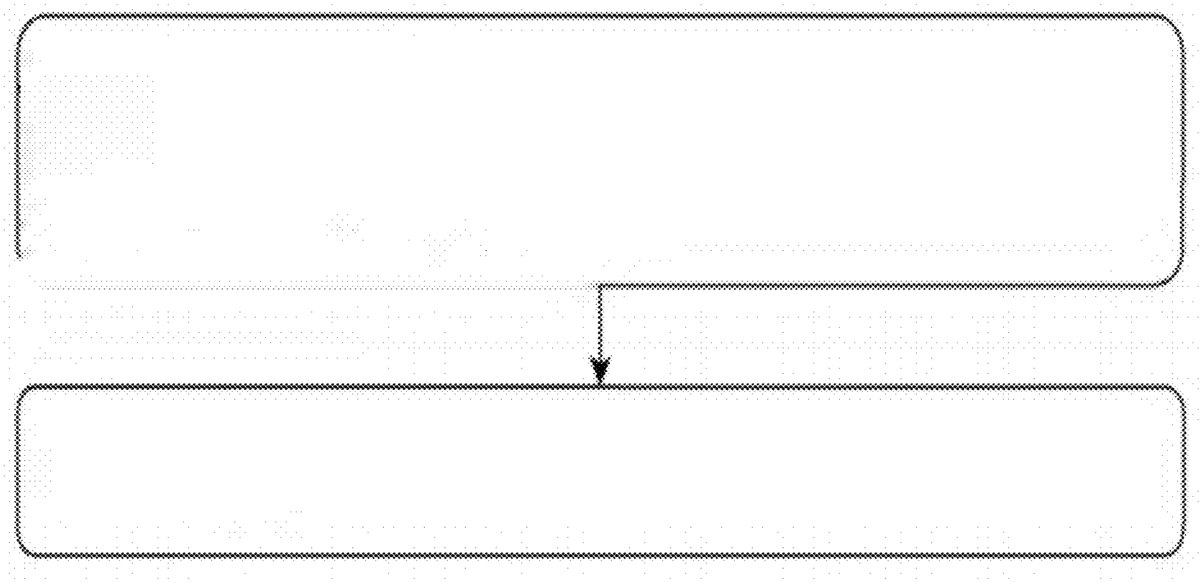
FIG. 8 is flow diagram of S2 provided by an example of the present invention.

S2) converting the IC design into a directed graph. Referring to FIG. 8, S2) includes: 2.1) converting the plurality of sequential cells to a plurality of nodes, and 2.2) constructing the directed graph by connecting the plurality of nodes.

It should be noted that, an IC design includes a combinational logic circuit and a sequential logic circuit. The problem to be solved in the present invention is error data sampling due to glitches present in a clock input signal inputted to a sequential cell. In order to solve the problem, it is necessary to extract sequential cells for processing.

Further, S2.1 further includes: 2.2.1) converting a sequential cell in the plurality of sequential cells to a node, including: i) identifying on the sequential cell: a user clock by which the sequential cell is driven; a data input; a user-clock input and a data output, wherein the user clock is connected to the user-clock input; ii) converting the sequential cell into a node, including: defining a logic path having a pair of endpoints, wherein: the user-clock input constitutes one of the pair of endpoints; and the data output constitutes the other one of the pair of endpoints; defining a node on the logic path between the pair of endpoints; and 2.1.2) converting the rest of the plurality of sequential cells to nodes in view of the step of converting a sequential cell in the plurality of sequential cells to a node. The sequential cells can be extracted into an abstract node in the manner of identifying a logic path to extract the node, and only a topologic relationship among related sequential cells is extracted, so as to avoid interference of other irrelevant structures.

Further, the step for connecting an edge of the nodes in S2.2 includes: connecting the nodes with a directed edge having flowing direction from a data output of a node to a clock input of a next node. A directed graph is obtained by connecting nodes while ignoring the combinatorial logic among the sequential cells.

Preferably, the storage method of the directed graph is an adjacency matrix or an adjacency list.

Figure 10:
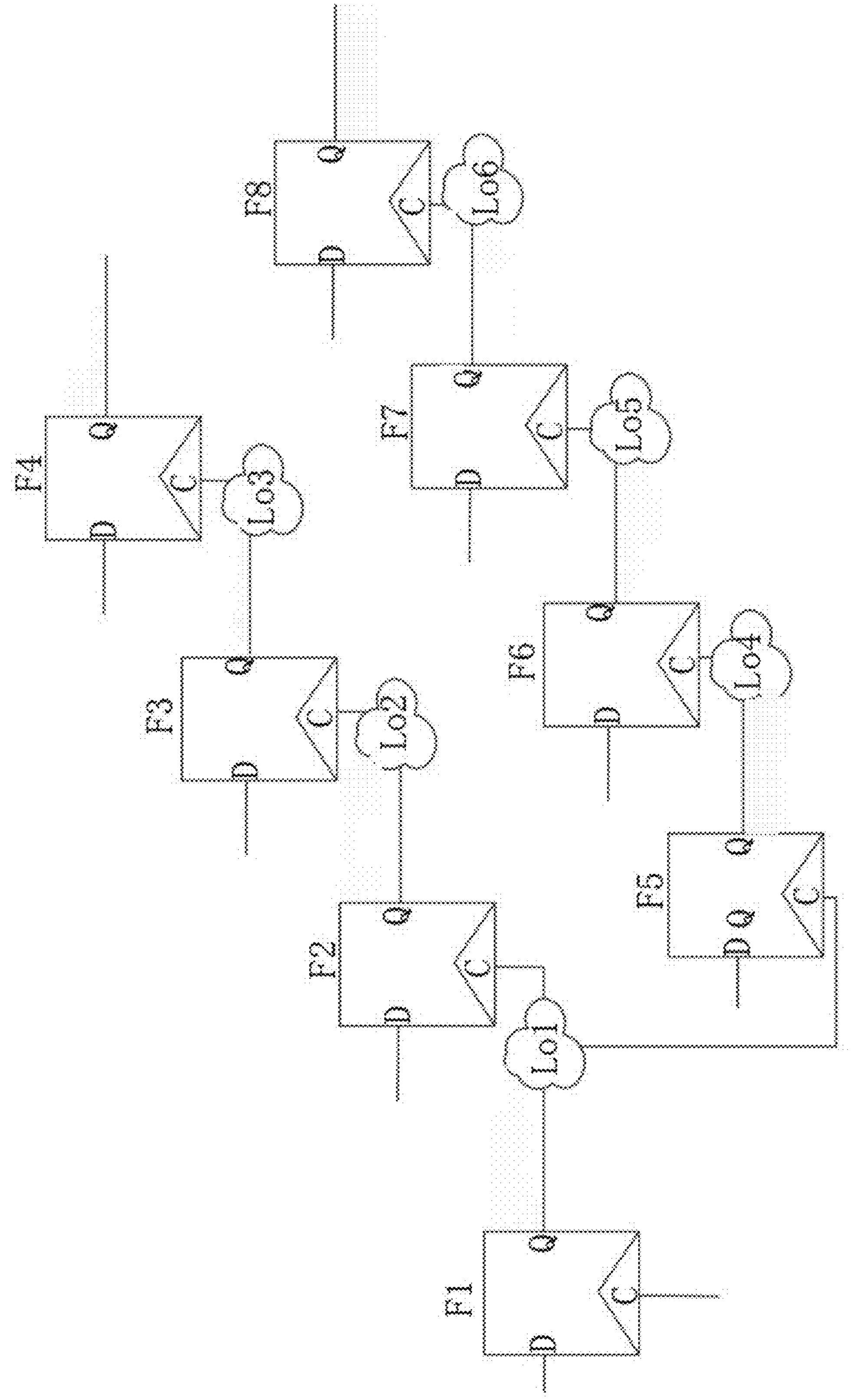
FIG. 10 is a structure schematic drawing of a clock tree.
Figure 11:
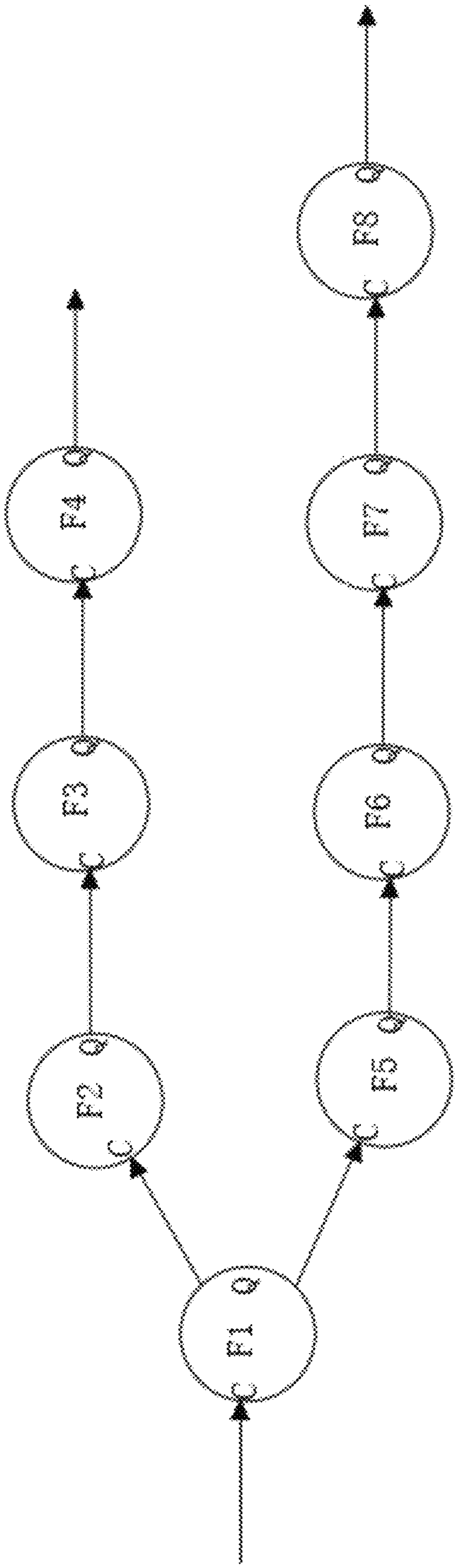
FIG. 11 is a directed graph obtained by extracting FIG. 10.

As an example, to better understand the present invention, a clock tree having one part composed of eight sequential cells is adopted for example, referring to FIG. 10 showing partial clock tree structure in an IC design. The clock tree includes sequential cells$_{[F1]-[F8]}$ and combinational logics$_{[Lo1]-[Lo6]}$. The sequential cells have the same external port, and each sequential cell includes a data input$_{[D]}$, a user clock input$_{[C]}$ and a data output$_{[Q]}$. In the clock tree, the sequential cell$_{[F1]}$ is adopted as root node, and the user clock input$_{[C]}$ of the sequential cell$_{[F1]}$ is connected to a primary clock. For a path including sequential cells$_{[F2]-[F4]}$ with the root node as the parent node, the primary clock drives the sequential cell$_{[F1]}$ to sample input data to obtain a generated clock$_{[1]}$. The generated clock$_{[1]}$ drives the sequential cell$_{[F2]}$ to sample input data through a combination logic$_{[Lo1]}$ to obtain generated clock$_{[2]}$, and so on to obtain a generated clock$_{[3]}$ and a generated clock$_{[4]}$. Similarly, generation clocks$_{[5]-[8]}$ can be obtained in another path adopting the root node as parent node and including sequential cells$_{[F5]-[F8]}$. With a logic path formed from the user clock input$_{[C]}$ to the data output$_{[Q]}$ in each sequential cell as a node and with flowing of data outputted from a data output of a sequential cell to a clock input of next node as a directed edge, the clock tree structure shown in FIG. 10 is extracted to obtain a directed graph. Referring to FIG. 11, it shows the directed graph obtained by extracting the clock tree structure shown in FIG. 10. In FIG. 11, the clock input$_{[C]}$ of the root node is connected to a primary clock. In the directed graph, the user clock inputs [C] of the nodes except the root node are connected to generated clocks. The directed edge in the directed graph is the flow direction of the data output signal. In FIG. 11, each node represents the extracted sequential cell, and the sequential cells and the nodes are in one-to-one mapping relationship.

S3) configuring the nodes on the directed graph, wherein, the directed graph includes exactly a root node and a plurality of leaf nodes. It should be noted that, a user clock connected to a root node is configured to be a primary clock, except the root node, the user clocks connected to other nodes in the directed graph are generated clocks.

Figure 9:
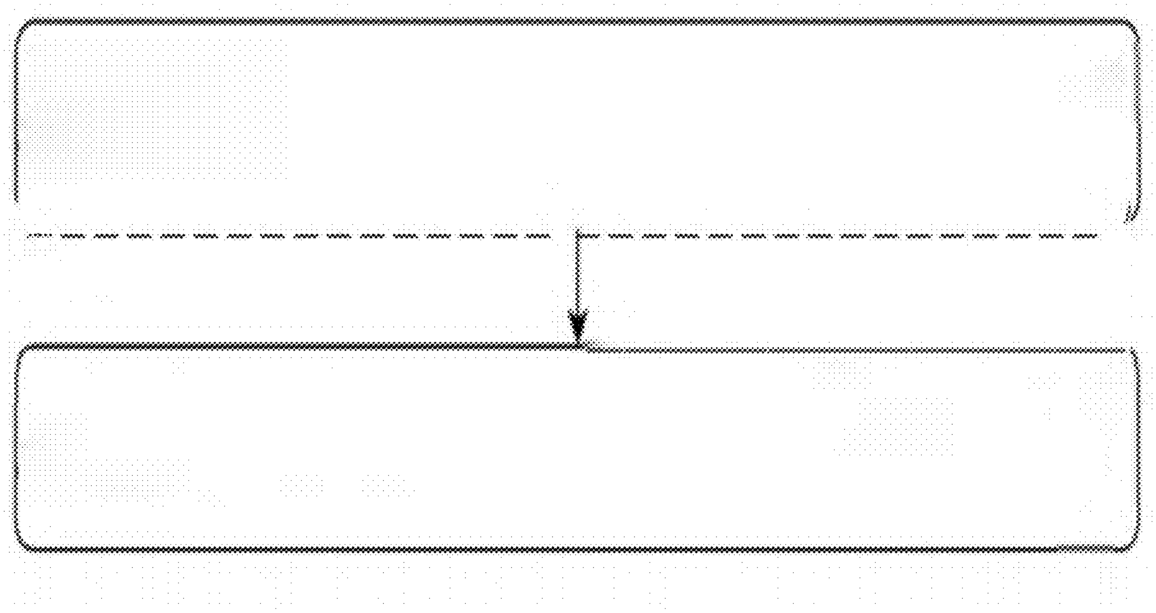
FIG. 9 is flow diagram of S3 provided by an example of the present invention.

Further, referring to FIG. 9. S3) for configuring the nodes on the directed graph further includes: 3.1) inserting clock models at the nodes on the directed graph, and 3.2) configuring a phase shift for a primary clock'.

Further, S3.1 includes: 3.1.1) labeling a plurality of nodes on the directed graph as group A and group B; 3.1.2) modifying the nodes that are labeled as group A; and 3.1.3) modifying the nodes that are labeled as group B.

It should be noted that, to solve the technical problem proposed by the present invention, the present invention provides two clock models functionally capable of equivalently replacing sequential cells in an IC design, and adopts clock models to the technical problem, wherein, the nodes being labeled as group A are substituted with clock models$_{[CA]}$, and the nodes being labeled as group B are substituted with clock models$_{[CB]}$. The clock model$_{[CA]}$ reproduces the function of the sequential cell in the IC design by controlling outputting time of a data sample, and the clock model$_{[CB]}$ reproduces the function of the sequential cell in the IC design by controlling data sampling time.

Preferably, in S3.1.1, grouping can be performed in view of user designation, or in view of random designation or in other manners.

Wherein, S3.1.2 further includes the steps of: i) configuring the clock model$_{[CA]}$, which includes a data input$_{[CA]}$, a data output$_{[CA]}$, a user enable$_{[CA]}$ and a clock input$_{[CA]}$.

ii) modifying a node$_{[A]}$ in the plurality of nodes being labeled as group A. including: ii.1) identifying a logic path by which the node$_{[A]}$ is defined in view of S2, wherein: an endpoint of the logic path is located at a user-clock input$_{[A]}$; the other endpoint of the logic path is located at a data output$_{[A]}$; and a user clock$_{[A]}$ is connected to the user-clock input$_{[A]}$; ii.2) inserting the clock model$_{[CA]}$ at the node$_{[A]}$, including: connecting the data input$_{[CA]}$ to what was connected to the data input$_{[A]}$; connecting the data output$_{[CA]}$ to what was connected to the data output$_{[A]}$; connecting the user enable$_{[CA]}$ to what was connected to the user-clock input$_{[A]}$; and connecting the clock input$_{[CA]}$ to a primary clock' which is equal to or greater than the primary clock in frequencies to facilitate emulation of a primary clock with low frequency or behavior of a generated clock by a primary clock' with high frequency. It should be noted that, the data input$_{[CA]}$, the data output$_{[CA]}$ and the user enable$_{[CA]}$ reserved in the clock model$_{[CA]}$ are respectively in one-by-one correspondence to a data input$_{[A]}$, a data output$_{[A]}$ and a user enable$_{[A]}$ of a sequential cell in an IC design. It can be realized that the sequential cell[A] can be directly substituted with the clock model$_{[CA]}$ in modification without changing other circuits connected to the sequential cells in an IC design.

Preferably, the clock frequency of the primary clock' is twice over that of the primary clock.

Figure 12:
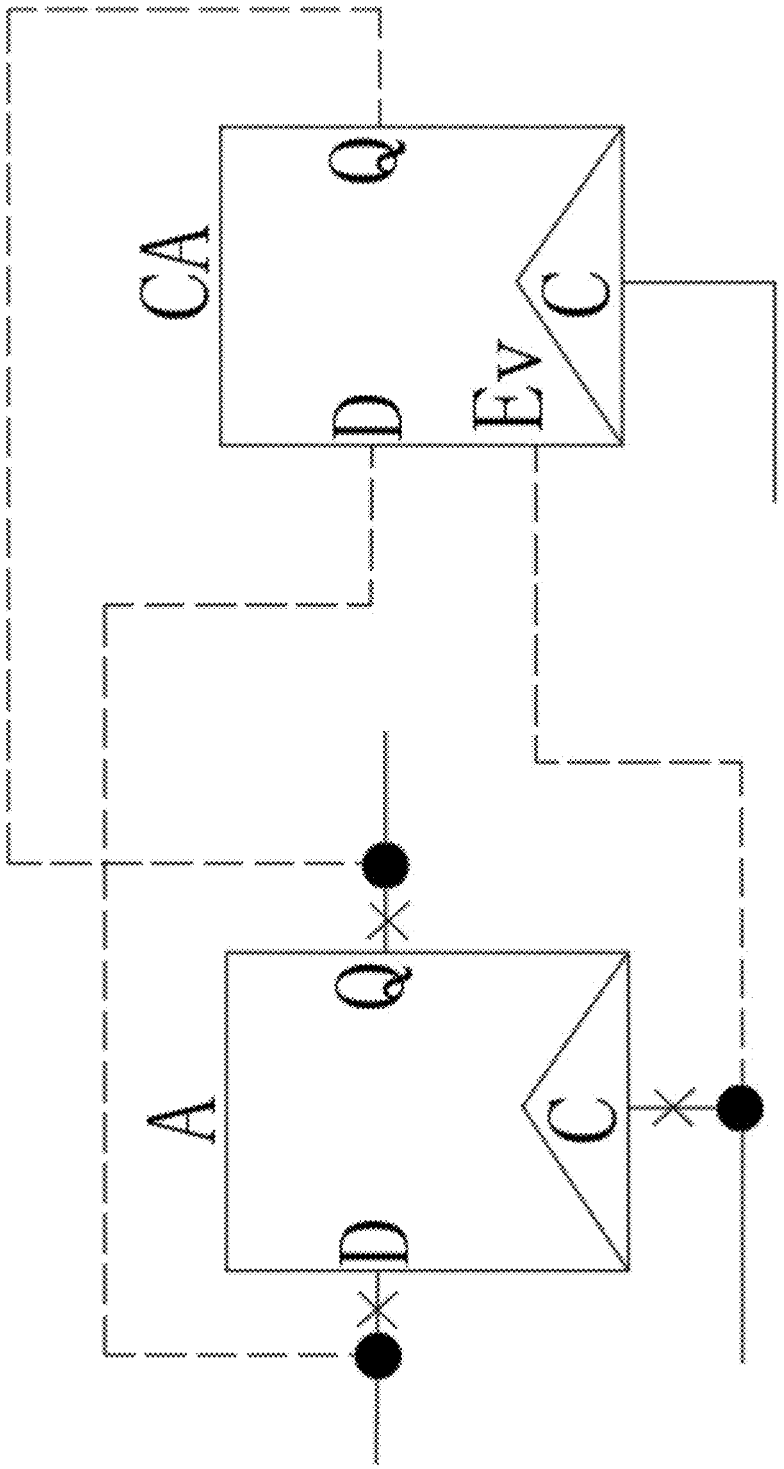
FIG. 12 is a schematic drawing of a sequential cell for which a clock model$_{[CA]}$ is substituted.

Referring to FIG. 12, to better understand Sii.2, FIG. 12 shows a schematic drawing of a sequential cell$_{[A]}$ corresponding to a node$_{[A]}$ and for which a clock model$_{[CA]}$ is substituted. It should be noted that, the external port of the sequential cell$_{[A]}$ includes a data input$_{[A]}$, a user-clock input$_{[A]}$ and a data output$_{[A]}$. In FIG. 12, D represents the data input$_{[A]}$ of the sequential cell$_{[A]}$, C represents the user-clock input$_{[A]}$ of the sequential cell$_{[A]}$, and Q represents the data output$_{[A]}$ of the sequential cell$_{[A]}$. In the following description, the data input$_{[D]}$ of the sequential cell$_{[A]}$ refers to the data input$_{[A]}$ of the sequential cell$_{[A]}$, the user-clock input$_{[C]}$ of the sequential cell$_{[A]}$ refers to the user-clock input$_{[A]}$ of the sequential cell$_{[A]}$, and the data output$_{[Q]}$ of the sequential cell$_{[A]}$ refers to the data output$_{[A]}$ of the sequential cell$_{[A]}$. In FIG. 12. X represents disconnection, imaginal lines represent wiring the sequential cell$_{[A]}$ after being substituted with a clock model$_{[CA]}$, disconnecting any one signal line of the sequential cell$_{[A]}$ and connecting the signal line to a corresponding port of the clock model$_{[CA]}$, equivalently, the corresponding port of the clock model$_{[CA]}$ replaces the port of the sequential cell$_{[A]}$ and is connected to corresponding signal line. In FIG. 12, the clock signal line is disconnected from a user clock input$_{[C]}$ of the sequential cell$_{[A]}$ and connected to the user enable$_{[E]}$ of the clock model$_{[CA]}$, equivalently, the user enable$_{[E]}$ of the clock model$_{[CA]}$ replaces the user clock input$_{[C]}$ of the sequential cell$_{[A]}$ such that the user enable$_{[E]}$ of the clock model$_{[CA]}$ is connected to a primary clock. And so on, the data input$_{[D]}$ of the clock model$_{[CA]}$ replaces the data input$_{[D]}$ of the sequential cell$_{[A]}$ such that the data input$_{[D]}$ of the clock model$_{[CA]}$ is accessed with data input signal; the data output$_{[Q]}$ of the clock model$_{[CA]}$ replaces the data output$_{[Q]}$ of the sequential cell$_{[A]}$ such that the data output$_{[Q]}$ of the clock model$_{[CA]}$ is connected to the outputted next-stage circuit; and the primary clock' is connected to the clock input of the clock model$_{[CA]}$, so as to achieve the purpose of replacing a sequential cell$_{[F]}$ with the clock model$_{[CA]}$.

The primary clock' is directly connected to the clock input$_{[CA]}$ of the clock model$_{[CA]}$; there is no combinatorial logic between the primary clock' and the clock input$_{[A]}$ of the clock model$_{[CA]}$, so that delay is not introduced to the clock input$_{[CA]}$ and glitches are not present at the clock input$_{[CA]}$ of the clock model$_{[CA]}$. The glitch-containing user clock is connected to a user $enable_{[CA]}$ of the clock $model_{[CA]}$, while the user clock connected to the user $enable_{[CA]}$ needs to meet the requirements of setup time and retention time, wherein the setup time refers to the time when the data remains stable until an active edge of primary clock' arrives, the retention time refers to the time when the data remains stable after the active edge of the primary clock' arrives, while the glitch has generally short retention time, which cannot meet the requirements of setup time and retention time, and can be shielded, so that the glitch in a user clock in the user $enable_{[CA]}$ of the clock $model_{[CA]}$ is no longer harmful and will not affect data sampling, and the glitch problem can be solved by the clock $model_{[CA]}$.

ii.3) configuring the clock $model_{[CA]}$, including: configuring the clock $model_{[CB]}$, including: sampling a signal from the data $input_{[CA]}$ at an active edge of the primary clock' to obtain a data sample for a period of the primary clock' led by the active edge; when an N-th active edge is occurring on the user $clock_{[A]}$: obtaining a data $sample_{[N]}$ for a contemporary period of the primary clock'; and outputting to the data $output_{[CA]}$ the data $sample_{[N]}$ until an N+1-th active edge occurs on the user $clock_{[A]}$; and when the N+1-th active edge is occurring on the user $clock_{[A]}$: obtaining a data $sample_{[N+1]}$ for a contemporary period of the primary clock'; and outputting to the data $output_{[CA]}$ the data $sample_{[N+1]}$ until an N+2-th active edge occurs on the user $clock_{[A]}$. It should be noted that, the clock $model_{[CA]}$ performs data sampling at each active edge of the primary clock', but the outputted data sample is controlled by the user $clock_{[A]}$, the final effect is to output the new a data sample when the user $clock_{[A]}$ is active, otherwise output the last output data sample. This function reproduces the function of the sequential cell. It should be noted that the clock $model_{[CA]}$ will sample the input data signal at each active edge of the primary clock', but outputting of the data sample sampled for which period is controlled by the user $clock_{[A]}$, that is, the clock $model_{[CA]}$ reproduces the function of the sequential cell in an IC design by controlling outputting time of the data sample.

Figure 1:
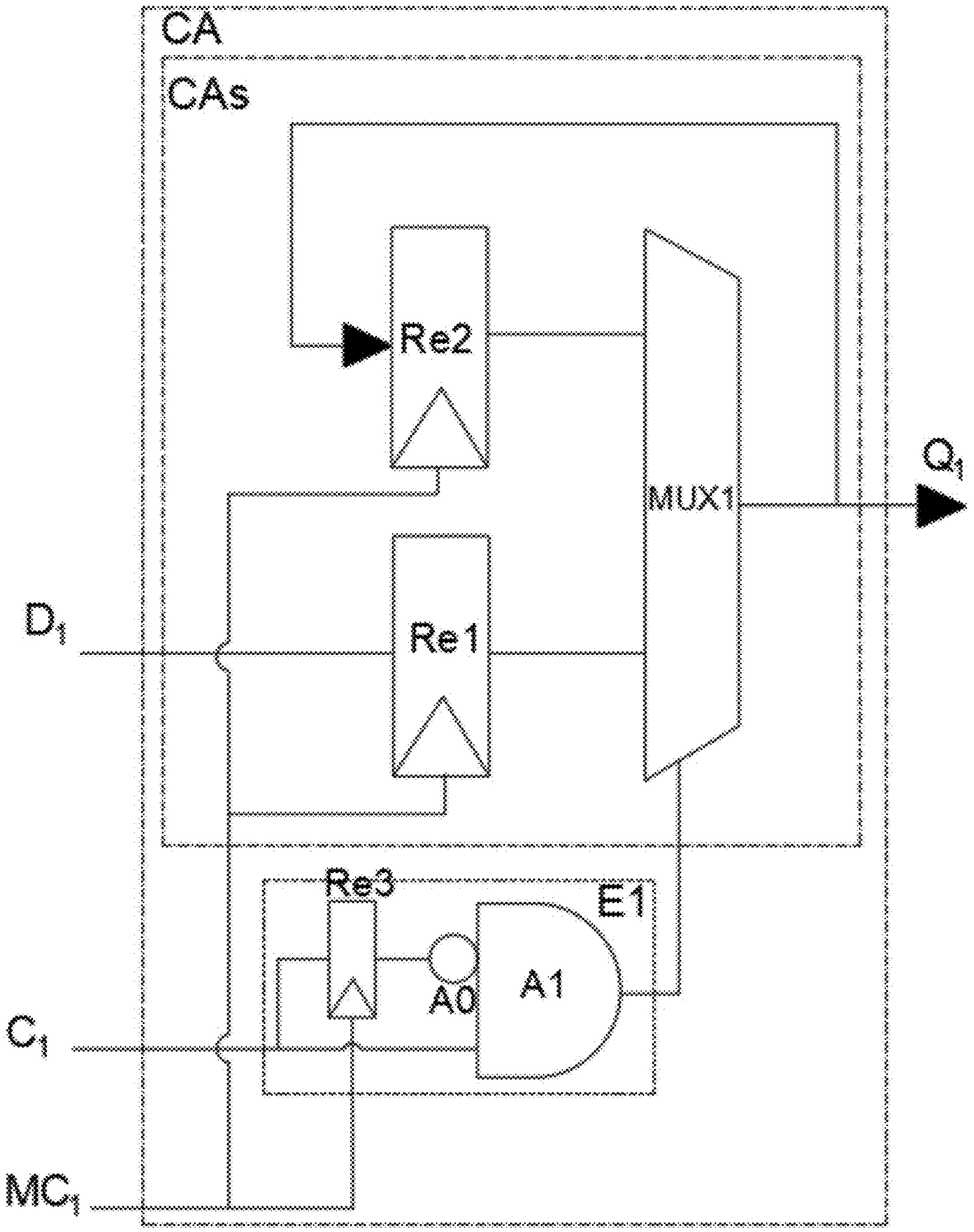
FIG. 1 a structure schematic drawing of a clock $model_{[A]}$ provided by an example in the prevent invention.

Preferably, referring to FIG. 1 showing the structure of a clock $model_{[CA]}$ again, the clock $model_{[CA]}$ includes a clock $detector_{[E1]}$ and a $sampler_{[CAs]}$. As shown in FIG. 1, $D_1$ represents data signal connected to the clock $input_{[CA]}$, $C_1$ represents the user $clock_{[A]}$ connected to the user $enable_{[CA]}$, $MC_1$ represents the primary clock' connected to the clock $input_{[CA]}$, $Q_1$ represents the data signal output from the data $output_{[CA]}$. Namely, the user $enable_{[E1]}$ is connected to $C_1$, the clock $input_{[E1]}$ is connected to $MC_1$, the active-edge output of E1 is connected to an $enable_{[CAs]}$, the data $input_{[CA]}$ is connected with $D_1$, and the data $output_{[CAs]}$ is connected with $Q_1$. Wherein, S4.1.2 further includes: configuring for the clock $model_{[CA]}$ a clock $detector_{[E1]}$ and a $sampler_{[CAs]}$; configuring for the clock $detector_{[E1]}$ a user $enable_{[E1]}$, a clock $input_{[E1]}$ and an active-edge $output_{[E1]}$; configuring for the $sampler_{[CAs]}$ a data $input_{[CAs]}$, an $enable_{[CAs]}$, a clock $input_{[CAs]}$ and a data $output_{[CAs]}$; connecting the user $enable_{[E1]}$ to the user $enable_{[CA]}$; connecting the clock $input_{[E1]}$ and the clock $input_{[CAs]}$ to the clock $input_{[CA]}$; connecting the active-edge $output_{[E1]}$ to the $enable_{[CAs]}$; connecting the data $input_{[CAs]}$ to the data $input_{[CA]}$; and connecting the data $output_{[CAs]}$ to the data $output_{[CA]}$.

Wherein, the clock $detector_{[E1]}$ is used for detecting whether active edge occurs or not; the $sampler_{[CAs]}$ is used for sampling signals from the data $input_{[CA]}$ at each active edge of the primary clock' to obtain data sample for a period of the primary clock' led by the active edge; when an N-th active edge is occurring on the user $clock_{[A]}$: obtaining a data $sample_{[N]}$ for a contemporary period of the primary clock'; and outputting to the data $output_{[CA]}$ the data $sample_{[N]}$ until an N+1-th active edge occurs on the user $clock_{[A]}$; and when the N+1-th active edge is occurring on the user $clock_{[A]}$: obtaining a data $sample_{[N+1]}$ for a contemporary period of the primary clock'; and outputting to the data $output_{[CA]}$ the data $sample_{[N+1]}$ until an N+2-th active edge occurs on the user $clock_{[A]}$, wherein the active edge of the user clock output by the clock $detector_{[E1]}$ is used for driving the $sampler_{[CAs]}$ to output corresponding data sample.

Further, preferably, referring to FIG. 1 again, S3.1.2 further includes: configuring for the $sampler_{[CAs]}$ a first state $holder_{[Re1]}$, a second state $holder_{[Re2]}$ and a $multiplexer_{[MUX1]}$; configuring for the first state $holder_{[Re1]}$ a clock $input_{[Re1]}$, a data $input_{[Re1]}$ and a data $output_{[Re1]}$; configuring for the second state $holder_{[Re2]}$ a clock $input_{[Re2]}$, a data $input_{[Re2]}$ and a data $output_{[Re2]}$; configuring for the $multiplexer_{[MUX1]}$ a first data $input_{[MUX1]}$, a second data $input_{[MUX1]}$, a signal $selection_{[MUX1]}$ and a data $output_{[MUX1]}$; connecting the data $input_{[Re1]}$ to the data $input_{[CAs]}$; connecting the data $output_{[MUX1]}$ to the data $output_{[CAs]}$; connecting the clock $input_{[Re1]}$ and the clock $input_{[Re2]}$ to the clock $input_{[CAs]}$; connecting the data $output_{[Re1]}$ to the first data $input_{[MUX1]}$; connecting the data $input_{[Re2]}$ to the data $output_{[MUX1]}$; connecting the data $output_{[Re2]}$ to the second data $input_{[MUX1]}$; and connecting the $enable_{[CAs]}$ to the signal $selection_{[MUX1]}$.

Wherein, the multiplexer is configured to be a combinational logic circuit with a plurality of data inputs and single data output. The multiplexer with a plurality of data inputs is a multi-channel digital switch, and can select one data input signal from the plurality of data inputs according to different signals of a signal selection and output to a common data output.

Wherein, the first state $holder_{[Re1]}$ is used for realizing sampling of data signal from the data $input_{[CA]}$ when each active edge of the primary clock' occurs to obtain data sample. The second state $holder_{[Re2]}$ is used for realizing sampling of data signal from the data $input_{[CA]}$ when each active edge of the primary clock' occurs to obtain data sample, wherein the primary clock' is greater than the user clock in clock frequencies, and the first state $holder_{[Re1]}$ and the second state $holder_{[Re2]}$ are connected to the same one primary clock'. Two kinds of data samples are obtained at each active edge of the primary clock', including: the data sample obtained at contemporary period of the primary clock' and outputted from the first state $holder_{[Re1]}$, and the data sample obtained at previous one period of the primary clock' and outputted from the second state $holder_{[Re2]}$. The $multiplexer_{[MUX1]}$ is used for selectively outputting the data sample of first state $holder_{[Re1]}$ when the user $clock_{[A]}$ is active and outputting the data sample of the second state $holder_{[Re2]}$ when the user $clock_{[A]}$ is inactive. That is, when the i-th active edge of primary clock' arrives, the first state $holder_{[Re1]}$ samples the input data to obtain data sample 1, if the user $clock_{[A]}$ is active at this time, and the $multiplexer_{[MUX1]}$ is driven to select the data sample of the first state $holder_{[Re1]}$ to output the data 1; when the (i+1)-th active edge of primary clock' arrives, the first state $holder_{[Re1]}$ continues to sample the input data to obtain the new data sample 2, but at this time the second state $holder_{[Re2]}$ samples the data 1 output by the $multiplexer_{[MUX1]}$ to obtain data 1, if the user $clock_{[A]}$ is inactive at this time, the $multiplexer_{[MUX1]}$ is driven to select the data sample of the second state holder$_{[Re2]}$ to output data 1, and when the (i+2)-th active edge of primary clock' arrives, if the user clock is active, the multiplexer$_{[MUX1]}$ is driven to output the new data sample 2, otherwise continue to output data 1, so as to achieve that: when the N-th active edge is occurring on the user clock$_{[A]}$: the data sample N of the primary clock' in the contemporary period is obtained and output to the data output$_{[CA]}$ until the (N+1)-th active edge is occurring on the user clock$_{[A]}$; and when the (N+1)-th active edge is occurring on the user clock$_{[A]}$: the data sample N+1 of the primary clock' in the contemporary period is obtained and output to the data output$_{[CA]}$ until the (N+2)-th active edge is occurring on the user clock$_{[A]}$.

Further, preferably, referring to FIG. 1 again, a clock detector$_{[E1]}$ is configured for a third state holder$_{[Re3]}$, a non-gate circuit$_{[A0]}$ and an AND gate circuit$_{[A1]}$, including: configuring for the third state holder$_{[Re3]}$ a clock input$_{[Re3]}$, a data input$_{[Re3]}$ and a data output$_{[Re3]}$; configuring for the non-gate circuit a signal input$_{[A]}$ and a signal output$_{[A0]}$; configuring for the AND gate circuit a first data input$_{[A1]}$, a second data input$_{[A1]}$ and a data output$_{[A1]}$; connecting the clock input$_{[Re3]}$ to the clock input$_{[E1]}$; connecting the data input$_{[Re3]}$ and the first data input$_{[A1]}$ to the user enable$_{[E]}$; connecting the data output$_{[Re3]}$ to the signal output$_{[A0]}$; connecting the signal output$_{[A0]}$ to second data input$_{[A1]}$; and connecting the data output$_{[A1]}$ to an active-edge output$_{[E1]}$.

Wherein, the gate circuit$_{[A0]}$ is used for realizing that logic output from the signal output$_{[A0]}$ is opposite to that output from the signal input$_{[A0]}$. The AND gate circuit$_{[A1]}$ is used for realizing that: the data output$_{[A1]}$ outputs high logic when the first data input$_{[A1]}$ and the second data input$_{[A1]}$ are at high logic state simultaneously, otherwise, the data output$_{[A1]}$ outputs low logic.

Preferably, the combinational circuit of the non-gate circuit$_{[A0]}$ and the AND gate circuit$_{[A1]}$ can comprise lookup tables with the same truth table, wherein the digital combinational circuit realizing lookup tables with the same truth table comprises various types, wherein the lookup table is a structure used to implement the truth table that has written all possible logic combinations and their corresponding logic results in advance. The corresponding logic results can be obtained according to the logic combinations at the input of the lookup table.

Preferably, an active edge of a user clock is configured to a rising edge or falling edge.

Preferably, active edges of the primary clocks' by which the clock model$_{[CA]}$ and the clock model$_{[CB]}$ are driven are configured to be triggered by a rising edge or configured to be triggered by falling edge, or the clock model$_{[CA]}$ is configured to be triggered by a rising edge and the clock model$_{[CB]}$ is configured to be triggered by falling edge, or the clock model$_{[CA]}$ is configured to be triggered by a falling edge and the clock model$_{[CB]}$ is configured to be triggered by rising edge. When the active edge is configured to be triggered by a rising edge, the clock detector adopts a clock detector for detecting a rising edge, such as the clock detector$_{[E1]}$ in FIG. 1. When the active edge is configured to be triggered by a falling edge, the clock detector adopts a clock detector for detecting a falling edge. In this case that the clock detector adopts a clock detector for detecting a falling edge, the differences between the clock detector$_{[E1]}$ and the clock detector$_{[E2]}$ are that: the data output$_{[Re3]}$ of the third state holder$_{[Re3]}$ is directly connected to the second data input$_{[A1]}$ of a gate circuit, a non-gate circuit$_{[A0]}$ is configured such that the non-gate input of the non-gate circuit is connected to the user enable$_{[E1]}$, and the non-gate output is connected to the first data input$_{[A1]}$ of the gate circuit. All clock detectors capable of detecting rising edges, falling edges or bilateral edges in the prior art fall within the protection scope of the present invention.

The clock model$_{[CA]}$ can not only reproduce the function of the sequential cell, but also directly performs data sampling after an active edge of the primary clock arrives owing to its internal structure, and only selectively outputs the corresponding sampling results, so that there is no delay problem on the sampling time of the clock model$_{[CA]}$.

Figure 13:
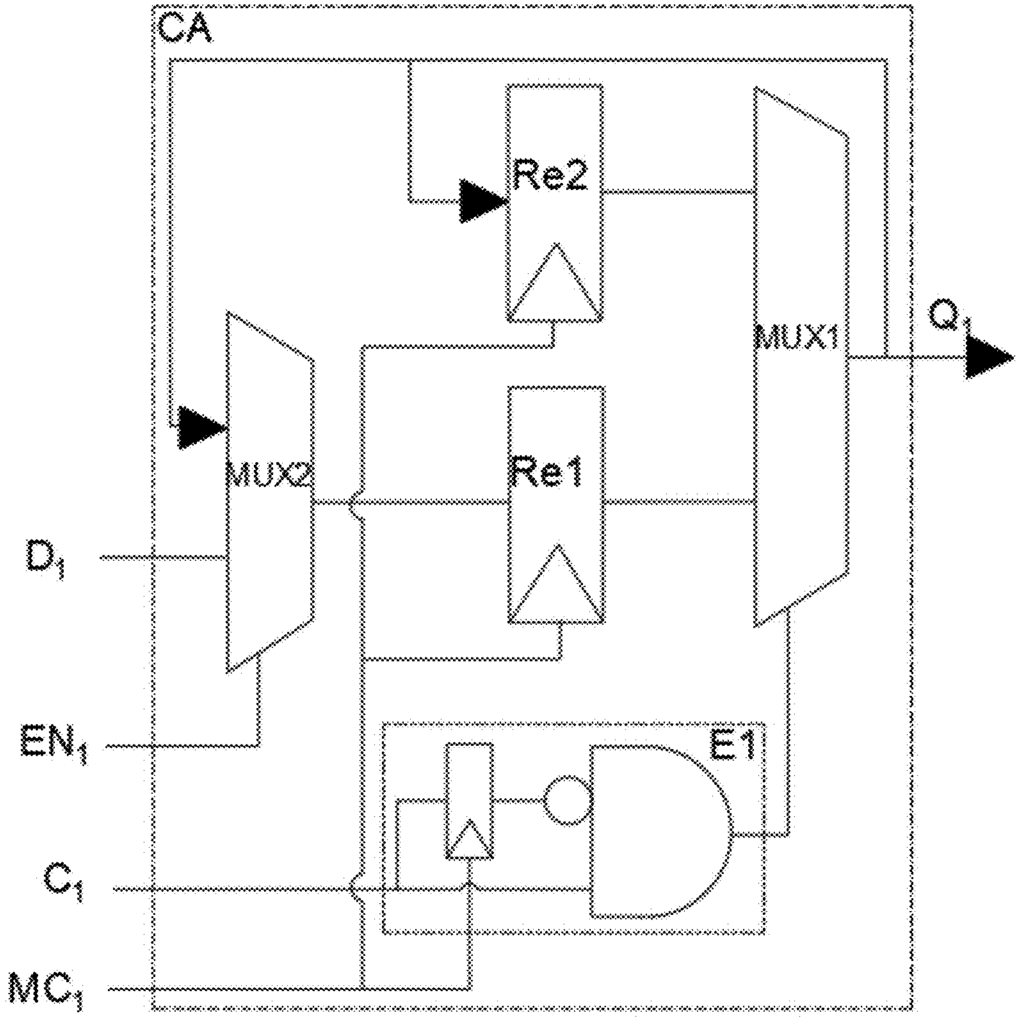
FIG. 13 is a structure schematic drawing of a clock model$_{[CA]}$ provided by another example in the prevent invention.

Preferably, when an enable of a sequential cell is connected to a circuit, referring to FIG. 13, $D_1$ represents data signal of the data input$_{[CA]}$, $Q_1$ represents the data sample output from the data output$_{[CA]}$, $C_1$ represents the user clock connected to the user enable$_{[CA]}$, $MC_1$ represents the clock signal connected to the clock input$_{[CA]}$, $EN_1$ represents the enable signal connected to the enable$_{[CA]}$. S2.1 further includes identifying on the sequential cell, a data input, a user-clock input, a data output and an enable. S4.1.2 further includes: configuring for the clock model$_{[CA]}$ a data input$_{[CA]}$, a data output$_{[CA]}$, a user enable$_{[CA]}$, a clock input$_{[CA]}$ and an enable$_{[CA]}$; configuring for the clock model$_{[CA]}$ a clock detector$_{[E1]}$, a first state holder$_{[Re1]}$, a second state holder$_{[Re2]}$, a multiplexer$_{[MUX1]}$ and a multiplexer$_{[MUX2]}$; configuring for the clock detector$_{[E1]}$ a user enable$_{[E1]}$, a clock input$_{[E1]}$ and an active-edge output$_{[E1]}$; configuring for the first state holder$_{[Re1]}$ a clock input$_{[Re1]}$, a data input$_{[Re1]}$ and a data output$_{[Re1]}$; configuring for the second state holder$_{[Re2]}$ a clock input$_{[Re2]}$, a data input$_{[Re2]}$ and a data output$_{[Re2]}$; configuring for the multiplexer$_{[MUX1]}$ a first data input$_{[MUX1]}$, a second data input$_{[MUX1]}$, a signal selection$_{[MUX1]}$ and a data output$_{[MUX1]}$; configuring for the multiplexer$_{[MUX2]}$ a first data input$_{[MUX2]}$, a second data input$_{[MUX2]}$, a signal selection$_{[MUX2]}$ and a data output$_{[MUX2]}$; connecting the second data input$_{[MUX2]}$ to the data input$_{[CA]}$; connecting the data output$_{[MUX1]}$ to the data output$_{[CA]}$, the data input$_{[Re2]}$ and the first data input$_{[MUX2]}$; connecting the second data input$_{[MUX2]}$ to the data input$_{[CA]}$; connecting the data output terminal$_{[MUX1]}$ to the data output$_{[CA]}$, the data input$_{[Re2]}$ and the first data input$_{[MUX2]}$; connecting the clock input$_{[Re1]}$, the clock input$_{[Re2]}$ and the clock input$_{[E1]}$ to the clock input$_{[CA]}$; connecting the user enable$_{[E1]}$ to the user enable$_{[CA]}$; connecting the active-edge output$_{[E1]}$ to the signal selection$_{[MUX1]}$; connecting the data output$_{[Re2]}$ to the second data input$_{[MUX1]}$; connecting the enable$_{[CA]}$ to the signal selection$_{[MUX2]}$; connecting the data output$_{[MUX2]}$ to the data input$_{[Re1]}$; and connecting the data output$_{[Re1]}$ to the first data input$_{[MUX1]}$. It should be noted that, when the enable signal assessed to the enable$_{[CA]}$ is active, the multiplexer$_{[MUX2]}$ is used to realizing that: the multiplexer$_{[MUX2]}$ is driven to selectively output data signal$_{[D1]}$ input by the data input$_{[CA]}$ to the data input$_{[Re1]}$; otherwise, is driven to selectively output the data signal$_{[Q1]}$ output by the data output$_{[CA]}$ to the data input$_{[Re1]}$.

Preferably, the first state holder$_{[Re1]}$ is configured to be a register or a latch, and the second state holder$_{[Re2]}$ is configured to be a register or a latch.

iii) modifying the rest of nodes$_{[A]}$ in the plurality of nodes being labeled as group A.

Wherein, S3.1.3 further includes the steps of:

i) configuring the clock model$_{[CB]}$, which includes a data input$_{[CB]}$, a data output$_{[CB]}$, a user enable$_{[CB]}$ and a clock input$_{[CB]}$.

ii) modifying a node$_{[B]}$ in the plurality of nodes being labeled as group B, including:

ii.1) identifying a logic path by which the node$_{[B]}$ is defined in view of S2, wherein: an endpoint of the logic path is located at a user-clock input$_{[B]}$; the other endpoint of the logic path is located at a data $output_{[B]}$; and the user $clock_{[B]}$ is connected to the user-clock $input_{[B]}$.

ii.2) inserting a clock $model_{[CB]}$ at the $node_{[B]}$, including: connecting the data $input_{[CB]}$ to what was connected to the data $input_{[B]}$; connecting the data $output_{[CB]}$ to what was connected to the data $output_{[B]}$; connecting the user $enable_{[CB]}$ to what was connected to the user-clock $input_{[B]}$; and connecting the clock $input_{[CB]}$ to a primary clock' which is equal to or greater than the primary clock in frequencies. It should be noted that, the same objective as the clock $model_{[CA]}$, the data $input_{[CB]}$, the data $output_{[CB]}$ and the user $enable_{[CB]}$ reserved in the clock $model_{[CB]}$ are respectively in one-by-one correspondence to a data $input_{[B]}$, a data $output_{[B]}$ and a user $enable_{[B]}$ of a sequential cell in an IC design. It can be realized that the sequential $cell_{[B]}$ can be directly substituted with the clock $model_{[CB]}$ in modification without changing other circuits connected to the sequential cells in an IC design.

It should be described that, the external ports of the clock $model_{[CA]}$ and the clock $model_{[CB]}$ are the same, so that substitution method is similar to the method shown in FIG. 11, and here detailed description is avoided.

The primary clock' is directly connected to the clock $input_{[CB]}$ of the clock $model_{[CB]}$, the glitch-containing user clock is connected to the user $enable_{[CB]}$ of the clock $model_{[CB]}$, the clock $model_{[CB]}$ and the clock $model_{[CB]}$ have the same principle of solving technical problem, there is no glitch in the primary clock' connected to the clock $input_{[CB]}$, the glitch-containing user clock is connected to the glitch-insensitive user $enable_{[CB]}$, and the glitch does not affect data sampling, so that the clock $model_{[CB]}$ solves the glitch problem.

ii.3) configuring the clock $model_{[CB]}$, including: when an active edge is occurring on the user $clock_{[B]}$ and when an active edge is occurring on the primary clock': sampling a signal from the data $input_{[CB]}$ to obtain a data sample for a period of the primary clock' led by the active edge; and; and when no active edge occurs on the user $clock_{[B]}$ or no active edge occurs on the primary clock': sampling nothing from the data $input_{[CB]}$; and outputting nothing to the data $output_{[CB]}$. It should be noted that, the clock $model_{[B]}$ is lower than the primary clock' in frequencies, and sampling is performed only when the active edge occurs on the user $clock_{[B]}$ and the active edge occurs on the primary clock', that is, the user $clock_{[B]}$ reproduces the function of the sequential cell in an IC design by controlling sampling time of a data sample.

Figure 2:
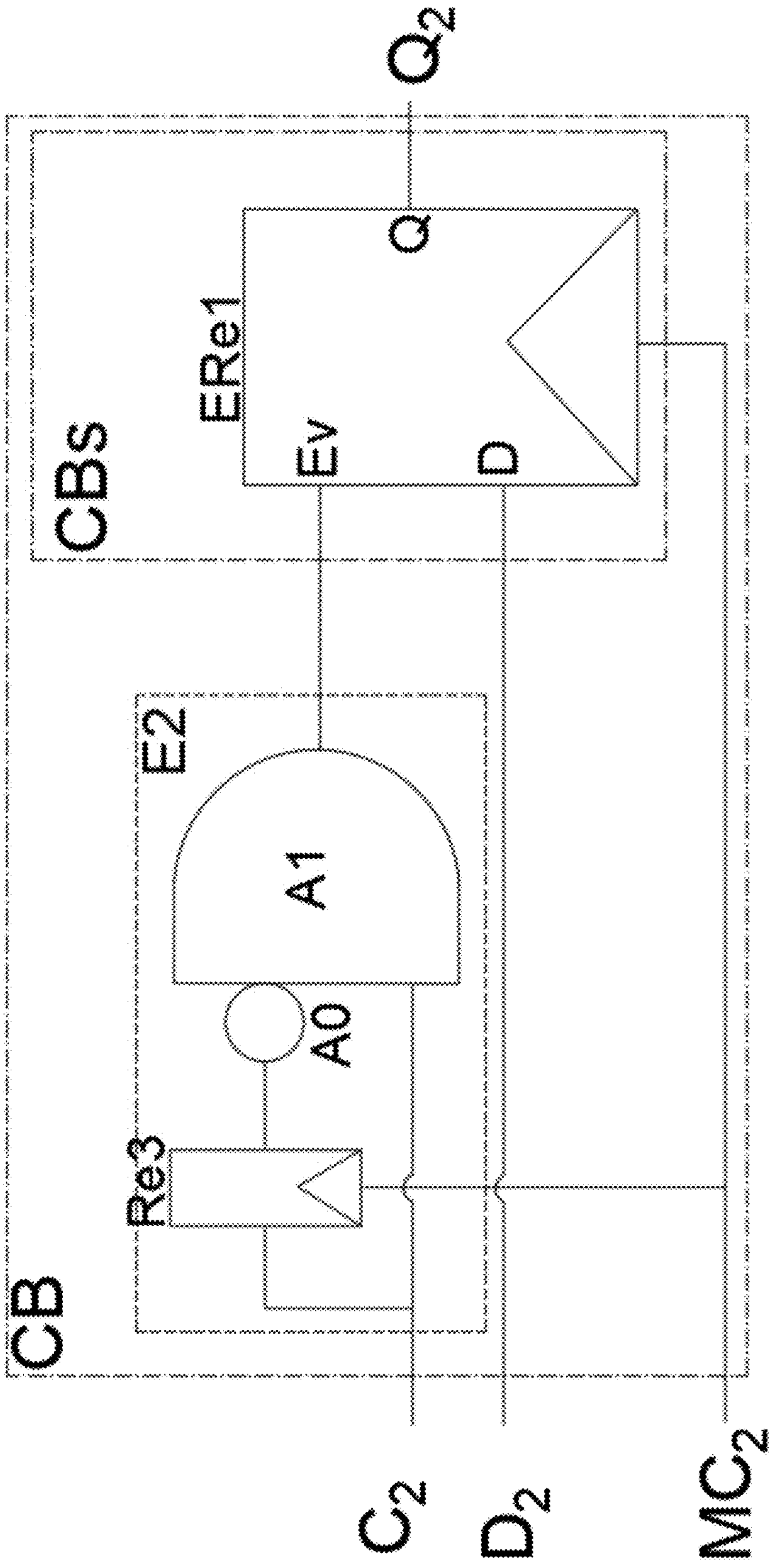
FIG. 2 is a structure schematic drawing of a clock model$_{[CB]}$ provided by an example in the prevent invention.

Preferably, referring to FIG. 2, wherein, S3.1.3 further includes: configuring for the clock $model_{[CB]}$ a clock $detector_{[E2]}$ and a $sampler_{[CBs]}$; configuring for the clock $detector_{[E2]}$ a user $enable_{[E2]}$, a clock $input_{[E2]}$ and an active-edge $output_{[E2]}$; configuring for the $sampler_{[CBs]}$ a clock $input_{[CBs]}$, an $enable_{[CBs]}$, a data $input_{[CBs]}$ and a data $output_{[CBs]}$; connecting the data $input_{[CBs]}$ to the data $input_{[CB]}$; connecting the data $output_{[CBs]}$ to the data $output_{[CB]}$; connecting the clock $input_{[E2]}$ and the clock $input_{[CBs]}$ to the clock $input_{[CB]}$; connecting the user $enable_{[E2]}$ to the user $enable_{[CB]}$; and connecting the active-edge $output_{[E2]}$ to the $enable_{[CBs]}$.

The function of the clock $detector_{[E2]}$ is the same as that of the clock $detector_{[E1]}$, the internal structure of the clock $detector_{[E2]}$ is the same as that of the clock $detector_{[E1]}$, and here detailed description is avoided.

Wherein, the $sampler_{[CBs]}$ is used for sampling a signal from the data $input_{[CB]}$ when an active edge is occurring on the user $clock_{[B]}$ and the active edge is occurring on the primary clock' to obtain a data sample for a period of the primary clock' led by the active edge, and; and when no active edge occurs on the user $clock_{[B]}$ or no active edge occurs on the primary clock': sampling nothing from the data $input_{[CB]}$, and outputting nothing to the data $output_{[CB]}$.

Circuits for realizing the sampler CBs can be configured to be various types. The examples in the present invention provide two deformation methods.

Preferably, the $sampler_{[CBs]}$ is configured to be a $register_{[ERe1]}$ having an enable. The clock $model_{[CB]}$ has simple internal structure, and the clock $model_{[CA]}$ is realized by combination of more hardware. Compared with the clock $model_{[CA]}$, the clock $model_{[CB]}$ can save a lot of hardware resources, so that the clock $model_{[CA]}$ and the clock $model_{[CB]}$ are cooperated to realize balance of hardware resources.

Preferably, the clock $model_{[CB]}$ includes a $register_{[ERe1]}$ and a clock $detector_{[E2]}$, wherein the $register_{[ERe1]}$ is configured to be a register having an enable, and the output of the clock $detector_{[E2]}$ is connected to the enable of the register.

Figure 14:
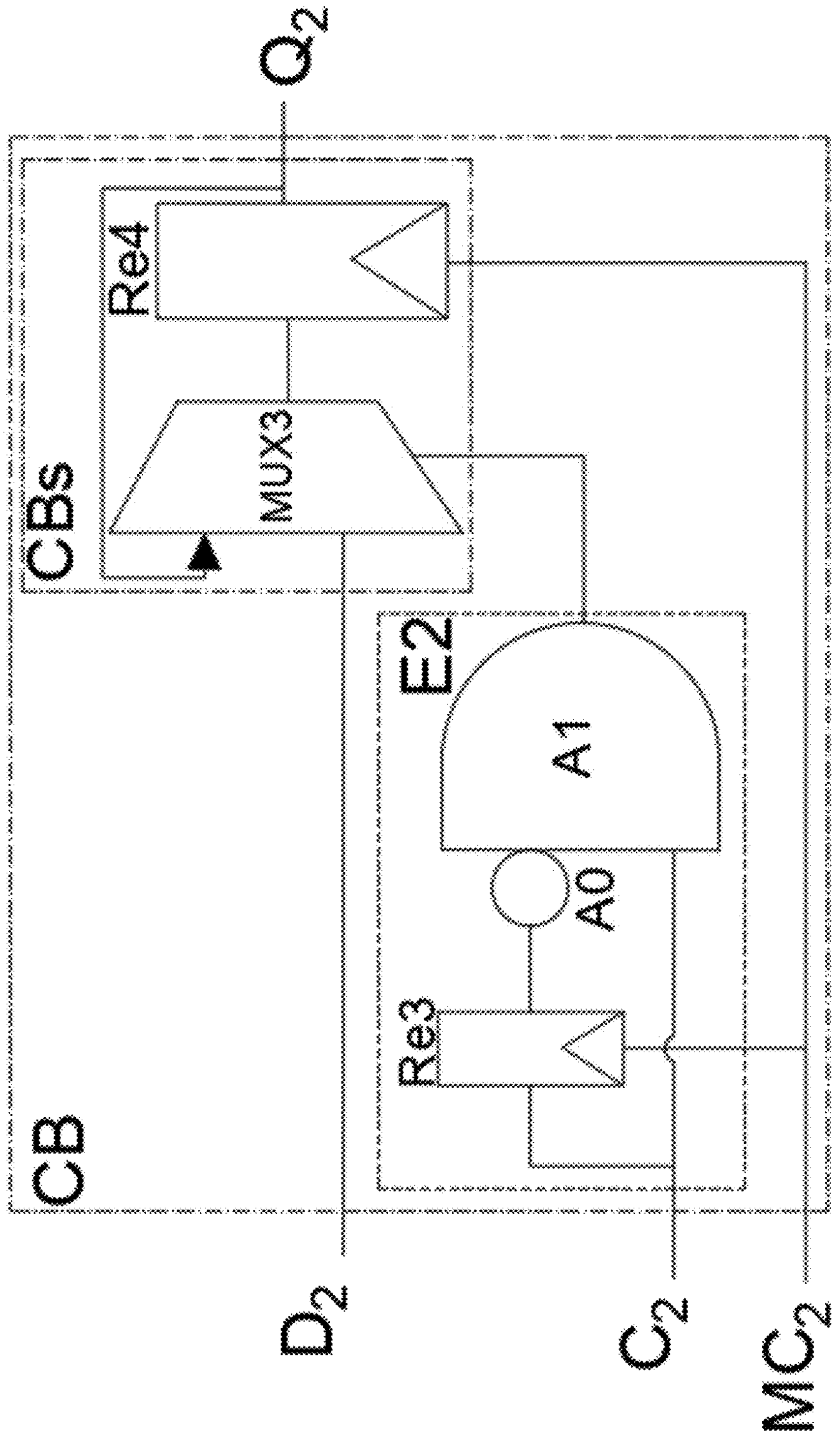
FIG. 14 is a structure schematic drawing of a clock model$_{[CB]}$ provided by another one example in the prevent invention.

Preferably, referring to FIG. 14, S3.1.3 further includes: configuring for the $sampler_{[CBs]}$ a fourth state $holder_{[Re4]}$ and a $multiplexer_{[MUX3]}$; configuring for the fourth state $holder_{[Re4]}$ a clock $input_{[Re4]}$, a data $input_{[Re4]}$ and a data $output_{[Re4]}$; configuring for the $multiplexer_{[MUX3]}$ a first data $input_{[MUX3]}$, a second data $input_{[MUX3]}$, a signal $selection_{[MUX3]}$ and a data $output_{[MUX3]}$; connecting the first data $input_{[MUX3]}$ to the data $input_{[CBs]}$; connecting the data $output_{[Re4]}$ to the second data $input_{[MUX3]}$ and to the data $output_{[CBs]}$; connecting the clock $input_{[Re4]}$ to the clock $input_{[CBs]}$; connecting the signal $selection_{[MUX3]}$ to the $enable_{[CBs]}$; and connecting the data $output_{[MUX3]}$ to the data $input_{[Re4]}$. The combined function of the $multiplexer_{[MUX3]}$ and the fourth state $holder_{[Re4]}$ is equivalent to the function of the $register_{[ERe1]}$ having an enable. The $multiplexer_{[MUX3]}$ is used for selecting the data signal input by the data $input_{[CBs]}$ when the user signal is active to output to the fourth state $holder_{[Re4]}$, otherwise, selecting the data signal output from the data $output_{[CBs]}$ to output to the fourth state $holder_{[Re4]}$, and sampling the data signal from the data $input_{[Re4]}$ when the primary clock' is active to output. It should be noted that, the clock $model_{[CB]}$ is a clock model having clock delay relative to the clock $model_{[CA]}$, and the clock delay of the clock $model_{[CB]}$ is delay caused by the hardware structure of the clock $model_{[CB]}$ itself.

Preferably, the fourth state $holder_{[Re4]}$ is configured to be a register or a latch.

Figure 15:
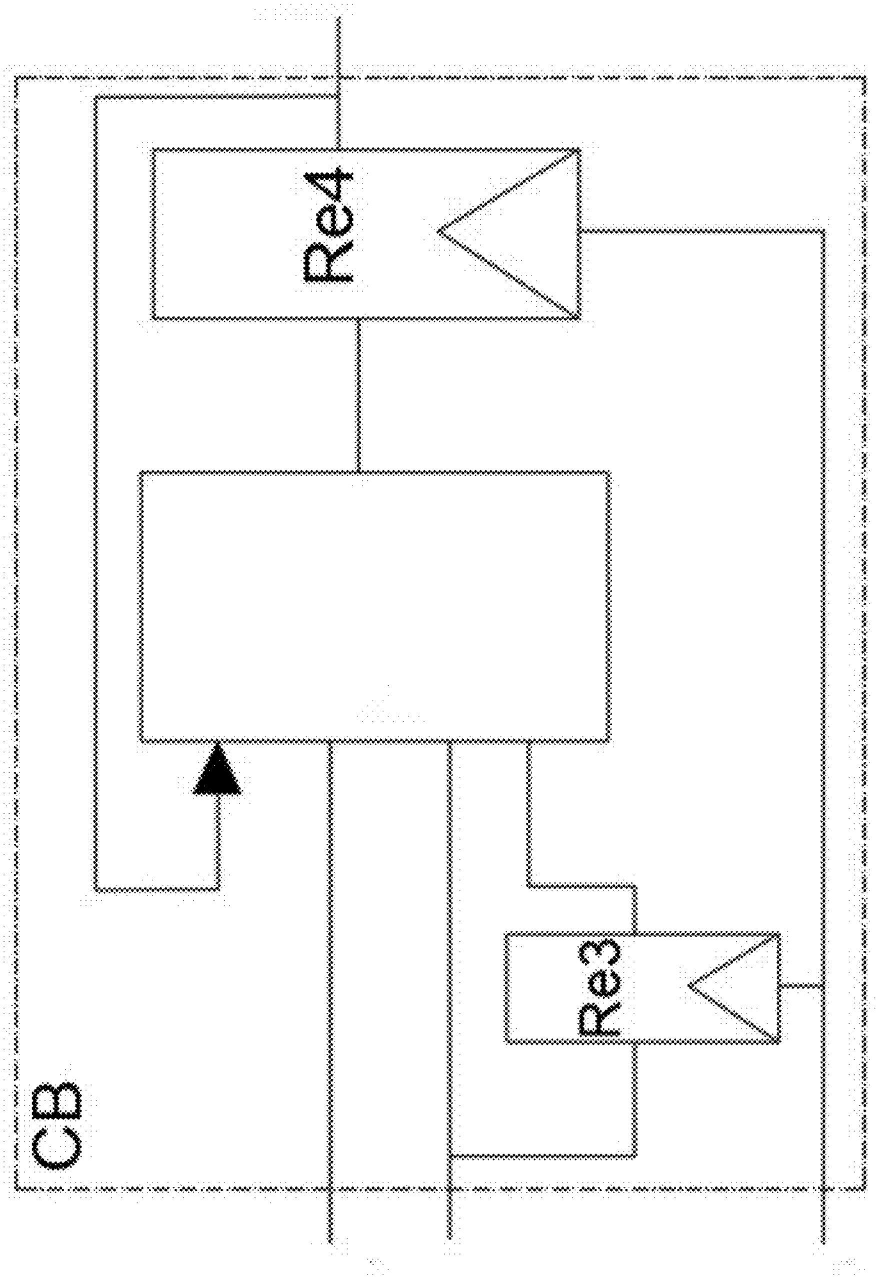
FIG. 15 is a structure schematic drawing of a clock model$_{[CB]}$ provided by another one example in the prevent invention.

Preferably, the clock $model_{[CB]}$ also can be functional module composed of other structures, referring to FIG. 15, configuring for the clock $model_{[CB]}$ a third state $holder_{[Re3]}$, a fourth state $holder_{[Re4]}$ and a lookup $table_{[LUT1]}$; configuring for the third state $holder_{[Re3]}$ a clock $input_{[Re3]}$, a data $input_{[Re3]}$ and a data $output_{[Re3]}$; configuring for the fourth state $holder_{[Re4]}$ a clock $input_{[Re4]}$, a data $input_{[Re4]}$ and a data $output_{[Re4]}$; configuring for the lookup $table_{[LUT1]}$ a first data $input_{[LUT1]}$, a second data $input_{[LUT1]}$, a third data $input_{[LUT1]}$, a fourth data $input_{[LUT1]}$ and a data $output_{[LUT1]}$; connecting the second data $input_{[LUT1]}$ to the data $input_{[B]}$; connecting the data $output_{[Re4]}$ to the first data $input_{[LUT1]}$ and the data $output_{[CB]}$; connecting the clock $input_{[Re3]}$ and the clock $input_{[Re4]}$ to the clock $input_{[CB]}$; connecting the data $input_{[Re3]}$ and the third data $input_{[LUT1]}$ to the user $enable_{[CB]}$; connecting the data $output_{[Re3]}$ to the fourth data $input_{[LUT1]}$; and connecting the data $output_{[LUT1]}$ to the data $input_{[Re4]}$. It should be noted that, the function of the lookup table$_{[LUT1]}$ is equivalent to that of the non-gate circuit$_{[A]}$ in FIG. 14, and an AND gate circuit$_{[A1]}$ and a multiplexer$_{[MUX3]}$ have a combined function of a module. The first to fourth data inputs of the lookup table$_{[LUT1]}$ are equivalent to the signal input$_{[A]}$, the first data input$_{[A1]}$, the first data input$_{[MUX3]}$ and the second data input$_{[MUX3]}$. The data output$_{[LUT1]}$ of the lookup table$_{[LUT1]}$ is equivalent to the data output$_{[Re4]}$ in FIG. 12, that is, the function of pre-written truth table of the lookup table$_{[LUT1]}$ is equivalent to the combined function of the AND gate circuit$_{[A1]}$ and the multiplexer$_{[MUX3]}$.

The third state holder$_{[Re3]}$ is configured to be a register or a latch.

Figure 16:
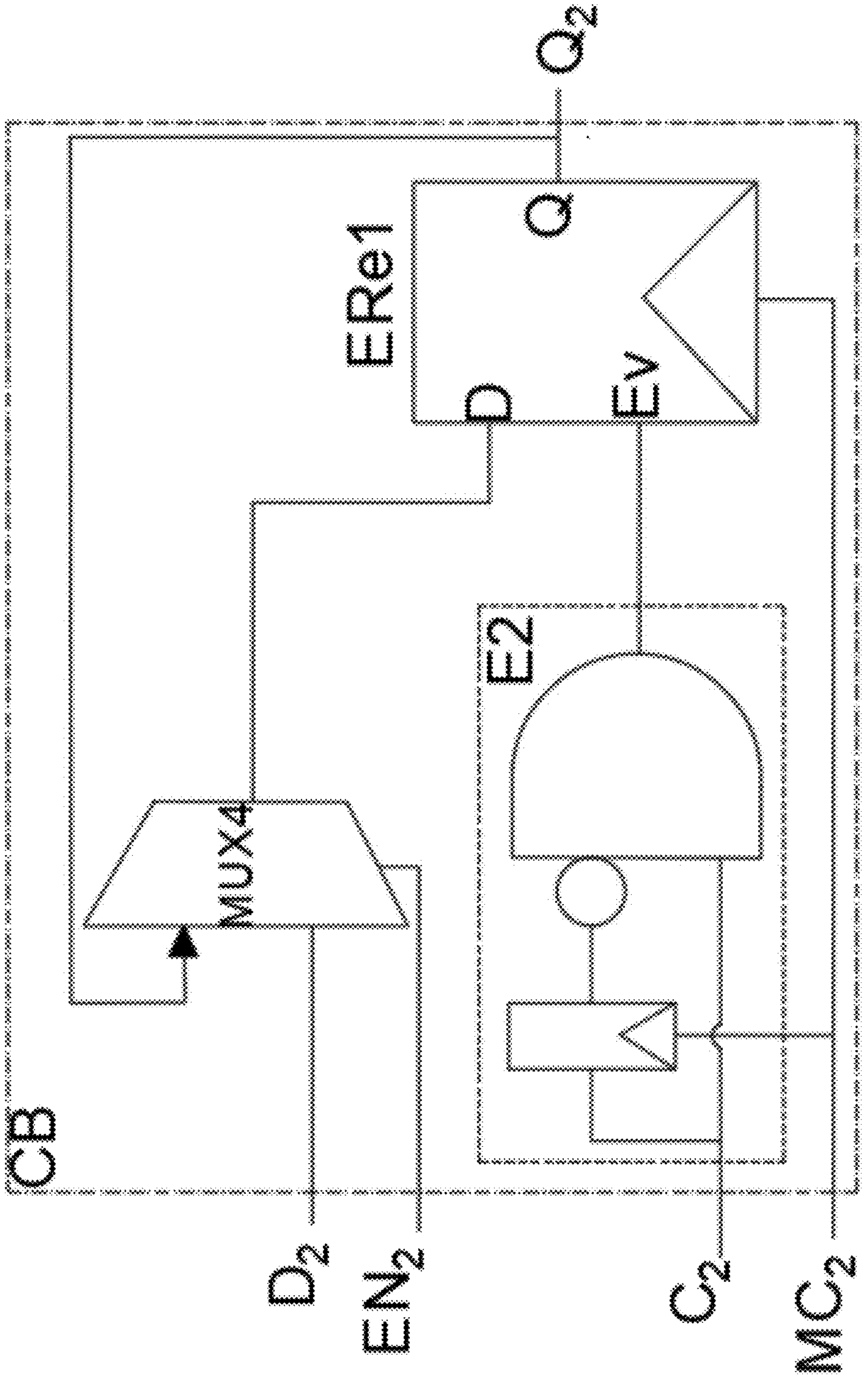
FIG. 16 is a structure schematic drawing of a clock model$_{[CB]}$ provided by an other example in the prevent invention.

Preferably, when an enable of a sequential cell is connected to a circuit, referring to FIG. 16, S2.1 further includes: identifying on the sequential cell: a data input, a user-clock input, a data output and an enable. S4.1.3 further includes: configuring for the clock model$_{[CB]}$ a data input$_{[CB]}$, a data output$_{[CB]}$, a user enable$_{[CB]}$, a clock input$_{[CB]}$ and an enable$_{[CB]}$; configuring for the clock model$_{[CB]}$ a clock detector$_{[E2]}$, a memory cell$_{[ERe1]}$ and a multiplexer$_{[MUX4]}$; configuring for the clock detector$_{[E2]}$ a user enable$_{[E2]}$, a clock input$_{[E2]}$ and an active-edge output$_{[E2]}$; configuring for the memory cell$_{[ERe1]}$ a clock input$_{[ERe1]}$, an enable$_{[ERe1]}$, a data input$_{[ERe1]}$ and a data output$_{[ERe1]}$; configuring for the multiplexer$_{[MUX4]}$ a first data input$_{[MUX4]}$, a second data input$_{[MUX4]}$, a signal selection$_{[MUX4]}$ and a data output$_{[MUX4]}$; connecting the second data input$_{[MUX4]}$ to the data input$_{[CB]}$; connecting the signal selection$_{[MUX4]}$ to the enable$_{[CB]}$; connecting the data output$_{[ERe1]}$ to the data output$_{[CB]}$ and to the first data input$_{[MUX4]}$; connecting the clock input$_{[E2]}$ and the clock input$_{[ERe1]}$ to the clock input$_{[CB]}$; connecting the user enable$_{[E2]}$ to the user enable$_{[CB]}$; connecting the active-edge output$_{[E2]}$ to the enable$_{[ERe1]}$; and connecting the data output$_{[MUX4]}$ to the data input$_{[ERe1]}$. In FIG. 16, $D_2$ represents a data signal connected to the data input$_{[CB]}$, $Q_2$ represents the data sample output from the data output$_{[CB]}$, $C_2$ represents the user clock connected to the user enable$_{[CB]}$, $MC_2$ represents a clock signal connected to the clock input$_{[CB]}$, and $EN_2$ represents the enable signal connected to the enable$_{[CB]}$. It should be noted that, when the enable signal connected to the enable$_{[CB]}$ is active, the multiplexer$_{[MUX4]}$ is driven to output the data signal$_{[D2]}$ input by the data input$_{[CB]}$ to the data input$_{[ERe1]}$, otherwise, the multiplexer$_{[MUX4]}$ is driven to output the data signal$_{[Q2]}$ output from the data output$_{[CB]}$ to the data input$_{[ERe1]}$.

Preferably, an active edge is configured to a rising edge or falling edge, wherein, the active edge is the active edge triggered by the user clock and/or the active edge triggered by the primary clock'.

Figure 17:
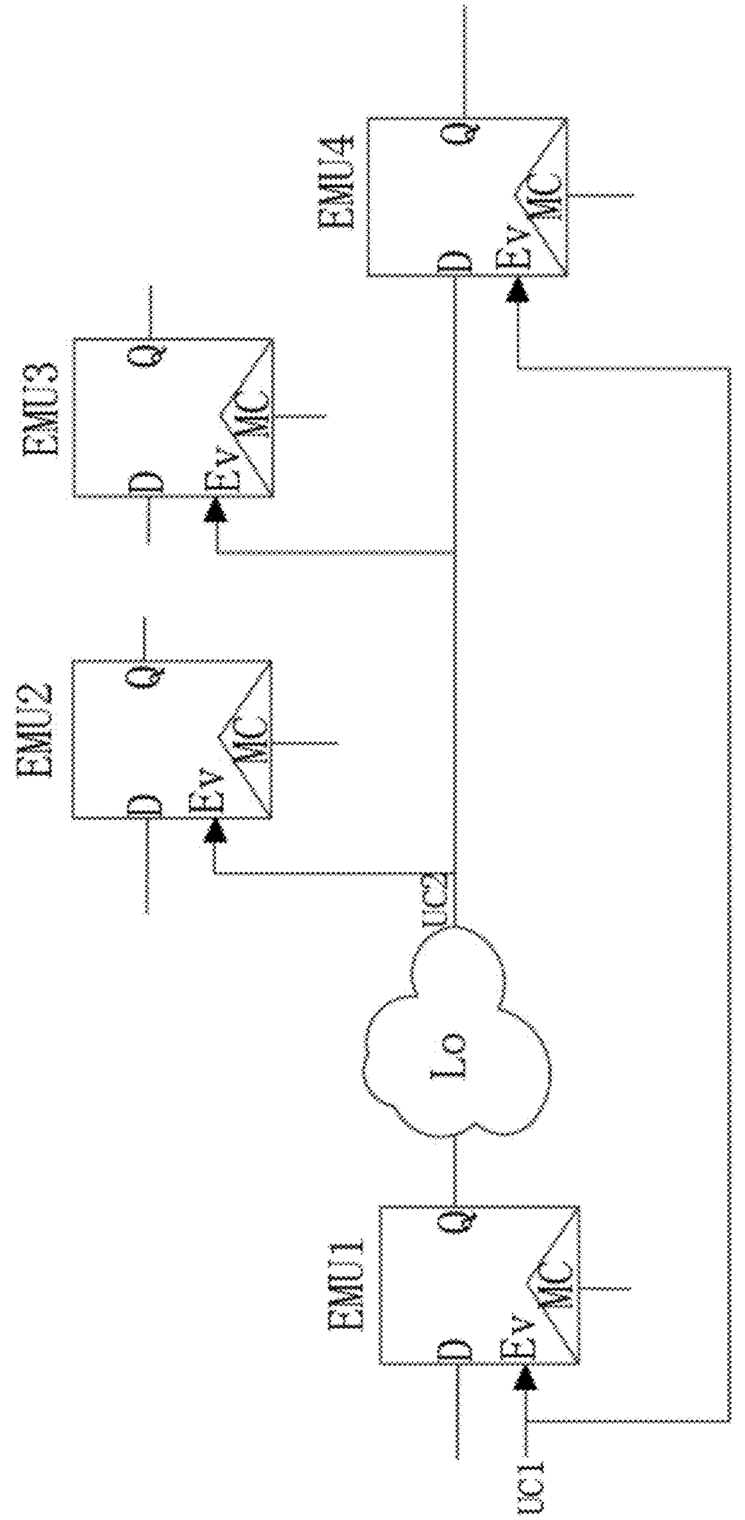
FIG. 17 is a structure schematic drawing of a sequential cell after being substituted with a clock model.

In an IC design, there are anchor points in the combinational logics among sequential cells. The anchor point is the generated clock, which is output by the sequential cell, processed by the combinational logic circuit and then processed by a plurality of branch output ports, and each branch output port is called as an anchor point, and each anchor point is connected to the clock input of the corresponding clock model. Since the user clocks connected to the same anchor point are exactly the same, the results of the user clock active edges of the same user clock output through the clock detector of different clock models are the same, thereby saving hardware resources. The clock models connected to the same anchor point are configured to share a same clock detector to detect an active edge of a user clock. As an example, in order to better understand the anchor point in the present invention, referring to FIG. 17, four modified clock models$_{[EMU1\text{-}[EMU4]}$ are provided in FIG. 17. The clock models$_{[EMU1]}$ can be the clock model$_{[CA]}$ or the clock model$_{[CB]}$. The clock model$_{[CA]}$ and the clock model$_{[CB]}$ is pre-reserved with the same external port. In FIG. 15, D represents a data input, Q represents a data output, Ev represents a user enable, and MC represents a clock input, wherein, the user enable$_{[E1]}$ of the clock models$_{[EMU1]}$ and the user enable$_{[Ev]}$ of the clock models$_{[EMU4]}$ are connected to the same anchor point anchor 1, the user enable$_{[Ev]}$ of the clock models$_{[EMU2]}$ and the user enable$_{[Ev]}$ of the clock models$_{[EMU3]}$ are connected to the same anchor point anchor 2, and the user clocks$_{[UC1]}$ connected to the clock models$_{[EMU1]}$ and the clock models$_{[EMU4]}$ are the same, and the user clocks$_{[UC2]}$ connected to the clock models$_{[EMU2]}$ and the clock models$_{[EMU3]}$ are the same. For the clock detector, when the input user clocks are the same, the output results of clock detector are the same. Therefore, the clock models connected to the same user clock can share the same clock detector, that is, the clock models$_{[EMU1]}$ and the clock models$_{[EMU4]}$ share a same clock detector, and the clock models$_{[EMU2]}$ and the clock models$_{[EMU3]}$ share a same clock detector.

Combination of common clock detectors includes the following three examples.

Figure 18:
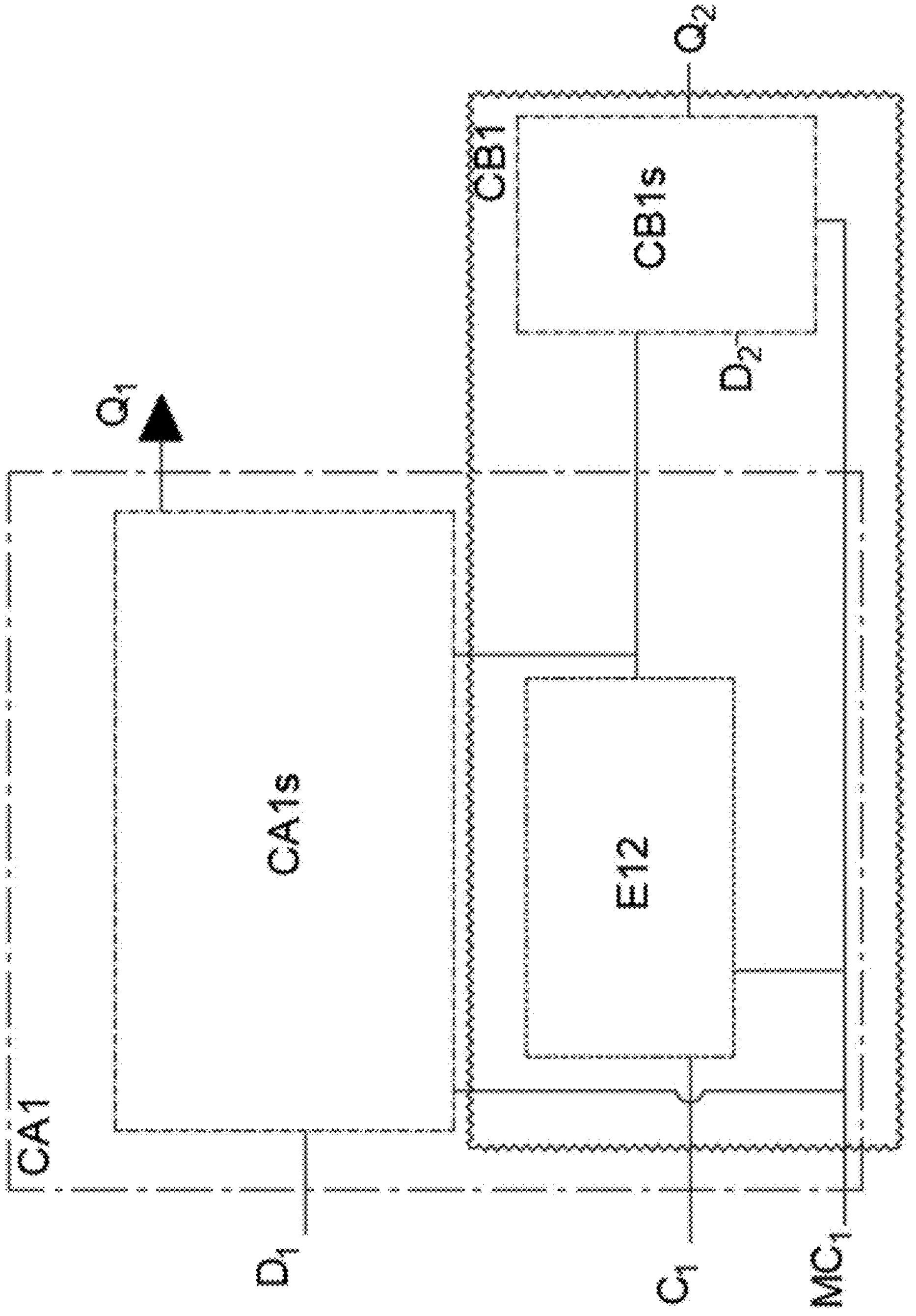
FIG. 18 is a structure schematic drawing of a clock detector for a clock model$_{[CA]}$ and a clock model$_{[CB]}$ jointly and provided in the present invention.
Figure 19:
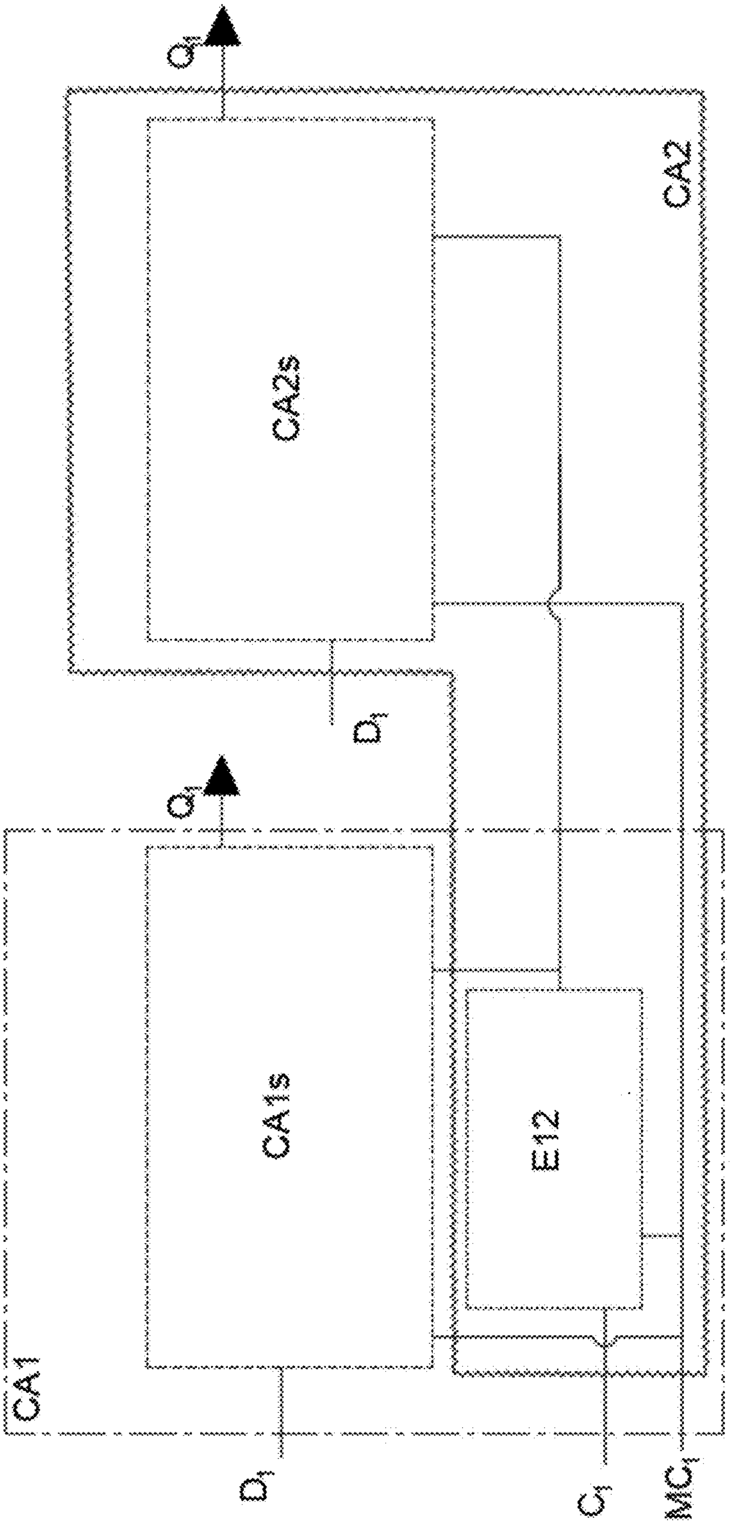
FIG. 19 is a structure schematic drawing of a clock detector for two clock models$_{[CA]}$ jointly and provided in the present invention.
Figure 20:
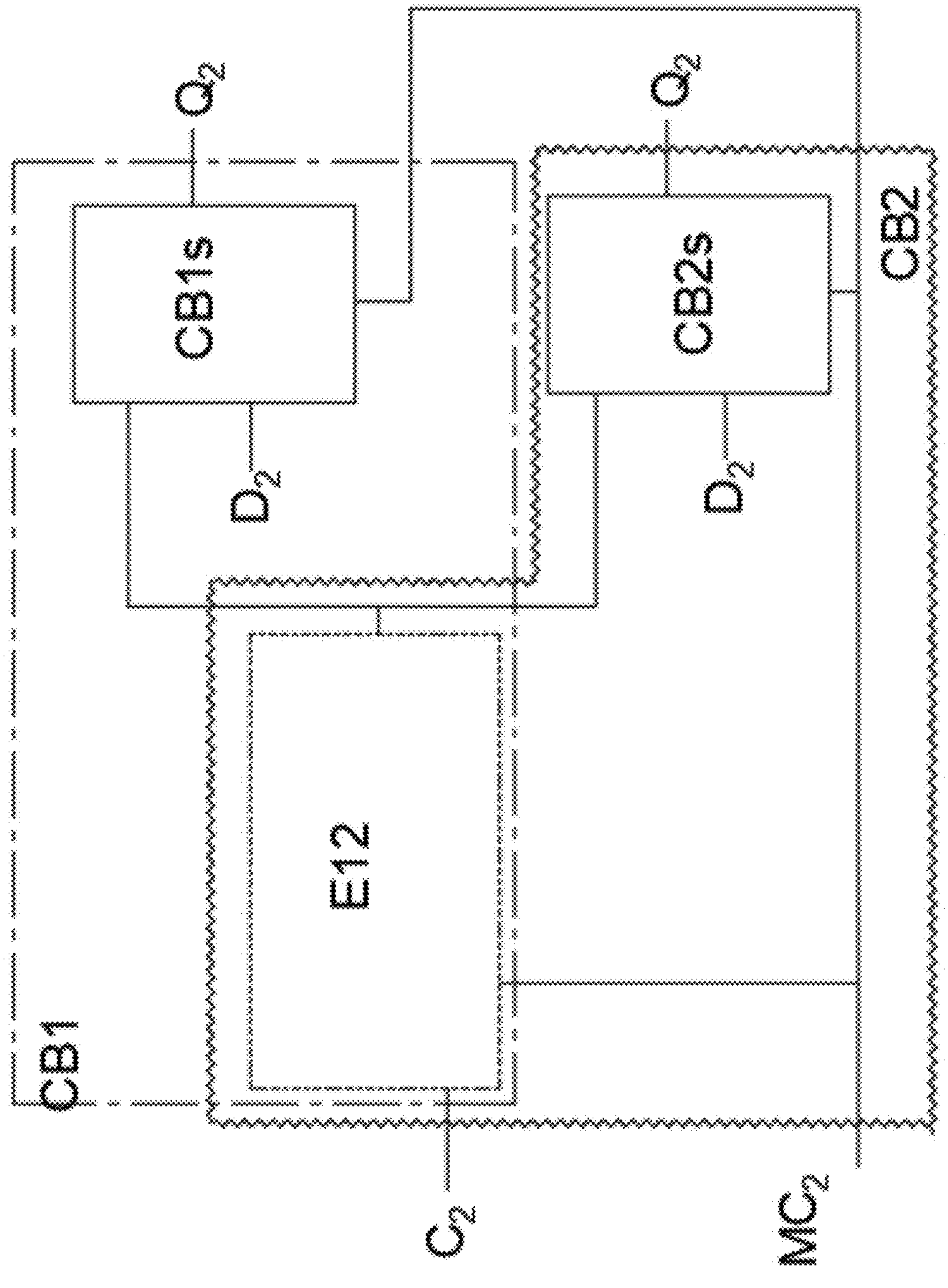
FIG. 20 is a structure schematic drawing of a clock detector for two clock models$_{[CB]}$ jointly and provided in the present invention.
Figure 21:
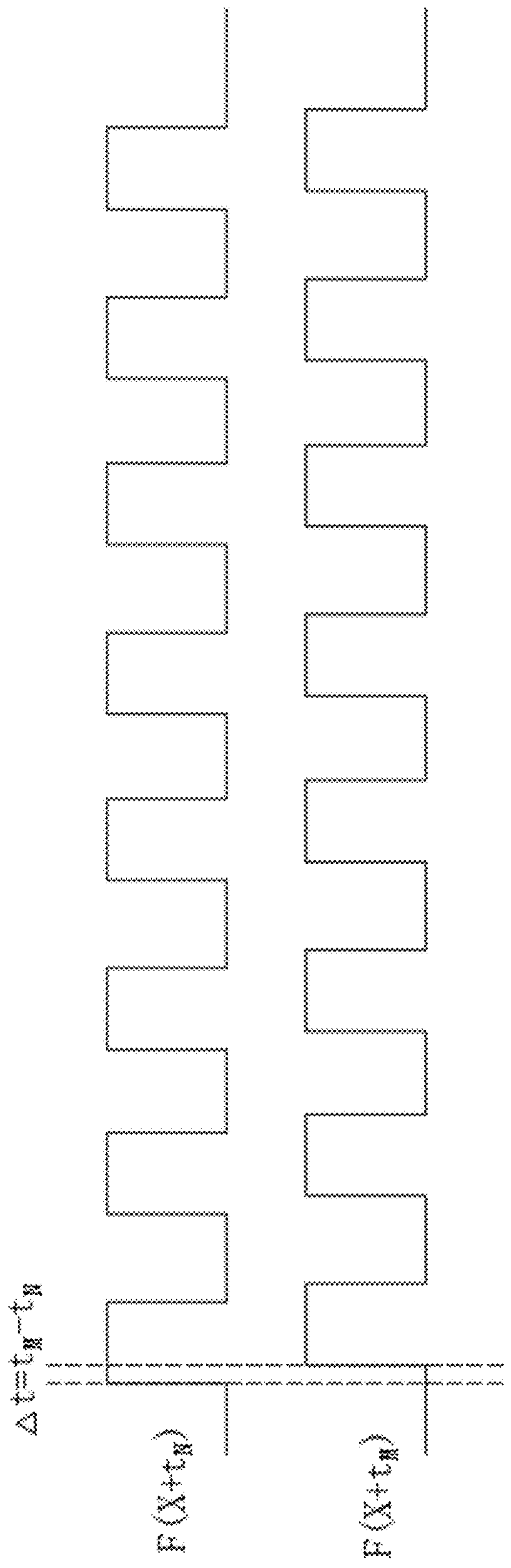
FIG. 21 is a schematic drawing of a timing sequence between two nodes labeled as group B on a same path.

Preferably, referring to FIG. 18, in S1, the plurality of sequential cells include: a sequential cell$_{[A1]}$ and a sequential cell$_{[B1]}$. in S2, on the directed graph: the sequential cell$_{[A1]}$ is converted to a node$_{[A1]}$, and the sequential cell$_{[B1]}$ is converted to a node$_{[B1]}$; in S3.1.1: the node$_{[A1]}$ is labeled as group A, and the node$_{[B1]}$ is labeled as group B; in S3.1.2: a clock model$_{[CA1]}$ is inserted at the node$_{[A1]}$, and the clock model$_{[CA1]}$ is configured to include a data input$_{[CA1]}$, a data output$_{[CA1]}$, a user enable$_{[CA1]}$ and a clock input$_{[CA1]}$; in S3.1.3: a clock model$_{[CB1]}$ is inserted at the node$_{[B1]}$, and the clock model$_{[CB1]}$ is configured to include a data input$_{[CB1]}$, a data output$_{[CB1]}$, a user enable$_{[CB1]}$ and a clock input$_{[CB1]}$; S3.1 further includes: configuring for the clock model$_{[CA1]}$ a sampler$_{[CA1s]}$; configuring for the sampler$_{[CA1s]}$ a data input$_{[CA1s]}$, an enable$_{[CA1s]}$, a clock input$_{[CA1s]}$ and a data output$_{[CA1s]}$; configuring for the clock model$_{[CB1]}$ a sampler$_{[CB1s]}$; configuring for the sampler$_{[CB1s]}$ a data input$_{[CB1s]}$, an enable$_{[CB1s]}$, a clock input$_{[CB1s]}$ and a data output$_{[CB1s]}$; identifying an anchor to which the user enable$_{[CA1]}$ is connected; and if the user enable$_{[CB1]}$ is connected to the anchor: configuring jointly for the clock model$_{[CA1]}$ and for the clock model$_{[CB1]}$ a clock detector$_{[E12]}$; configuring for the clock detector$_{[E12]}$ a user enable$_{[E12]}$, a clock input$_{[E12]}$ and an active-edge output$_{[E12]}$; connecting the user enable$_{[E12]}$ to the anchor, the user enable$_{[CA1]}$ and the user enable$_{[CB1]}$; connecting the clock input$_{[E12]}$ to the clock input$_{[CA1s]}$, the clock input$_{[CA1]}$, the clock input$_{[CB1s]}$ and the clock input$_{[CB1]}$; connecting the active-edge output$_{[E12]}$ to the enable$_{[CA1s]}$ and to the enable$_{[CB1s]}$; connecting the data input$_{[CA1s]}$ to the data input$_{[CA1]}$; connecting the data output$_{[CA1s]}$ to the data output$_{[CA1]}$; connecting the data input$_{[CB1s]}$ to the data input$_{[CB1]}$; and connecting the data output$_{[CB1s]}$ to the data output$_{[CB1]}$. As shown in FIG. 18, $C_1$ represents both the user clock$_{[A]}$ connected to the user enable$_{[CA1]}$ and the user clock$_{[B]}$ connected to the user enable$_{[CB1]}$; and $MC_1$ represents both the primary clock' connected to the clock input$_{[CA1]}$ and the primary clock' connected to the clock input$_{[CB1]}$. By making the clock model$_{[CA1]}$ and clock model$_{[CB1]}$ connected to a same anchor share one clock detector, it can not only obtain the same active edge as the unshared clock detector, but also greatly reduce use of clock detectors and reduce consumption of hardware resources. Preferably, referring to FIG. 19, wherein, in S1, the plurality of sequential cells include: a sequential cell$_{[A1]}$ and a sequential cell$_{[A2]}$; in S2, on the directed graph: the sequential cell$_{[A1]}$ is converted to a node$_{[A1]}$, and the sequential cell$_{[A2]}$ is converted to a node$_{[A2]}$; in S3.1.1, the node$_{[A1]}$ and the node$_{[A2]}$ are both labeled as group A; in S3.1.2: the clock model$_{[CA1]}$ is inserted at the node$_{[A1]}$; and the clock model$_{[CA1]}$ is configured to include a data input$_{[CA1]}$, a data output$_{[CA1]}$, a user enable$_{[CA1]}$ and a clock input$_{[CA1]}$; a clock model$_{[CA2]}$ is inserted at the node$_{[A2]}$; and the clock model$_{[CA2]}$ is configured to include a data input$_{[CA2]}$, a data output$_{[CA2]}$, a user enable$_{[CA2]}$ and a clock input$_{[CA2]}$; S3.1 further includes: configuring for the clock model$_{[CA1]}$ a sampler$_{[CA1s]}$; configuring for the sampler$_{[CAS1]}$ a data input$_{[CA1s]}$, an enable$_{[CA1s]}$, a clock input$_{[CA1s]}$ and a data output$_{[CA1s]}$; configuring for the clock model$_{[CA2]}$ a sampler$_{[CA2s]}$; configuring for the sampler$_{[CA2s]}$ a data input$_{[CA2s]}$, an enable$_{[CA2s]}$, a clock input$_{[CA2s]}$ and a data output$_{[CA2s]}$; identifying an anchor to which the user enable$_{[CA1]}$ is connected; and if the user enable$_{[CA2]}$ is connected to the anchor: configuring jointly for the clock model$_{[CA1]}$ and for the clock model$_{[CA2]}$ a clock detector$_{[E12]}$; configuring for the clock detector$_{[E12]}$ a user enable$_{[E12]}$, a clock input$_{[E12]}$ and an active-edge output$_{[E12]}$; connecting the user enable$_{[E12]}$ to the anchor, the user enable$_{[CA1]}$ and the user enable$_{[CA2]}$; connecting the clock input$_{[E12]}$ to the clock input$_{[CA1s]}$, the clock input$_{[CA1]}$, the clock input$_{[CA2s]}$ and the clock input$_{[CA2]}$; connecting the active-edge output$_{[E12]}$ to the enable$_{[CA1s]}$ and to the enable$_{[CA2s]}$; connecting the data input$_{[CA1s]}$ to the data input$_{[CA1]}$; connecting the data output$_{[CA1s]}$ to the data output$_{[CA1]}$; connecting the data input$_{[CA2s]}$ to the data input$_{[CA2]}$; and connecting the data output$_{[CA2s]}$ to the data output$_{[CA2]}$. As shown in FIG. 19, since the clock detector$_{[E12]}$ is used in common, $C_1$ represents both the user clock$_{[A]}$ connected to the user enable$_{[CA1]}$ and the user clock$_{[A]}$ connected to the user enable$_{[CA2]}$; and $MC_1$ represents both the primary clock' connected to the clock input$_{[CA1]}$ and the primary clock' connected to the clock input$_{[CA2]}$. By making two or more clock models$_{[CA]}$ connected to the same anchor share one clock detector, it can not only obtain the same active edge as the unshared clock detector, but also greatly reduce use of clock detectors and reduce consumption of hardware resources. Preferably, referring to FIG. 20, wherein, in S1, the plurality of sequential cells include: a sequential cell$_{[B1]}$ and a sequential cell$_{[B2]}$; in S2, on the directed graph: the sequential cell$_{[B1]}$ is converted to a node$_{[B1]}$ and the sequential cell$_{[B2]}$ is converted to a node$_{[B2]}$; in S3.1.1, the node$_{[B1]}$ and the node$_{[B2]}$ are both labeled as group B; in S3.1.3: a clock model$_{[CB1]}$ is inserted at the node$_{[B1]}$; the clock model$_{[CB1]}$ is configured to include a data input$_{[CB1]}$, a data output$_{[CB1]}$, a user enable$_{[CB1]}$ and a clock input$_{[CB1]}$; a clock model$_{[CB2]}$ is inserted at the node$_{[B2]}$; and the clock model$_{[CB2]}$ is configured to include a data input$_{[CB2]}$, a data output$_{[CB2]}$, a user enable$_{[CB2]}$ and a clock input$_{[CB2]}$; S3.1 further includes: configuring for the clock model$_{[CB1]}$ a sampler$_{[CB1s]}$; configuring for the sampler$_{[CB1s]}$ a data input$_{[CB1s]}$, an enable$_{[CB1s]}$, a clock input$_{[CB1s]}$ and a data output$_{[CB1s]}$; configuring for the clock model$_{[CB2]}$ a sampler$_{[CB2s]}$; configuring for the sampler$_{[CB2s]}$ a data input$_{[CB2s]}$, an enable$_{[CB2s]}$, a clock input$_{[CB2s]}$ and a data output$_{[CB2s]}$; identifying an anchor to which the user enable$_{[CB1]}$ is connected; and if the user enable$_{[CB2]}$ is connected to the anchor: configuring jointly for the clock model$_{[CB1]}$ and for the clock model$_{[CB2]}$ a clock detector$_{[E12]}$; configuring for the clock detector$_{[E12]}$ a user enable$_{[E12]}$, a clock input$_{[E12]}$ and an active-edge output$_{[E12]}$; connecting the user enable$_{[E12]}$ to the anchor, the user enable$_{[CB1]}$ and the user enable$_{[CB2]}$; connecting the clock input$_{[E12]}$ to the clock input$_{[CB1s]}$, the clock input$_{[CB1]}$, the clock input$_{[CB2s]}$ and the clock input$_{[CB2]}$; connecting the active-edge output$_{[E12]}$ to the enable$_{[CB1s]}$ and to the enable$_{[CB2s]}$; connecting the data input$_{[CB1s]}$ to the data input$_{[CB1]}$; connecting the data output$_{[CB1s]}$ to the data output$_{[CB1]}$; connecting the data input$_{[CB2s]}$ to the data input$_{[CB2]}$; and connecting the data output$_{[CB2s]}$ to the data output$_{[CB2]}$. As shown in FIG. 20, since the clock detector$_{[E12]}$ is used in common, $C_2$ represents both the user clock$_{[B]}$ connected to the user enable$_{[CB1]}$ and the user clock$_{[B]}$ connected to the user enable$_{[CB2]}$; and $MC_1$ represents both the primary clock' connected to the clock input$_{[CB1]}$ and the primary clock' connected to the clock input$_{[CB2]}$. By making two or more clock models$_{[CB]}$ connected to a same anchor share one clock detector, it can not only obtain the same active edge as the unshared clock detector, but also greatly reduce use of clock detectors and reduce consumption of hardware resources.

iii) modifying the rest of nodes$_{[B]}$ in the plurality of nodes being labeled as group B.

Referring to FIG. 3 again, the FIG. 3 shows a comparison diagram before and after modification. In order to better express the relationship before and after modification, the same letter used in the diagram is unchanged to indicate that the signal connected to each port before and after modification. Referring to the part a of FIG. 3, which shows structure among sequential cells of an IC design before modification, for any one register$_{[FFi]}$ before modification, the register$_{[FFi]}$ comprises a clock input$_{[C]}$, a data input$_{[D]}$ and data output$_{[Q]}$, wherein the Lo is a combinational logic circuit. The clock input$_{[C]}$ of the register$_{[FFi]}$ is connected to the user clock$_{[UCi]}$, the data input$_{[D]}$ is connected to data signal$_{[Di]}$, and the data output$_{[Q]}$ outputs data signal$_{[Qi]}$. Referring to the part b of FIG. 3, which shows structure schematic drawing of the clock model after modification, to better express relationship among ports, D is also adopted in the part b of FIG. 3 to represent a data input$_{[CA]}$ of a clock model$_{[CA]}$ or a clock input$_{[CB]}$ of a clock model$_{[CB]}$, Q represents a data output$_{[CA]}$ of a clock model$_{[CA]}$ or a data output$_{[CB]}$ of a clock model$_{[CB]}$, Ev represents a user enable$_{[CA]}$ of a clock model$_{[CA]}$ or a user enable$_{[CB]}$ of a clock model$_{[CB]}$, and the register$_{[FFi]}$ is substituted with a clock model$_{[CAi]}$. The data signal$_{[Di]}$ is connected to a data input$_{[D]}$ of a clock model$_{[CAi]}$, the user clock$_{[UCi]}$ is connected to the user enable$_{[Ev]}$ of the clock model$_{[CAi]}$, a data output$_{[Q]}$ of the clock model$_{[CAi]}$ outputs data signal$_{[Qi]}$, and a clock input$_{[C]}$ of the clock model$_{[CAi]}$ is connected to the primary clock'. The register$_{[FFi]}$ is substituted with a clock model$_{[CAj]}$ by the same method, and register$_{[FFp]}$ is substituted with a clock model$_{[CAp]}$, and the clock inputs of clock model$_{[CAi]}$, clock model$_{[CAj]}$ and clock model$_{[CBp]}$ are connected to corresponding clock signals$_{[MC]}$, respectively.

Wherein, the substituted circuit comprises a p-th clock model$_{[CA]}$ and a g-th clock model$_{[CB]}$, which are series-connected, and the user enable$_{[CA]}$ of the p-th clock model$_{[CA]}$ and the user enable$_{[CB]}$ of the g-th clock model$_{[CB]}$ are connected to a same user clock. The series relationship is that the data output of the previous-level clock model is connected to the data input of the next-level clock model. The modified circuit also comprises a v-th clock model$_{[CB]}$ and a q-th clock model$_{[CB]}$, which are series-connected, and the user enable$_{[CB]}$ of the v-th clock model$_{[CB]}$ and the user enable$_{[CB]}$ of the q-th clock model$_{[CB]}$ are connected to a same user clock. The v-th clock model$_{[CB]}$ and the q-th clock model$_{[CB]}$ also can be connected to a same primary clock'. The problem of timing sequence disorder caused by clock models$_{[CB]}$ used in cascade structure can be solved by using two clock models$_{[CA]}$.

3.2) configuring a phase shaft for a primary clock', including the steps of:

3.2.1) identifying a path on the directed graph and configuring a phase shift for a primary clock' to which a node on the path is connected.

Preferably, an algorithm for identifying the path includes depth first search (DFS) or breadth first search (BFS). Other algorithms for identifying the path in the prior art also fall within the protection scope of the present invention.

3.2.2) numbering a total of K nodes on the path, wherein a node$_{[\#1]}$ is the root node and a node$_{[\#K]}$ is one of the leaf nodes.

It should be noted that, there is only one root node and one leaf node on a path, and the path is led by the root node and terminated by the leaf node.

i) configuring a phase shift for a primary clock' to which a node being labeled as group B is connected, including: identifying on the path a set of nodes that are labeled as group B, which includes a node$_{[\#M]}$ and a node$_{[\#N]}$; and letting $F(x-t_M)=F(x-t_N)$, wherein: $t_M>t_N$; $1 \le N<M \le K$; $F(x-t_M)$ represents a waveform of the primary clock' to which the node$_{[\#M]}$ is connected; ty is a phase shift; $F(x-t_N)$ represents a waveform of the primary clock' to which the node$_{[\#N]}$ is connected; and $t_N$ is a phase shift.

As an example, referring to FIG. 11 again, assuming that the node$_{[F4]}$ is a leaf node and the node$_{[F2]}$ and the node$_{[F3]}$ are labeled as group B, the nodes$_{[F1]-[F4]}$ on a path in FIG. 11 are numbered sequentially, and the nodes$_{[F1]-[F4]}$ are labeled as nodes$_{[\#1-4]}$ sequentially, then the node$_{[\#2]}$ and the node$_{[\#3]}$ satisfy: $F(x-t_3)=F(x-t_2)$ and $t_3>t_2$.

Wherein, whether a clock model$_{[CB]}$ outputs a data sample is controlled by both a user clock and a primary clock', while whether a clock model$_{[CA]}$ outputs a data sample is completely controlled by a user clock independently. The times for transmitting a same active edge of the user clock to different nodes in a path are in time sequence, the clock model$_{[CA]}$ in the path directly outputs a data sample along occurring of an active edge on the user clock, while the clock model$_{[CB]}$ in the path needs to wait for occurring of an active edge on the primary clock' to output a data sample. For the clock model$_{[CB]}$, the data sample is transmitted along direction of the path, the node$_{[\#N]}$ in small number outputs the data sample firstly, and the node$_{[\#M]}$ in large number outputs the data sample later, so that the arriving time sequence of an active edge of the primary clock' should be configured to ensure outputting sequence of the data sample, thereby ensuring normal operation of a circuit. Therefore, only when the time for outputting the data sample by the node$_{[\#M]}$ lags behind that of the node$_{[\#N]}$, the node$_{[\#M]}$ can obtain a correct data sample. Therefore, it is necessary to configure the phase ty of the primary clock' connected at the node$_{[\#M]}$ with the larger number in the path to be lagged behind the phase ty of the primary clock' connected at the node$_{[\#N]}$ with the small number in the path, so as to ensure that the correct data sample can be obtained. Further, when the phase difference between the $t_M$ and $t_N$ is equal to or larger than the time for transmitting the data sample from the node$_{[\#N]}$ to the node$_{[\#M]}$, a correct data sample for a sample period of the primary clock' can be obtained by performing data sampling at the time when the data is transmitted to the node$_{[\#M]}$ or performing data sampling by waiting for a small time different.

ii) configuring a phase shift for a primary clock', which is connected at a node being labeled as group A, including:

ii) configuring a phase shift for the primary clock' to which a node being labeled as group A is connected, including: ii.1) identifying on the path a set of nodes that are labeled as group A, which includes a node$_{[\#U]}$; ii.2) when $1<U<K$: identifying a nearest set of nodes to the node$_{[\#U]}$ that are labeled as group B, which includes a node$_{[\#R]}$ and a node$_{[\#S]}$, wherein: $R<U<S$; and letting exactly one of the two propositions be true: $F(x-t_U)=F(x-t_R)$, wherein $t_U \ge t_R$; and $F(x-t_U)=F(x-t_S)$, wherein $t_S \ge t_U$.

As an example, referring to FIG. 11 again, assuming that the node$_{[F8]}$ is a leaf node, the node$_{[F5]}$ and the node$_{[7]}$ are labeled as group B and the node$_{[F6]}$ is labeled as group A, the nodes$_{[F1]-[F8]}$ in an other path in FIG. 11 are numbered sequentially, the node$_{[F1]}$ is labeled as node$_{[\#1]}$, the nodes$_{[F5]-[F8]}$ are labeled as nodes$_{[\#2-5]}$ sequentially, wherein the node$_{[\#2]}$ and the node$_{[\#4]}$ are labeled as group B, satisfying: $F(x-t_4)=F(x-t_2)$ and $t_4>t_2$; the node$_{[\#3]}$ is labeled as group B, satisfying: $F(x-t_3)=F(x-t_2)$ and $t_3 \le t_2$, or satisfying: $F(x-t_3)=F(x-t_4)$ and $t_4 \le t_3$.

Figure 22:
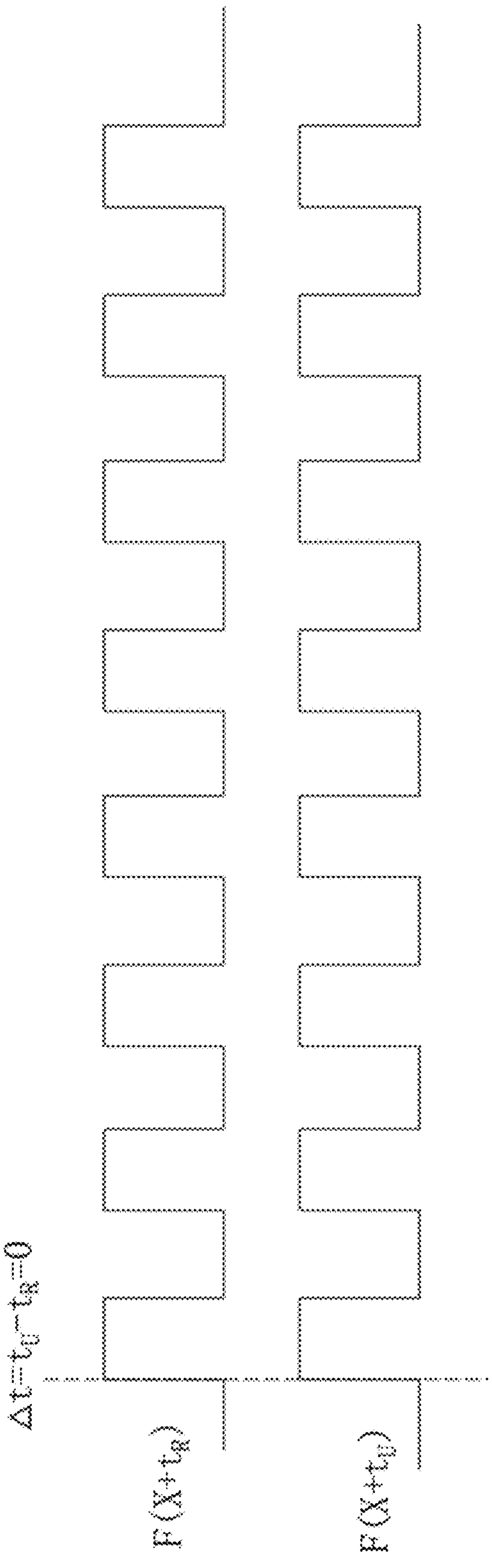
FIG. 22 is a schematic drawing of a timing sequence between a node labeled as group A and a closest node labeled as group B on a same path.
Figure 23:
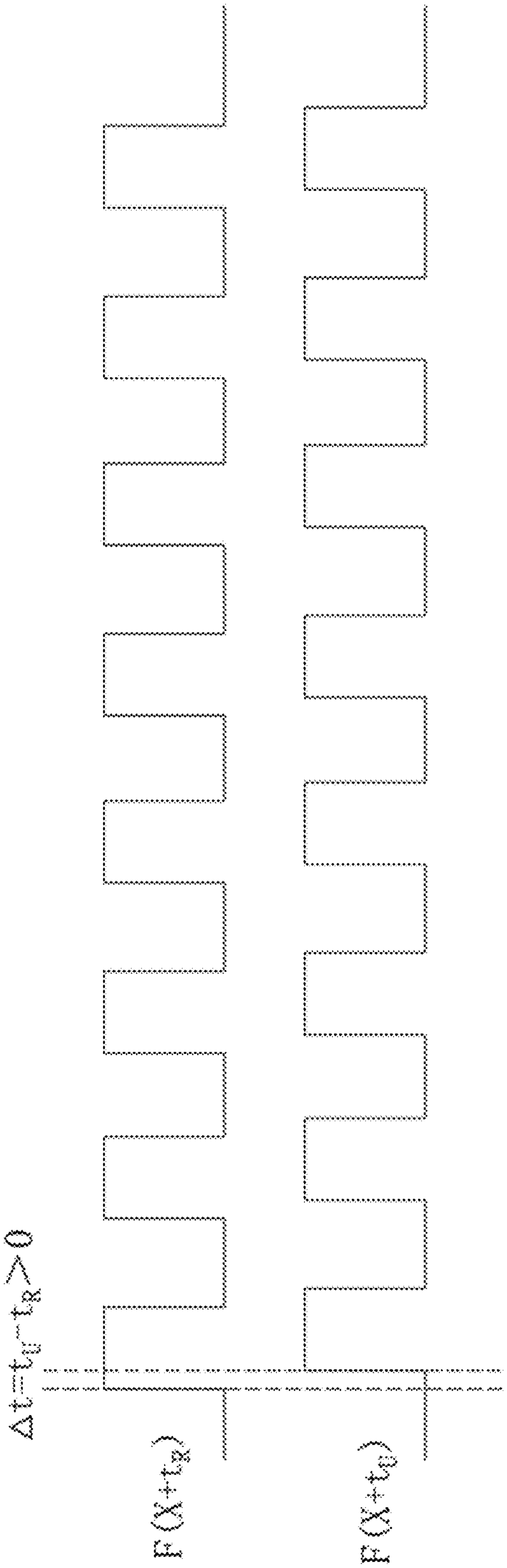
FIG. 23 is a schematic drawing of another timing sequence between a node labeled as group A and a closest node labeled as group B on a same path.

Wherein, whether a clock model$_{[CA]}$ outputs a data sample is not controlled by a primary clock', so that the clock model$_{[CA]}$ can be driven by a primary clock' having the same phase as any clock model$_{[CB]}$ having closest to the clock model$_{[CA]}$. for the node$_{[\#U]}$ and the node$_{[\#R]}$, whether the clock model$_{[CA]}$ corresponding to the node$_{[\#U]}$ outputs a data sample is not controlled by the primary clock', so that the phase of the primary clock' connected at the node$_{[\#U]}$ can be equal to that of the primary clock' connected at the node$_{[\#R]}$ or the node$_{[\#S]}$. As shown in FIG. 22, when the phase of the primary clock' connected at the node$_{[\#U]}$ is equal to that of the primary clock' connected at the node$_{[\#R]}$, satisfying, $\Delta t=t_U-t_R=0$, but the node$_{[\#R]}$ and the node$_{[\#S]}$ are both nodes being labeled as group B, the node$_{[\#R]}$ and the node$_{[\#S]}$ also should satisfy that the phase $t_S$ of the primary clock' connected at the node$_{[\#S]}$ lags behind the phase $t_R$ of the primary clock' connected at the node$_{[\#R]}$, that is, the phases of the node$_{[\#R]}$ and the node$_{[\#S]}$ cannot be equal, so that the phase of the primary clock' connected at the node$_{[\#U]}$ can only be chosen to be equal to that of the primary clock' connected at the node$_{[\#R]}$ or that of the primary clock' connected at the node$_{[\#S]}$. At the same time, a data sample being transmitted from the node$_{[\#R]}$ to the node$_{[\#U]}$ takes a time, so that the phase difference between $t_U$ and $t_R$ is equal to or larger than the time for transmitting the data sample from the node$_{[\#N]}$ to the node$_{[\#M]}$, a correct data sample can be obtained at the node$_{[\#U]}$. Similarly, when the phase difference between $t_U$ and $t_S$ is equal to or larger than the time for transmitting the data sample from the node$_{[\#U]}$ to the node$_{[\#R]}$, a correct data sample can be obtained at the node$_{[\#R]}$. As shown in FIG. 23, when the phase of the primary clock' connected at the node$_{[\#U]}$ lags behind the phase of the primary clock' connected at the node$_{[\#R]}$, $\Delta t=t_U-t_R>0$.

Preferably, $\tau=t_S-t_U$, satisfying: $t_0<\tau<T/2$, or satisfying: $t_0<\tau<T$, wherein $t_0$ is a minimum threshold of $\tau$.

Preferably, $t_0$ is a preset offset time threshold.

Preferably, t0 is a time lag between when an active edge occurring on clock model$_{[CB]}$ when a user clock is being inputted into a clock detector and when the active edge of the user clock is being outputted from the clock detector, so as to ensure that the offset time τ is within the time range of the active rising edge outputted by the clock detector.

Figure 4:
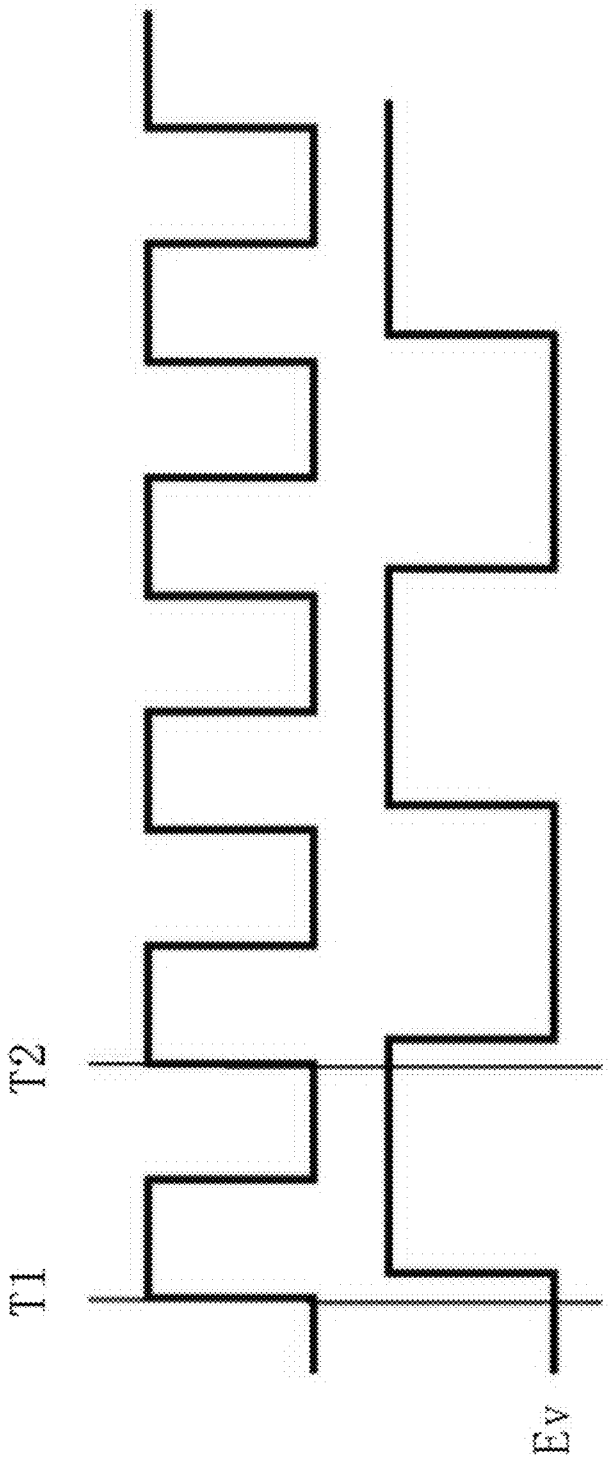
FIG. 4 is timing sequence schematic drawing of clock model$_{[CB]}$ before the primary clock' shifts.
Figure 5:
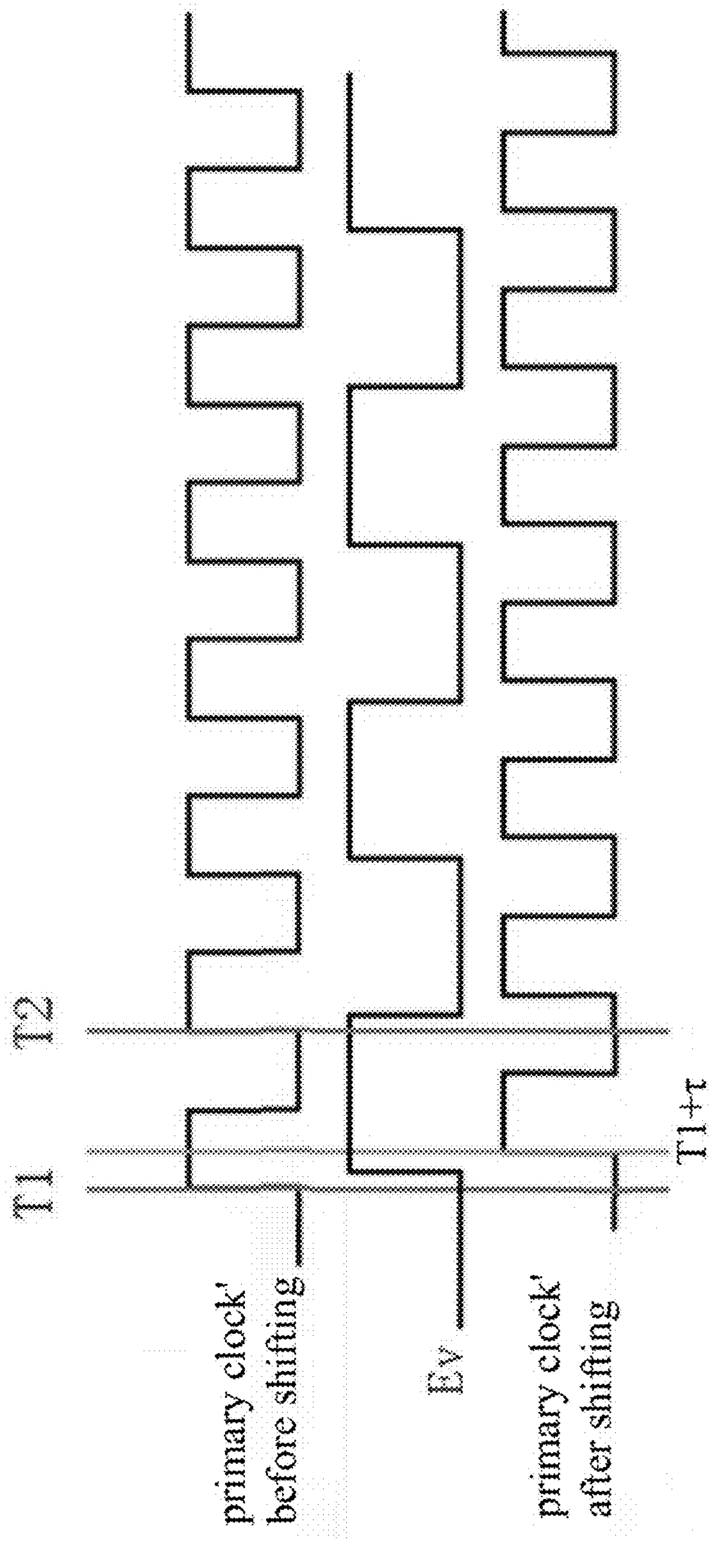
FIG. 5 is timing sequence comparison schematic drawing of clock model$_{[CB]}$ before and after the primary clock' shifts.

Understandably, referring to FIG. 4, the clock $model_{[CB]}$ only performs data sampling when the active edge $output_{[E1]}$ of a clock detector outputs and an active edge occurs on a user clock connected to the Ev and an active edge of a primary clock' connected to a clock input occurs, that is, an active edge of the user clock is needed to be detected firstly after the user clock is connected to clock model CB, and there is a delay in a circuit before the user clock is connected to Ev, also that is, there is a small delay between the occurrence time of the active edge of the user clock connected to the Ev and the actual occurrence time of the active edge of the user clock. Therefore, when the rising edge of the primary clock' arrives at time T1, Ev is in low logic at this time because the active edge of the user clock connected to Ev lags, so that the primary clock' cannot sample at this rising edge at time T1; and an effective data sampling can be performed only when the rising edge of the next time T2 of the primary clock' during the high logic of Ev arrives, so that the data sampling lags behind by one clock period of the primary clock'. Referring to FIG. 5, the shifted primary clock' is obtained after actively shifting a primary clock' forward by a time τ, so that the shifted primary clock' can sample at time T1+τ. When $t_0<\tau<T$, the sampling at time T1+τ is in the same period as the actually-desired sampling.

when U=1: identifying a nearest set of nodes to the $node_{[\#1]}$ that are labeled as group B, which includes a $node_{[\#S]}$; and letting $F(x-t_U)=F(x-t_S)$, wherein $t_S \geq t_U$, that is, when the root node in a path is inserted with a clock $model_{[CA]}$, it is necessary to satisfy that the phase of the primary clock' at the $node_{[\#S]}$ closest to the root node is equal to or lags behind the phase of the primary clock' at the root node, therefore, $\Delta t=t_S-t_U\geq 0$ should be satisfied.

ii.4) when U=K: identifying a nearest set of nodes to the $node_{[\#K]}$ that are labeled as group B, which includes $node_{[\#R]}$; and letting $F(x-t_U)=F(x-t_R)$, wherein $t_U \geq t_R$, that is, when the leaf node on a path is inserted with a clock $model_{[CA]}$, it is necessary to satisfy that the phase of the primary clock' at the leaf node is equal to or lags behind the phase of the primary clock' at the closest $node_{[\#R]}$, therefore, $\Delta t=t_U-t_R\geq 0$ should be satisfied.

It should be noted that, the phase relationship between the clock $model_{[CA]}$ and the clock $model_{[CB]}$ in the path is defined in Sii.3 and Sii.4 when the root node or leaf node is inserted with a clock $model_{[CA]}$, ensuring a correct data sample can be obtained at a node of the plurality of nodes in the path.

Wherein, $F(x-t_R)$ represents a waveform of the primary clock' to which the $node_{[\#R]}$ is connected; $t_R$ indicates the waveform's phase; $F(x-t_U)$ represents a waveform of the primary clock' to which the $node_{[\#U]}$ is connected; $t_U$ indicates the waveform's phase; $F(x-t_S)$ represents a waveform of the primary clock' to which the $node_{[\#S]}$ is connected; and $t_S$ indicates the waveform's phase.

3.2.3) identifying the rest of paths on the directed graph and configuring a phase shift for a primary clock' to which a node on the other path is connected.

Preferably, a process for obtaining $F(x-t_M)$ includes: obtaining a clock $signal_{[Tc]}$; performing X frequency division to the clock $signal_{[Tc]}$ to obtain frequency-divided signal, which is F(x); delaying the frequency-divided signal by time ty to obtain $F(x-t_M)$, and so on, obtaining waveforms of the primary clocks' at other nodes by the same method. Understandably, the clock frequency of the frequency-divided signal is 1/X times of that of the clock $signal_{[Tc]}$. The clock signals of the first clock substituting model and the second clock substituting model can be obtained by frequency division of the clock signal, so as to further reduce number of introduced clock domains, wherein the clock $signal_{[Tc]}$ can be a crystal signal.

Preferably, a method for X frequency division of the clock $signal_{[Tc]}$ includes: inputting the clock $signal_{[Tc]}$ into a frequency divider to obtain a frequency-divided signal, wherein X is larger than 0.

Preferably, a method for delaying the frequency-divided signal by a time t includes: inputting the frequency-divided signal into a delay circuit.

The clock tree contains clock domains and data domains. X clock $models_{[CA]}$ are contained in a clock domain, and Y hybrid clock models are contained in a data domain. The Y hybrid clock models include Y1 clock models (CA) and Y2 clock $models_{[CB]}$, wherein Y=Y1+Y2. The clock $model_{[CA]}$ is a clock model having function completely equivalent to a $register_{[FF]}$, and the clock $model_{[CB]}$ is a clock model having a clock delay relative to the clock $model_{[CA]}$. The primary $clock'_{[mc2]}$ by which the clock $model_{[CB]}$ is driven has a same clock period T as the primary $clock'_{[mc1]}$ by which the clock $model_{[CB]}$ is driven, the primary $clock'_{[mc2]}$ has an offset time τ with respect to the primary $clock'_{[me1]}$, $t_0<\tau<T/2$, and t0 is a minimum threshold for τ, wherein, a data signal from the data output of an i-th clock $model_{[CA]}$ in a clock domain is a clock input signal of an i+1-th clock $model_{[CA]}$; and a data signal from the data output of a j-th hybrid clock model is a data input signal of a j+1-th clock substituting model.

It should be noted that, the number of the clock models $_{[CB]}$ is larger than that of the clock $models_{[CA]}$. In actual circuits, the number of the sequential cells in a data domain is far larger than that of the sequential cells in a clock domain, so that more clock $models_{[CB]}$ can be used after substitution, thereby converting resource consumption of the system.

For the clock $models_{[CB]}$ in the data domain, when the data signal from the data output of the j-th sequential cell is connected to the data input of the g-th sequential cell, the j-th sequential cell and the g-th sequential cell are both substituted with clock $models_{[CB]}$. For two clock $models_{[CB]}$ connected in series, the timing sequences of the two clock $models_{[CB]}$ are exactly the same when the primary clocks' connected to the two are the same, thereby avoiding the problem of timing sequence disorder and converting resource consumption of the system.

Preferably, the method further includes:

Preferably, in a data domain, a r-th clock $model_{[CB]}$ and a r+1-th clock $model_{[CB]}$ are provided and in series connection, and the r+1-th clock $model_{[CB]}$ is in series connected with a q-th clock $model_{[CA]}$, and the clock signal between the r+1-th clock $model_{[CB]}$ and the q-th clock $model_{[CA]}$ has an offset time t. A method for shifting the offset time t includes: substituting the r+1-th clock $model_{[CB]}$ with a clock $model_{[CA]}$ such that the offset time t is shifted between the r+1-th clock $model_{[CB]}$ and the q-th clock $model_{[CA]}$. By shifting offset time through adjusting types of clock substituting models, the maximum clock frequency of the system is further increased, thereby improving performances of the system.

It should be noted that: all clock $models_{[CA]}$ in the clock domain are within same clock domain, and the less the clock domain is introduced, the less resources of the BUFG are required, so as to further save resource consumption of the system. The whole system can simultaneously started-up and paused by controlling one primary clock'.

It should be noted that: the primary clocks' that drive all clock $models_{[CB]}$ in group B are the same.

S4) converting the IC design into a modified design;

S5) implementing the modified design on the FPGA; and

S6) validating the IC design with the FPGA on which the modified design is implemented.

In conclusion, an embodiment of the present invention provides a method for emulating an IC design with an FPGA, comprising the steps of: extracting a directed graph by identifying logic paths of the sequential cells in an IC design, and substituting a clock $model_{[CA]}$ or a clock $model_{[CB]}$ for a sequential cell corresponding to a node in the directed graph; adding a user enable to an external port of the clock $model_{[CA]}$ or the clock $model_{[CB]}$ compared to the port of a sequential cell in the IC design, through cooperation of a user clock to which a clock $model_{[CA]}$ or a user enable of a clock $model_{[CA]}$ is connected and a primary clock' to which a clock input is connected, a clock $model_{[CA]}$ reproducing the function of the sequential cell in the IC design by controlling outputting time of a data sample, and the clock $model_{[CB]}$ reproducing the function of the sequential cell in the IC design by controlling data sampling time; and configuring phase shifts for primary clocks' by which the clock $model_{[CA]}$ and the clock $model_{[CB]}$ are driven to ensure normal operation of a circuit. The primary clocks' are directly connected to the clock inputs of the clock $model_{[CA]}$ and the clock $model_{[CB]}$ and contain no glitch, the user clock is connected to user enables of the clock $model_{[CA]}$ and the clock $model_{[CB]}$, but the user enable is non-sensitive to glitch-containing user clock, so that the invention can solve the technical problem of sampling error due to presence of the user clock while ensuring the function of the original sequential cells.

Compared with example 2 and example 3, example 1 has the effect that: the problems of large hardware resource consumption due to all using of clock $models_{[CA]}$ and large number of clock domains due to all using of clock $models_{[CB]}$ are balanced.

Example 2

A method for emulating an IC design with an FPGA is provided in example 2. The method comprises the steps of:

S1) identifying in the IC design: a primary clock, a subcircuit, a plurality of generated clocks and a plurality of sequential cells, wherein the plurality of generated clocks are derived from the primary clock after being processed by the subcircuit, and a user clock being connected to one of the plurality of sequential cells is the primary clock or one of the plurality of generated clocks.

S2) converting the IC design into a directed graph, including: 2.1) converting the plurality of sequential cells to a plurality of nodes, and 2.2) constructing the directed graph by connecting the plurality of nodes.

Wherein, S2.1 for converting the plurality of sequential cells to a plurality of nodes includes: converting a sequential cell in the plurality of sequential cells to a node, including: identifying a user clock by which the sequential cell is driven; identifying a plurality of nodes on the sequential cells and constructing the directed graph by connecting the plurality of nodes; wherein identifying a plurality of nodes on the sequential cells includes: a data input; a user-clock input and a data output, and the user clock is connected to the user-clock input; converting the sequential cell into a node, including: defining a logic path having a pair of endpoints, wherein: the user-clock input constitutes one of the pair of endpoints; and the data output constitutes the other one of the pair of endpoints; defining a node on the logic path between the pair of endpoints, and defining another logic path and defining a node on the other logic path between its pair of endpoints; and converting the rest of the plurality of sequential cells to nodes.

S3) configuring the plurality of nodes on the directed graph which includes exactly a root node and a plurality of leaf nodes, including: 3.1) inserting a clock $model_{[CA]}$ at a node on the directed graph, and 3.2) configuring a phase shift for the primary clock'.

Wherein, S3.1 includes: 3.1.1) labeling a plurality of nodes on the directed graph all as group A; 3.1.2) modifying the nodes that are labeled as group A.

Wherein, S3.1.2 further includes i) configuring the clock $model_{[CA]}$, which includes a data $input_{[CA]}$, a data $output_{[CA]}$, a user $enable_{[CA]}$ and a clock $input_{[CA]}$; ii) modifying a $node_{[A]}$ in the plurality of nodes being labeled as group A; and iii) modifying the rest of $nodes_{[A]}$ in the plurality of nodes being labeled as group A.

Wherein, S3.1.2.ii includes: ii.1) identifying a logic path by which the $node_{[A]}$ is defined in view of S2, wherein: an endpoint of the logic path is located at a user-clock $input_{[A]}$; the other endpoint of the logic path is located at a data $output_{[A]}$; and a user $clock_{[A]}$ is connected to the user-clock $input_{[A]}$.

ii.2) inserting the clock $model_{[CA]}$ at the $node_{[A]}$, including: connecting the data $input_{[CA]}$ to what was connected to the data $input_{[A]}$; connecting the data $output_{[CA]}$ to what was connected to the data $output_{[A]}$; connecting the user $enable_{[CA]}$ to what was connected to the user-clock $input_{[A]}$; and connecting the clock $input_{[CA]}$ to a primary clock' which is equal to or greater than the primary clock in frequencies.

ii.3) configuring the clock $model_{[CA]}$, including: sampling a signal from the data $input_{[CA]}$ at an active edge of the primary clock' to obtain a data sample for a period of the primary clock' led by the active edge; when an N-th active edge is occurring on the user $clock_{[A]}$: obtaining a data $sample_{[N]}$ for a contemporary period of the primary clock'; and outputting to the data $output_{[CA]}$ the data $sample_{[N]}$ until an N+1-th active edge occurs on the user $clock_{[A]}$; and when the N+1-th active edge is occurring on the user $clock_{[A]}$: obtaining a data $sample_{[N+1]}$ for a contemporary period of the primary clock'; and outputting to the data $output_{[CA]}$ the data $sample_{[N+1]}$ until an N+2-th active edge occurs on the user $clock_{[A]}$.

Wherein, S3.2 includes:

3.2.1) identifying a path on the directed graph and configuring a phase shift for a primary clock' to which a node on the path is connected.

3.2.2) numbering on the path a total of K nodes, wherein the total of K nodes include: a $node_{[\#1]}$, a $node_{[\#H]}$, a $node_{[\#U]}$ and a $node_{[\#K]}$, wherein the $node_{[\#1]}$ is the root node, the $node_{[\#K]}$ is one of the leaf nodes; and $1K \geq H \leq U \leq K$.

3.2.3) letting $F(x-t_U)=F(x-t_H)$ and $t_U \geq t_H$, wherein: $F(x-t_U)$ represents a waveform for a primary clock' to which the $node_{[\#U]}$ is connected, and $t_U$ indicates a phase shift; and $F(x-t_H)$ represents a waveform for a primary clock' to which the $node_{[\#H]}$ is connected, and $t_H$ indicates a phase shift.

3.2.4) identifying another path on the directed graph and configuring a phase shift for a primary clock' to which a node on the other path is connected.

Preferably, S3.1 further includes: configuring for the clock model$_{[CA]}$ a clock detector$_{[E1]}$ and a sampler$_{[CAs]}$; configuring for the clock detector$_{[E1]}$ a user enable$_{[E1]}$, a clock input$_{[E1]}$ and an active-edge output$_{[E1]}$; configuring for the sampler$_{[CAs]}$ a data input$_{[CAs]}$, an enable$_{[CAs]}$, a clock input$_{[CAs]}$ and a data output$_{[CAs]}$; connecting the user enable$_{[E1]}$ to the user enable$_{[CA]}$; connecting the clock input$_{[E1]}$ and the clock input$_{[CAs]}$ to the clock input$_{[CA]}$; connecting the active-edge output$_{[E1]}$ to the enable$_{[CAs]}$; connecting the data input$_{[CAs]}$ to the data input$_{[CA]}$; and connecting the data output$_{[CAs]}$ to the data output$_{[CA]}$.

Preferably, wherein, S3.1 further includes: configuring for the sampler$_{[CAs]}$ a first state holder$_{[Re1]}$, a second state holder$_{[Re2]}$ and a multiplexer$_{[MUX1]}$; configuring for the first state holder$_{[Re1]}$ a clock input$_{[Re1]}$, a data input$_{[Re1]}$ and a data output$_{[Re1]}$; configuring for the second state holder$_{[Re2]}$ a clock input$_{[Re2]}$, a data input$_{[Re2]}$ and a data output$_{[Re2]}$; configuring for the multiplexer$_{[MUX1]}$ a first data input$_{[MUX1]}$, a second data input$_{[MUX1]}$, a signal selection$_{[MUX1]}$ and a data output$_{[MUX1]}$; connecting the data input$_{[Re1]}$ to the data input$_{[CAs]}$; connecting the data output$_{[MUX1]}$ to the data output$_{[CAs]}$; connecting the clock input$_{[Re1]}$ and the clock input$_{[Re2]}$ to the clock input$_{[CAs]}$; connecting the data output$_{[Re1]}$ to the first data input$_{[MUX1]}$; connecting the data input$_{[Re2]}$ to the data output$_{[MUX1]}$; connecting the data output$_{[Re2]}$ to the second data input$_{[MUX1]}$; and connecting the enable$_{[CAs]}$ to the signal selection$_{[MUX1]}$.

Preferably, wherein, in S1, the plurality of sequential cells include: a sequential cell$_{[A1]}$ and a sequential cell[2]; in S2, on the directed graph: the sequential cell$_{[A1]}$ is converted to a node$_{[A1]}$; and the sequential cell$_{[A2]}$ is converted to a node$_{[A2]}$; in S3.1.1, the node$_{[A1]}$ and the node$_{[A2]}$ are both labeled as group A; in S3.1.2: a clock model$_{[CA1]}$ is inserted at the node$_{[A1]}$; and the clock model$_{[CA1]}$ is configured to include a data input$_{[CA1]}$, a data output$_{[CA1]}$, a user enable$_{[CA1]}$ and a clock input$_{[CA1]}$; a clock model$_{[CA2]}$ is inserted at the node$_{[A2]}$; and the clock model$_{[CA2]}$ is configured to include a data input$_{[CA2]}$, a data output$_{[CA2]}$, a user enable$_{[CA2]}$ and a clock input$_{[CA2]}$; S3.1 further includes: configuring for the clock model$_{[CA1]}$ a sampler$_{[CA1s]}$; configuring for the sampler$_{[CAS1]}$ a data input$_{[CA1s]}$, an enable$_{[CA1s]}$, a clock input$_{[CA1s]}$ and a data output$_{[CA1s]}$; configuring for the clock model$_{[CA2]}$ a sampler$_{[CA2s]}$; configuring for the sampler$_{[CA2s]}$ a data input$_{[CA2s]}$, an enable$_{[CA2s]}$, a clock input$_{[CA2s]}$ and a data output$_{[CA2s]}$; identifying an anchor to which the user enable$_{[CA1]}$ is connected; and if the user enable$_{[CA2]}$ is connected to the anchor: configuring jointly for the clock model$_{[CA1]}$ and for the clock model$_{[CA2]}$ a clock detector$_{[E12]}$; configuring for the clock detector$_{[E12]}$ a user enable$_{[E12]}$, a clock input$_{[E12]}$ and an active-edge output$_{[E12]}$; connecting the user enable$_{[E12]}$ to the anchor, the user enable$_{[CA1]}$ and the user enable$_{[CA2]}$; connecting the clock input$_{[E12]}$ to the clock input$_{[CA1s]}$, the clock input$_{[CA1]}$, the clock input$_{[CA2s]}$ and the clock input$_{[CA2]}$; connecting the active-edge output$_{[E12]}$ to the enable$_{[CA1s]}$ and to the enable$_{[CA2s]}$; connecting the data input$_{[CA1s]}$ to the data input$_{[CA1]}$; connecting the data output$_{[CA1s]}$ to the data output$_{[CA1]}$; connecting the data input$_{[CA2s]}$ to the data input$_{[CA2]}$; and connecting the data output$_{[CA2s]}$ to the data output$_{[CA2]}$.

The example 2 has the benefits that: the phase shifts of all clock models$_{[CA]}$ can be the same, when the phase shifts are the same, all clock models$_{[CA]}$ are located in a same clock domain, so as to not only save BUFG hardware sources, but also achieve the purpose of simultaneously starting-up or pausing a circuit.

Example 3

A method for emulating an IC design with an FPGA is provided in example 3. The method comprises the steps of:

S1) identifying in the IC design: a primary clock, a subcircuit, a plurality of generated clocks and a plurality of sequential cells, wherein the plurality of generated clocks are derived from the primary clock after being processed by the subcircuit, and a user clock being connected to one of the plurality of sequential cells is the primary clock or one of the plurality of generated clocks.

S2) converting the IC design into a directed graph, including: 2.1) converting the plurality of sequential cells to a plurality of nodes, and 2.2) constructing the directed graph by connecting the plurality of nodes.

Wherein, S2.1 for converting the plurality of sequential cells to a plurality of nodes includes: converting a sequential cell in the plurality of sequential cells to a node, including: identifying a user clock by which the sequential cell is driven; identifying a plurality of nodes on the sequential cells and constructing the directed graph by connecting the plurality of nodes; wherein identifying a plurality of nodes on the sequential cells includes: a data input; a user-clock input and a data output, and the user clock is connected to the user-clock input; converting the sequential cell into a node, including: defining a logic path having a pair of endpoints, wherein: the user-clock input constitutes one of the pair of endpoints; and the data output constitutes the other one of the pair of endpoints; defining a node on the logic path between the pair of endpoints; and defining another logic path and defining a node on the other logic path between its pair of endpoints; and converting the rest of the plurality of sequential cells to nodes.

S3) configuring the plurality of nodes on the directed graph which includes exactly a root node and a plurality of leaf nodes, including: 3.1) inserting a clock model$_{[CB]}$ at a node on the directed graph, and 3.2) configuring a phase shift for a primary clock'.

Wherein, S3.1 includes: 3.1.1) labeling a plurality of nodes on the directed graph all as group B; 3.1.2) modifying the nodes that are labeled as group B.

Wherein, S3.1.2 includes i) configuring the clock model$_{[CB]}$, which includes a data input$_{[CB]}$, a data output$_{[CB]}$, a user enable$_{[CB]}$ and a clock input$_{[CB]}$; ii) modifying a node$_{[B]}$ in the plurality of nodes being labeled as group B; and iii) modifying the rest of nodes$_{[B]}$ in the plurality of nodes being labeled as group B.

Wherein, S3.1.2.ii includes:

ii.1) identifying a logic path by which the node$_{[B]}$ is defined in view of S2, wherein: an endpoint of the logic path is located at a user-clock input$_{[B]}$; the other endpoint of the logic path is located at a data output$_{[B]}$; and the user clock$_{[B]}$ is connected to the user-clock input$_{[B]}$.

ii.2) inserting a clock model$_{[CB]}$ at the node$_{[B]}$, including: connecting the data input$_{[CB]}$ to what was connected to the data input$_{[B]}$; connecting the data output$_{[CB]}$ to what was connected to the data output$_{[B]}$; connecting the user enable$_{[B]}$ to what was connected to the user-clock input$_{[B]}$; and connecting the clock input$_{[CB]}$ to a primary clock' which is equal to or greater than the primary clock in frequencies.

ii.3) configuring the clock model$_{[CB]}$, including: when an active edge is occurring on the user clock$_{[B]}$ and when an active edge is occurring on the primary clock': sampling a signal from the data input$_{[CB]}$ to obtain a data sample for a period of the primary clock' led by the active edge; and; and when no active edge occurs on the user clock$_{[B]}$ or no active edge occurs on the primary clock': sampling nothing from the data input$_{[CB]}$; and outputting nothing to the data output$_{[CB]}$.

Wherein, S3.2 includes: 3.2.1) identifying a path on the directed graph and configuring a phase shift for a primary clock' to which a node on the path is connected; 3.2.2) numbering a total of K nodes on the path, wherein the total of K nodes include: a node$_{[\#1]}$, a node$_{[\#N]}$, a node$_{[\#M]}$ and a node$_{[\#K]}$, wherein the node$_{[\#1]}$ is the root node, and the node$_{[\#K]}$ is one of the leaf nodes, wherein: $1 \le N \le M \le K$; 3.2.3) letting $F(x-t_M)=F(x-t_N)$ 且 $t_M>t_N$, wherein: $F(x-t_M)$ is represents waveform for a primary clock' connected to the node$_{[\#M]}$, and ty indicates a phase shift; and $F(x-t_N)$ represents a waveform of the primary clock' to which the node$_{[\#N]}$ is connected, and $t_N$ indicates a phase shift; and 3.2.4) identifying an other path on the directed graph and configuring a phase shift for a primary clock' to which a node on the other path is connected.

Preferably, wherein, S3.1 further includes: configuring for the clock model$_{[CB]}$ a clock detector$_{[E2]}$ and a sampler$_{[CBs]}$; configuring for the clock detector$_{[E2]}$ a user enable$_{[E2]}$, a clock input$_{[E2]}$ and an active-edge output$_{[E2]}$; configuring for the sampler$_{[CBs]}$ a clock input$_{[CBs]}$, an enable$_{[CBs]}$, a data input$_{[CBs]}$ and a data output$_{[CBs]}$; connecting the data input$_{[CBs]}$ to the data input$_{[CB]}$; connecting the data output$_{[CBs]}$ to the data output$_{[CB]}$; connecting the clock input$_{[E2]}$ and the clock input$_{[CBs]}$ to the clock input$_{[CB]}$; connecting the user enable$_{[E2]}$ to the user enable$_{[CB]}$; and connecting the active-edge output$_{[E2]}$ to the enable$_{[CBs]}$.

Preferably, the sampler$_{[CBs]}$ is configured to be a register having an enable.

Preferably, wherein, in S1, the plurality of sequential cells include: a sequential cell$_{[B1]}$ and a sequential cell$_{[B2]}$; in S2, on the directed graph: the sequential cell$_{[B1]}$ is converted to a node$_{[B1]}$, and the sequential cell$_{[B2]}$ is converted to a node$_{[B2]}$; in S3.1.1, the node$_{[B1]}$ and the node$_{[B2]}$ are both labeled as group B; in S3.1.2: a clock model$_{[CB1]}$ is inserted at the node$_{[B1]}$; the clock model$_{[CB1]}$ is configured to include a data input$_{[CB1]}$, a data output$_{[CB1]}$, a user enable$_{[CB1]}$ and a clock input$_{[CB1]}$; a clock model$_{[CB2]}$ is inserted at the node$_{[B2]}$; and the clock model$_{[CB2]}$ is configured to include a data input$_{[CB2]}$, a data output$_{[CB2]}$, a user enable$_{[CB2]}$ and a clock input$_{[CB2]}$; S3.1 further includes: configuring for the clock model$_{[CB1]}$ a sampler$_{[CB1s]}$; configuring for the sampler$_{[CB1s]}$ a data input$_{[CB1s]}$, an enable$_{[CB1s]}$, a clock input$_{[CB1s]}$ and a data output$_{[CB1s]}$; configuring for the clock model$_{[CB2s]}$ a sampler$_{[CB2s]}$; configuring for the sampler$_{[CB2s]}$ a data input$_{[CB2s]}$, an enable$_{[CB2s]}$, a clock input$_{[CB2s]}$ and a data output$_{[CB2s]}$; identifying an anchor to which the user enable$_{[CB1]}$ is connected; and if the user enable$_{[CB2]}$ is connected to the anchor: configuring jointly for the clock model$_{[CB1]}$ and for the clock model$_{[CB2]}$ a clock detector$_{[E12]}$; configuring for the clock detector$_{[E12]}$ a user enable$_{[E12]}$, a clock input$_{[E12]}$ and an active-edge output$_{[E12]}$; connecting the user enable$_{[E12]}$ to the anchor, the user enable$_{[CB1]}$ and the user enable$_{[CB2]}$; connecting the clock input$_{[E12]}$ to the clock input$_{[CB1s]}$, the clock input$_{[CB1]}$, the clock input$_{[CB2s]}$ and the clock input$_{[CB2]}$; connecting the active-edge output$_{[E12]}$ to the enable$_{[CB1s]}$ and to the enable$_{[CB2s]}$; connecting the data input$_{[CB1s]}$ to the data input$_{[CB1]}$; connecting the data output$_{[CB1s]}$ to the data output$_{[CB1]}$; connecting the data input$_{[CB2s]}$ to the data input$_{[CB2]}$; and connecting the data output$_{[CB2s]}$ to the data output$_{[CB2]}$.

Example 3 has the benefits that: since the clock model$_{[CB]}$ has simple structure, compared with the example 1 and the example 2, the example 3 can greatly reduce consumption of FPGA hardware resources.

Based on the same inventive conception as the methods in embodiments, an embodiment of the present invention also provides a system for emulating an IC design with an FPGA, comprising a processor and a computer-readable storage medium in communication with the processor, wherein: the system implements the method for emulating an IC design with an FPGA and provided in any one embodiment aforementioned when the processor executes a program in the computer-readable storage medium.

Wherein, the processor can comprise one or more processing cores, such as 4-core processor, 12-core processor, etc. The processor can realize processing by using at least one hardware form of a digital signal processing (DSP), a field programmable gate array (FPGA) and a programmable logic array (PLA). The processor can also include a host processor and a coprocessor. The host processor is a processor used to process the data in wake state, also known as CPU. The coprocessor is a low-power processor used to process data in standby mode. In some embodiments, the processor may be integrated with a graphics processing unit (GPU), which is responsible for rendering and painting the content required by the display. In some embodiments, the processor may also include an artificial intelligence (AI) processor for processing computational operations concerning machine learning.

Wherein, the computer-readable storage medium is a memory device in a computer device, and is used to store information such as computer readable instructions, data structures, program modules or other data. Understandably, the storage medium herein can include a built-in storage medium in the computer device, and, of course, can include an extended storage medium supported by a computer device. The storage medium provides a storage space, in which one or more computer instructions loadable and executable by the processor are also stored. These computer instructions may be one or more computer programs (including program code). It should be noted that the storage medium herein can be a high-speed RAM memory, and also can be a non-volatile memory. For example, the memory medium comprises RAM, ROM, erasable programmable read-only memory (EPROM), electrically erasable programmable read-only memory (EEPROM), flash memory or other solid memories, CD-ROM, digital video disc (DVD) or other optical memories, tape cartridge, tape, memories or other magnetic memory device, etc. Of course, the skilled in the field know that computer storage media are not limited to the aforementioned.

Based on the same inventive conception as the methods in embodiments, an embodiment of the present invention also provides a non-transitory computer-readable storage medium in which at least one instruction or at least one program is stored, wherein: the at least one instruction or the at least one program is loadable and executable by a processor to implement the method for emulating an IC design with an FPGA and provided in any one embodiment aforementioned, wherein the method for emulating an IC design with an FPGA is described in detail in the method embodiments, and here detailed description is avoided.

What is claimed is:

1. A method for emulating an IC design with an FPGA, comprising the steps of:

S1) identifying in the IC design:

a primary clock;

a subcircuit;

a plurality of generated clocks, which are derived from the primary clock after being processed by the subcircuit; and a plurality of sequential cells, wherein a user clock being connected to one of the plurality of sequential cells is the primary clock or one of the plurality of generated clocks;

S2) converting the IC design into a directed graph, including:

2.1) converting the plurality of sequential cells to a plurality of nodes, including:

2.1.1) converting a sequential cell in the plurality of sequential cells to a node, including:

i) identifying on the sequential cell:

a user clock by which the sequential cell is driven;

a data input;

a user-clock input to which the user clock is connected; and a data output; and ii) converting the sequential cell to a node, including:

defining a logic path having a pair of endpoints, wherein: the user-clock input constitutes one of the pair of endpoints; and the data output constitutes the other one of the pair of endpoints;

defining a node on the logic path between the pair of endpoints; and defining an other logic path and defining a node on the other logic path between its pair of endpoints; and 2.1.2) converting the rest of the plurality of sequential cells to nodes; and 2.2) constructing the directed graph by connecting the plurality of nodes; and S3) configuring the plurality of nodes on the directed graph which includes exactly one root node and a plurality of leaf nodes, including:

3.1) inserting a clock model at a node on the directed graph, including:

3.1.1) labeling on the directed graph at least a node as group A and at least an other node as group B;

3.1.2) modifying the nodes that are labeled as group A, including:

i) configuring a clock model$_{[CA]}$, which includes a data input$_{[CA]}$, a data output$_{[CA]}$, a user enable$_{[CA]}$ and a clock input$_{[CA]}$;

ii) modifying a node$_{[A]}$ in the plurality of nodes being labeled as group A, including:

ii.1) identifying a logic path by which the node$_{[A]}$ is defined in view of S2, wherein:

an endpoint of the logic path is located at a user-clock input$_{[A]}$;

the other endpoint of the logic path is located at a data output$_{[A]}$; and a user clock$_{[A]}$ is connected to the user-clock input$_{[A]}$;

ii.2) inserting the clock model$_{[CA]}$ at the node$_{[A]}$, including:

connecting the data input$_{[CA]}$ to what was connected to the data input$_{[A]}$;

connecting the data output$_{[CA]}$ to what was connected to the data output$_{[A]}$;

connecting the user enable$_{[CA]}$ to what was connected to the user-clock input$_{[A]}$; and connecting the clock input$_{[CA]}$ to a primary clock' which is equal to or greater than the primary clock in frequencies; and ii.3) configuring the clock model$_{[CA]}$, including:

sampling a signal from the data input$_{[CA]}$ at an active edge of the primary clock' to obtain a data sample for a period of the primary clock' led by the active edge;

when an N-th active edge is occurring on the user clock$_{[A]}$:

obtaining a data sample$_{[N]}$ for a contemporary period of the primary clock'; and outputting to the data output$_{[CA]}$ the data sample$_{[N]}$ until an N+1-th active edge occurs on the user clock$_{[A]}$; and when the N+1-th active edge is occurring on the user clock$_{[A]}$:

obtaining a data sample$_{[N+1]}$ for a contemporary period of the primary clock'; and outputting to the data output$_{[CA]}$ the data sample$_{[N+1]}$ until an N+2-th active edge occurs on the user clock$_{[A]}$; and iii) modifying the rest of nodes$_{[A]}$ in the plurality of nodes being labeled as group A; and 3.1.3) modifying the nodes that are labeled as group B, including:

i) configuring a clock model$_{[CB]}$, which includes a data input$_{[CB]}$, a data output$_{[CB]}$, a user enable$_{[CA]}$ and a clock input$_{[CB]}$;

ii) modifying a node$_{[B]}$ in the plurality of nodes being labeled as group B, including:

ii.1) identifying a logic path by which the node$_{[B]}$ is defined in view of S2, wherein:

an endpoint of the logic path is located at a user-clock input$_{[B]}$;

the other endpoint of the logic path is located at a data output$_{[B]}$; and a user clock$_{[B]}$ is connected to the user-clock input$_{[B]}$;

ii.2) inserting the clock model$_{[CB]}$ at the node$_{[B]}$, including:

connecting the data input$_{[CB]}$ to what was connected to the data input$_{[B]}$;

connecting the data output$_{[CB]}$ to what was connected to the data output$_{[B]}$;

connecting the user enable$_{[CB]}$ to what was connected to the user-clock input$_{[B]}$; and connecting the clock input$_{[CB]}$ to a primary clock' which is equal to or greater than the primary clock in frequencies; and ii.3) configuring the clock model$_{[CB]}$, including:

when an active edge is occurring on the user clock$_{[B]}$ and when an active edge is occurring on the primary clock':

sampling a signal from the data input$_{[CB]}$ to obtain a data sample for a period of the primary clock' led by the active edge; and outputting the data sample to the data output$_{[CB]}$; and when no active edge occurs on the user clock$_{[B]}$ or no active edge occurs on the primary clock':

sampling nothing from the data input$_{[CB]}$; and outputting nothing to the data output$_{[CB]}$; and iii) modifying the rest of nodes$_{[B]}$ in the plurality of nodes being labeled as group B; and 3.2) configuring a phase shift for the primary clock', including:

3.2.1) identifying a path on the directed graph and configuring a phase shift for the primary clock' to which a node on the path is connected;

3.2.2) numbering a total of K nodes on the path, wherein a node$_{[\#1]}$ is the root node and a node$_{[\#K]}$ is one of the leaf nodes;

i) configuring a phase shift for the primary clock' to which a node being labeled as group B is connected, including:

i.1) identifying on the path a set of nodes that are labeled as group B, which includes a node$_{[\#M]}$ and a node$_{[\#N]}$; and i.2) letting $F(x-t_M)=F(x-t_N)$, wherein:

x represents time;

$t_M>t_N$;

$1\leq N<M\leq K$;

$F(x-t_M)$ represents a waveform of the primary clock' to which the node$_{[\#M]}$ is connected;

$t_M$ is a phase shift;

$F(x-t_N)$ represents a waveform of the primary clock' to which the node$_{[\#N]}$ is connected; and $t_N$ is a phase shift;

ii) configuring a phase shift for the primary clock' to which a node being labeled as group A is connected, including:

ii. 1) identifying on the path a set of nodes that are labeled as group A, which includes a node$_{[\#U]}$;

ii.2) when 1<U<K:

identifying a nearest set of nodes to the node$_{[\#U]}$ that are labeled as group B, which includes a node$_{[\#R]}$ and a node$_{[\#S]}$, wherein: R<U<S; and letting exactly one of the two propositions be true:

$F(x-t_U)=F(x-t_R)$, wherein $t_U\geq t_R$; and $F(x-t_U)=F(x-t_S)$, wherein $t_S\geq t_U$;

ii.3) when U=1:

identifying a nearest set of nodes to the node$_{[\#1]}$ that are labeled as group B, which includes a node$_{[\#S]}$; and letting $F(x-t_U)=F(x-t_S)$, wherein $t_S\geq t_U$; and ii.4) when U=K:

identifying a nearest set of nodes to the node$_{[\#K]}$ that are labeled as group B, which includes node$_{[\#R]}$; and letting $F(x-t_U)=F(x-t_R)$, wherein $t_U\geq t_R$, wherein:

x represents time;

$F(x-t_R)$ represents a waveform of the primary clock' to which the node$_{[\#R]}$ is connected;

$t_R$ indicates the waveform's phase;

$F(x-t_U)$ represents a waveform of the primary clock' to which the node$_{[\#U]}$ is connected;

$t_U$ indicates the waveform's phase;

$F(x-t_S)$ represents a waveform of the primary clock' to which the node$_{[\#S]}$ is connected; and $t_S$ indicates the waveform's phase; and 3.2.3) identifying an other path on the directed graph and configuring a phase shift for the primary clock' to which a node on the other path is connected.

2. The method in claim 1, wherein S3.1.2 further includes:

configuring for the clock model$_{[CA]}$ a clock detector$_{[E1]}$ and a sampler$_{[CAs]}$;

configuring for the clock detector$_{[E1]}$ a user enable$_{[E1]}$, a clock input$_{[E1]}$ and an active-edge output$_{[E1]}$;

configuring for the sampler$_{[CAs]}$ a data input$_{[CAs]}$, an enable$_{[CAs]}$, a clock input$_{[CAs]}$ and a data output$_{[CAs]}$;

connecting the user enable$_{[E1]}$ to the user enable$_{[CA]}$;

connecting the clock input$_{[E1]}$ and the clock input$_{[CAs]}$ to the clock input$_{[CA]}$;

connecting the active-edge output$_{[E1]}$ to the enable$_{[CAs]}$;

connecting the data input$_{[CAs]}$ to the data input$_{[CA]}$; and connecting the data output$_{[CAs]}$ to the data output$_{[CA]}$.

3. The method in claim 2, wherein S3.1.2 further includes:

configuring for the sampler$_{[CAs]}$ a first state holder$_{[Re1]}$, a second state holder$_{[Re2]}$ and a multiplexer$_{[MUX1]}$;

configuring for the first state holder$_{[Re1]}$ a clock input$_{[Re1]}$, a data input$_{[Re1]}$ and a data output$_{[Re1]}$;

configuring for the second state holder$_{[Re2]}$ a clock input$_{[Re2]}$, a data input$_{[Re2]}$ and a data output$_{[Re2]}$;

configuring for the multiplexer$_{[MUX1]}$ a first data input$_{[MUX1]}$, a second data input$_{[MUX1]}$, a signal selection$_{[MUX1]}$ and a data output$_{[MUX1]}$;

connecting the data input$_{[Re1]}$ to the data input$_{[CAs]}$;

connecting the data output$_{[MUX1]}$ to the data output$_{[CAs]}$;

connecting the clock input$_{[Re1]}$ and the clock input$_{[Re2]}$ to the clock input$_{[CAs]}$;

connecting the data output$_{[Re1]}$ to the first data input$_{[MUX1]}$;

connecting the data input$_{[Re2]}$ to the data output$_{[MUX1]}$;

connecting the data output$_{[Re2]}$ to the second data input$_{[MUX1]}$; and connecting the enable$_{[CAs]}$ to the signal selection$_{[MUX1]}$.

4. The method in claim 1, wherein:

S2.1 further includes identifying on the sequential cell:

a data input;

a user-clock input;

a data output; and an enable; and

S3.1.2 further includes:

configuring for the clock model$_{[CA]}$ a data input$_{[CA]}$, a data output$_{[CA]}$, a user enable$_{[CA]}$, a clock input$_{[CA]}$ and an enable$_{[CA]}$;

configuring for the clock model$_{[CA]}$ a clock detector$_{[E1]}$, a first state holder$_{[Re1]}$, a second state holder$_{[Re2]}$, a multiplexer$_{[MUX1]}$ and a multiplexer$_{[MUX2]}$;

configuring for the clock detector$_{[E1]}$ a user enable$_{[E1]}$, a clock input$_{[E1]}$ and an active-edge output$_{[E1]}$;

configuring for the first state holder$_{[Re1]}$ a clock input$_{[Re1]}$, a data input$_{[Re1]}$ and a data output$_{[Re1]}$;

configuring for the second state holder$_{[Re2]}$ a clock input$_{[Re2]}$, a data input$_{[Re2]}$ and a data output$_{[Re2]}$;

configuring for the multiplexer$_{[MUX1]}$ a first data input$_{[MUX1]}$, a second data input$_{[MUX1]}$, a signal selection$_{[MUX1]}$ and a data output$_{[MUX1]}$;

configuring for the multiplexer$_{[MUX2]}$ a first data input$_{[MUX2]}$, a second data input$_{[MUX2]}$, a signal selection$_{[MUX2]}$ and a data output$_{[MUX2]}$;
connecting the second data input$_{[MUX2]}$ to the data input$_{[CA]}$;
connecting the data output$_{[MUX1]}$ to the data output$_{[CA]}$, the data input$_{[Re2]}$ and the first data input$_{[MUX2]}$;
connecting the clock input$_{[Re1]}$, the clock input$_{[Re2]}$ and the clock input$_{[E1]}$ to the clock input$_{[CA]}$;
connecting the user enable$_{[E1]}$ to the user enable$_{[CA]}$;
connecting the active-edge output$_{[E1]}$ to the signal selection$_{[MUX1]}$;
connecting the data output$_{[Re2]}$ to the second data input$_{[MUX1]}$;
connecting the enable$_{[CA]}$ to signal selection$_{[MUX2]}$;
connecting the data output$_{[MUX2]}$ to data input$_{[Re1]}$; and
connecting the data output$_{[Re1]}$ to first data input$_{[MUX1]}$.

5. The method in claim 4, wherein:
the first state holder$_{[Re1]}$ is configured to be a register or a latch; and
the second state holder$_{[Re2]}$ is configured to be a register or a latch.

6. The method in claim 1, wherein S3.1.3 further includes:
configuring for the clock model$_{[CB]}$ a clock detector$_{[E2]}$ and a sampler$_{[CBs]}$;
configuring for the clock detector$_{[E2]}$ a user enable$_{[E2]}$, a clock input$_{[E2]}$ and an active-edge output$_{[E2]}$;
configuring for the sampler$_{[CBs]}$ a clock input$_{[CBs]}$, an enable$_{[CBs]}$, a data input$_{[CBs]}$ and a data output$_{[CBs]}$;
connecting the data input$_{[CBs]}$ to the data input$_{[CB]}$;
connecting the data output$_{[CBs]}$ to the data output$_{[CB]}$;
connecting the clock input$_{[E2]}$ and the clock input$_{[CBs]}$ to the clock input$_{[CB]}$;
connecting the user enable$_{[E2]}$ to the user enable$_{[CB]}$; and
connecting the active-edge output$_{[E2]}$ to the enable$_{[CBs]}$.

7. The method in claim 6, wherein the sampler$_{[CBs]}$ is configured to be a register having an enable.

8. The method in claim 6, wherein S3.1.3 further includes:
configuring for the sampler$_{[CBs]}$ a fourth state holder$_{[Re4]}$ and a multiplexer$_{[MUX3]}$;
configuring for the fourth state holder$_{[Re4]}$ a clock input$_{[Re4]}$, a data input$_{[Re4]}$ and a data output$_{[Re4]}$;
configuring for the multiplexer$_{[MUX3]}$ a first data input$_{[MUX3]}$, a second data input$_{[MUX3]}$, a signal selection$_{[MUX3]}$ and a data output$_{[MUX3]}$;
connecting the first data input$_{[MUX3]}$ to the data input$_{[CBs]}$;
connecting the data output$_{[Re4]}$ to the second data input$_{[MUX3]}$ and the data output$_{[CBs]}$;
connecting the clock input$_{[Re4]}$ to the clock input$_{[CBs]}$;
connecting the signal selection$_{[MUX3]}$ to the enable$_{[CBs]}$; and
connecting the data output$_{[MUX3]}$ to the data input$_{[Re4]}$.

9. The method in claim 1, wherein S3.1.3 further includes:
configuring for the clock model$_{[CB]}$ a third state holder$_{[Re3]}$, a fourth state holder$_{[Re4]}$ and a lookup table$_{[LUT1]}$;
configuring for the third state holder$_{[Re3]}$ a clock input$_{[Re3]}$, a data input$_{[Re3]}$ and a data output$_{[Re3]}$;
configuring for the fourth state holder$_{[Re4]}$ a clock input$_{[Re4]}$, a data input$_{[Re4]}$ and a data output$_{[Re4]}$;
configuring for the lookup table$_{[LUT1]}$ a first data input$_{[LUT1]}$, a second data input$_{[LUT1]}$, a third data input$_{[LUT1]}$, a fourth data input$_{[LUT1]}$ and a data output$_{[LUT1]}$;
connecting the second data input$_{[LUT1]}$ to the data input$_{[CB]}$;
connecting the data output$_{[Re4]}$ to the first data input$_{[LUT1]}$ and the data output$_{[CB]}$;
connecting the clock input$_{[Re3]}$ and the clock input$_{[Re4]}$ to the clock input$_{[CB]}$;
connecting the data input$_{[Re3]}$ and the third data input$_{[LUT1]}$ to the user enable$_{[CB]}$;
connecting the data output$_{[Re3]}$ to the fourth data input$_{[LUT1]}$; and
connecting the data output$_{[LUT1]}$ to the data input$_{[Re4]}$.

10. The method in claim 1, wherein:
S2.1 further includes identifying on the sequential cell:
a data input;
a user-clock input;
a data output; and
an enable; and
S3.1.3 further includes:
configuring for the clock model$_{[CB]}$ a data input$_{[CB]}$, a data output$_{[CB]}$, a user enable$_{[CB]}$, a clock input$_{[CB]}$ and an enable$_{[CB]}$;
configuring for the clock model$_{[CB]}$ a clock detector$_{[E2]}$, a memory cell$_{[ERe1]}$ and a multiplexer$_{[MUX4]}$;
configuring for the clock detector$_{[E2]}$ a user enable$_{[E2]}$, a clock input$_{[E2]}$ and an active-edge output$_{[E2]}$;
configuring for the memory cell$_{[ERe1]}$ a clock input$_{[ERe1]}$, an enable$_{[ERe1]}$, a data input$_{[ERe1]}$ and a data output$_{[ERe1]}$;
configuring for the multiplexer$_{[MUX4]}$ a first data input$_{[MUX4]}$, a second data input$_{[MUX4]}$, a signal selection$_{[MUX4]}$ and a data output$_{[MUX4]}$;
connecting the second data input$_{[MUX4]}$ to the data input$_{[CB]}$;
connecting the signal selection$_{[MUX4]}$ to the enable$_{[CB]}$;
connecting the data output$_{[ERe1]}$ to the data output$_{[CB]}$ and the first data input$_{[MUX4]}$;
connecting the clock input$_{[E2]}$ and the clock input$_{[ERe1]}$ to the clock input$_{[CB]}$;
connecting the user enable$_{[E2]}$ to the user enable$_{[CB]}$;
connecting the active-edge output$_{[E2]}$ to the enable$_{[ERe1]}$; and
connecting the data output$_{[MUX4]}$ to the data input$_{[ERe1]}$.

11. The method in claim 9, wherein the third state holder$_{[Re3]}$ is configured to be a register or a latch.

12. The method in claim 9, wherein the fourth state holder$_{[Re4]}$ is configured to be a register or a latch.

13. The method in claim 1, wherein the active edge is designated to be a rising edge or a falling edge.

14. The method in claim 1, wherein:
in S1, the plurality of sequential cells include:
a sequential cell$_{[A1]}$; and
a sequential cell$_{[B1]}$;
in S2, on the directed graph:
the sequential cell$_{[A1]}$ is converted to a node$_{[A1]}$; and
the sequential cell$_{[B1]}$ is converted to a node$_{[B1]}$;
in S3.1.1:
the node$_{[A1]}$ is labeled as group A; and
the node$_{[B1]}$ is labeled as group B;
in S3.1.2:
a clock model$_{[CA1]}$ is inserted at the node$_{[A1]}$; and
the clock model$_{[CA1]}$ is configured to include a data input$_{[CA1]}$, a data output$_{[CA1]}$, a user enable$_{[CA1]}$ and a clock input$_{[CA1]}$;
in S3.1.3:
a clock model$_{[CB1]}$ is inserted at the node$_{[B1]}$; and
the clock model$_{[CB1]}$ is configured to include a data input$_{[CB1]}$, a data output$_{[CB1]}$, a user enable$_{[CB1]}$ and a clock input$_{[CB1]}$;

S3.1 further includes:
configuring for the clock model$_{[CA1]}$ a sampler$_{[CA1s]}$;
configuring for the sampler$_{[CA1s]}$ a data input$_{[CA1s]}$, an enable$_{[CA1s]}$, a clock input$_{[CA1s]}$ and a data output$_{[CA1s]}$;
configuring for the clock model$_{[CB1]}$ a sampler$_{[CB1s]}$;
configuring for the sampler$_{[CB1s]}$ a data input$_{[CB1s]}$, an enable$_{[CB1s]}$, a clock input$_{[CB1s]}$ and a data output$_{[CB1s]}$;
identifying an anchor to which the user enable$_{[CA1]}$ is connected; and
if the user enable$_{[CB1]}$ is connected to the anchor:
configuring jointly for the clock model$_{[CA1]}$ and for the clock model$_{[CB1]}$ a clock detector$_{[E12]}$;
configuring for the clock detector$_{[E12]}$ a user enable$_{[E12]}$, a clock input$_{[E12]}$ and an active-edge output$_{[E12]}$;
connecting the user enable$_{[E12]}$ to the anchor, the user enable$_{[CA1]}$ and the user enable$_{[CB1]}$;
connecting the clock input$_{[E12]}$ to the clock input$_{[CA1s]}$, the clock input$_{[CA1]}$, the clock input$_{[CB1s]}$ and the clock input$_{[CB1]}$;
connecting the active-edge output$_{[E12]}$ to the enable$_{[CA1s]}$ and to the enable$_{[CB1s]}$;
connecting the data input$_{[CA1s]}$ to the data input$_{[CA1]}$;
connecting the data output$_{[CA1s]}$ to the data output$_{[CA1]}$;
connecting the data input$_{[CB1s]}$ to the data input$_{[CB1]}$; and
connecting the data output$_{[CB1s]}$ to the data output$_{[CB1]}$.

15. The method in claim 1, wherein:
in S1, the plurality of sequential cells include:
a sequential cell$_{[A1]}$; and
a sequential cell$_{[A2]}$;
in S2, on the directed graph:
the sequential cell$_{[A1]}$ is converted to a node$_{[A1]}$; and
the sequential cell$_{[A2]}$ is converted to a node$_{[A2]}$;
in S3.1.1: the node$_{[A1]}$ and the node$_{[A2]}$ are both labeled as group A;
in S3.1.2:
a clock model$_{[CA1]}$ is inserted at the node$_{[A1]}$; and
the clock model$_{[CA1]}$ is configured to include a data input$_{[CA1]}$, a data output$_{[CA1]}$, a user enable$_{[CA1]}$ and a clock input$_{[CA1]}$;
a clock model$_{[CA2]}$ is inserted at the node$_{[A2]}$; and
the clock model$_{[CA2]}$ is configured to include a data input$_{[CA2]}$, a data output$_{[CA2]}$, a user enable$_{[CA2]}$ and a clock input$_{[CA2]}$;
S3.1 further includes:
configuring for the clock model$_{[CA1]}$ a sampler$_{[CA1s]}$;
configuring for the sampler$_{[CAs1]}$ a data input$_{[CA1s]}$, an enable$_{[CA1s]}$, a clock input$_{[CA1s]}$ and a data output$_{[CA1s]}$;
configuring for the clock model$_{[CA2]}$ a sampler$_{[CA2s]}$;
configuring for the sampler$_{[CA2s]}$ a data input$_{[CA2s]}$, an enable$_{[CA2s]}$, a clock input$_{[CA2s]}$ and a data output$_{[CA2s]}$;
identifying an anchor to which the user enable$_{[CA1]}$ is connected; and
if the user enable$_{[CA2]}$ is connected to the anchor:
configuring jointly for the clock model$_{[CA1]}$ and for the clock model$_{[CA2]}$ a clock detector$_{[E12]}$;
configuring for the clock detector$_{[E12]}$ a user enable$_{[E12]}$, a clock input$_{[E12]}$ and an active-edge output$_{[E12]}$;
connecting the user enable$_{[E12]}$ to the anchor, the user enable$_{[CA1]}$ and the user enable$_{[CA2]}$;
connecting the clock input$_{[E12]}$ to the clock input$_{[CA1s]}$, the clock input$_{[CA1]}$, the clock input$_{[CA2s]}$ and the clock input$_{[CA2]}$;
connecting the active-edge output$_{[E12]}$ to the enable$_{[CA1s]}$ and to the enable$_{[CA2s]}$;
connecting the data input$_{[CA1s]}$ to the data input$_{[CA1]}$;
connecting the data output$_{[CA1s]}$ to the data output$_{[CA1]}$;
connecting the data input$_{[CA2s]}$ to the data input$_{[CA2]}$; and
connecting the data output$_{[CA2s]}$ to the data output$_{[CA2]}$.

16. The method in claim 1, wherein:
in S1, the plurality of sequential cells include:
a sequential cell$_{[B1]}$; and
a sequential cell$_{[B2]}$;
in S2, on the directed graph:
the sequential cell$_{[B1]}$ is converted to a node$_{[B1]}$; and
the sequential cell$_{[B2]}$ is converted to a node$_{[B2]}$;
in S3.1.1, the node$_{[B1]}$ and the node$_{[B2]}$ are both labeled as group B;
in S3.1.3:
a clock model$_{[CB1]}$ is inserted at the node$_{[B1]}$;
the clock model$_{[CB1]}$ is configured to include a data input$_{[CB1]}$, a data output$_{[CB1]}$, a user enable$_{[CB1]}$ and a clock input$_{[CB1]}$;
a clock model$_{[CB2]}$ is inserted at the node$_{[B2]}$; and
the clock model$_{[CB2]}$ is configured to include a data input$_{[CB2]}$, a data output$_{[CB2]}$, a user enable$_{[CB2]}$ and a clock input$_{[CB2]}$;
S3.1 further includes:
configuring for the clock model$_{[CB1]}$ a sampler$_{[CB1s]}$;
configuring for the sampler$_{[CB1s]}$ a data input$_{[CB1s]}$, an enable$_{[CB1s]}$, a clock input$_{[CB1s]}$ and a data output$_{[CB1s]}$;
configuring for the clock model$_{[CB2s]}$ a sampler$_{[CB2s]}$;
configuring for the sampler$_{[CB2s]}$ a data input$_{[CB2s]}$, an enable$_{[CB2s]}$, a clock input$_{[CB2s]}$ and a data output$_{[CB2s]}$;
identifying an anchor to which the user enable$_{[CB1]}$ is connected; and
if the user enable$_{[CB2]}$ is connected to the anchor:
configuring jointly for the clock model$_{[CB1]}$ and for the clock model$_{[CB2]}$ a clock detector$_{[E12]}$;
configuring for the clock detector$_{[E12]}$ a user enable$_{[E12]}$, a clock input$_{[E12]}$ and an active-edge output$_{[E12]}$;
connecting the user enable$_{[E12]}$ to the anchor, the user enable$_{[CB1]}$ and the user enable$_{[CB2]}$;
connecting the clock input$_{[E12]}$ to the clock input$_{[CB1s]}$, the clock input$_{[CB1]}$, the clock input$_{[CB2s]}$ and the clock input$_{[CB2]}$;
connecting the active-edge output$_{[E12]}$ to the enable$_{[CB1s]}$ and to the enable$_{[CB2s]}$;
connecting the data input$_{[CB1s]}$ to the data input$_{[CB1]}$;
connecting the data output$_{[CB1s]}$ to the data output$_{[CB1]}$;
connecting the data input$_{[CB2s]}$ to the data input$_{[CB2]}$; and
connecting the data output$_{[CB2s]}$ to the data output$_{[CB2]}$.

17. The method in claim 1, further comprising the steps of:
S4) converting the IC design into a modified design;
S5) implementing the modified design on the FPGA; and S6) validating the IC design with the FPGA on which the modified design is implemented.

18. A method for emulating an IC design with an FPGA, comprising the steps of:

S1) identifying in the IC design:

a primary clock;

a subcircuit;

a plurality of generated clocks, which are derived from the primary clock after being processed by the subcircuit; and a plurality of sequential cells, wherein a user clock being connected to one of the plurality of sequential cells is the primary clock or one of the plurality of generated clocks;

S2) converting the IC design to a directed graph, including:

2.1) converting the plurality of sequential cells to a plurality of nodes, including:

2.1.1) converting a sequential cell in the plurality of sequential cells to a node, including:

i) identifying on the sequential cell:

a user clock by which the sequential cell is driven;

a data input;

a user-clock input to which the user clock is connected; and a data output; and ii) converting the sequential cell to a node, including:

defining a logic path having a pair of endpoints, wherein: the user-clock input constitutes one of the pair of endpoints; and the data output constitutes the other one of the pair of endpoints;

defining a node on the logic path between the pair of endpoints; and defining an other logic path and defining a node on the other logic path between its pair of endpoints; and 2.1.2) converting the rest of the plurality of sequential cells to nodes; and 2.2) constructing the directed graph by connecting the plurality of nodes; and S3) configuring the plurality of nodes on the directed graph which includes exactly one root node and a plurality of leaf nodes, including:

3.1) inserting a clock $model_{[CA]}$ at a node on the directed graph, including:

3.1.1) labeling all nodes on the directed graph as group A;

3.1.2) modifying the nodes that are labeled as group A, including:

i) configuring the clock $model_{[CA]}$, which includes a data $input_{[CA]}$, a data $output_{[CA]}$, a user $enable_{[CA]}$ and a clock $input_{[CA]}$;

ii) modifying a $node_{[A]}$ in the plurality of nodes being labeled as group A, including:

ii.1) identifying a logic path by which the $node_{[A]}$ is defined in view of S2, wherein:

an endpoint of the logic path is located at a user-clock $input_{[A]}$;

the other endpoint of the logic path is located at a data $output_{[A]}$; and a user $clock_{[A]}$ is connected to the user-clock $input_{[A]}$;

ii.2) inserting the clock $model_{[CA]}$ at the $node_{[A]}$, including:

connecting the data $input_{[CA]}$ to what was connected to the data $input_{[A]}$;

connecting the data $output_{[CA]}$ to what was connected to the data $output_{[A]}$;

connecting the user $enable_{[CA]}$ to what was connected to the user-clock $input_{[A]}$; and connecting the clock $input_{[CA]}$ to a primary clock' which is equal to or greater than the primary clock in frequencies; and ii.3) configuring the clock $model_{[CA]}$, including:

sampling a signal from the data $input_{[CA]}$ at an active edge of the primary clock' to obtain a data sample for a period of the primary clock' led by the active edge;

when an N-th active edge is occurring on the user $clock_{[A]}$:

obtaining a data $sample_{[N]}$ for a contemporary period of the primary clock'; and outputting to the data $output_{[CA]}$ the data $sample_{[N]}$ until an N+1-th active edge occurs on the user $clock_{[A]}$; and when the N+1-th active edge is occurring on the user $clock_{[A]}$:

obtaining a data $sample_{[N+1]}$ for a contemporary period of the primary clock'; and outputting to the data $output_{[CA]}$ the data $sample_{[N+1]}$ until an N+2-th active edge occurs on the user $clock_{[A]}$; and iii) modifying the rest of $nodes_{[A]}$ in the plurality of nodes being labeled as group A; and 3.2) configuring a phase shift for the primary clock', including:

3.2.1) identifying a path on the directed graph and configuring a phase shift for the primary clock' to which a node on the path is connected;

3.2.2) numbering on the path a total of K nodes, which includes:

a $node_{[\#1]}$, which is the root node;

a $node_{[\#H]}$;

a $node_{[\#U]}$; and a $node_{[\#K]}$, which is one of the leaf nodes, wherein:

$$1 \leq H \leq U \leq K;$$

3.2.3) letting $F(x-t_U)=F(x-t_H)$, wherein:

x represents time;

$t_U \geq t_H$;

$F(x-t_U)$ represents a waveform of the primary clock' to which the $node_{[\#U]}$ is connected;

$t_U$ indicates the waveform's phase;

$F(x-t_H)$ represents a waveform of the primary clock' to which the $node_{[\#H]}$ is connected; and $t_H$ indicates the waveform's phase; and 3.2.4) identifying an other path on the directed graph and configuring a phase shift for the primary clock' to which a node on the other path is connected.

19. The method in claim 18, wherein S3.1 further includes:

configuring for the clock $model_{[CA]}$ a clock $detector_{[E1]}$ and a $sampler_{[CAs]}$;

configuring for the clock detector$_{[E1]}$ a user enable$_{[E1]}$, a clock input$_{[E1]}$ and an active-edge output$_{[E1]}$;
configuring for the sampler$_{[CAs]}$ a data input$_{[CAs]}$, an enable$_{[CAs]}$, a clock input$_{[CAs]}$ and a data output$_{[CAs]}$;
connecting the user enable$_{[E1]}$ to the user enable$_{[CA]}$;
connecting the clock input$_{[E1]}$ and the clock input$_{[CAs]}$ to the clock input$_{[CA]}$;
connecting the active-edge output$_{[E1]}$ to the enable$_{[CAs]}$;
connecting the data input$_{[CAs]}$ to the data input$_{[CA]}$; and
connecting the data output$_{[CAs]}$ to the data output$_{[CA]}$.

20. The method in claim 19, wherein S3.1 further includes:
converting for the sampler$_{[CAs]}$ a first state holder$_{[Re1]}$, a second state holder$_{[Re2]}$ and a multiplexer$_{[MUX1]}$;
configuring for the first state holder$_{[Re1]}$ a clock input$_{[Re1]}$, a data input$_{[Re1]}$ and a data output$_{[Re1]}$;
configuring for the second state holder$_{[Re2]}$ a clock input$_{[Re2]}$, a data input$_{[Re2]}$ and a data output$_{[Re2]}$;
configuring for the multiplexer$_{[MUX1]}$ a first data input$_{[MUX1]}$, a second data input$_{[MUX1]}$, a signal selection$_{[MUX1]}$ and a data output$_{[MUX1]}$;
connecting the data input$_{[Re1]}$ to the data input$_{[CAs]}$;
connecting the data output$_{[MUX1]}$ to the data output$_{[CAs]}$;
connecting the clock input$_{[Re1]}$ and the clock input$_{[Re2]}$ to the clock input$_{[CAs]}$;
connecting the data output$_{[Re1]}$ to the first data input$_{[MUX1]}$;
connecting the data input$_{[Re2]}$ to the data output$_{[MUX1]}$;
connecting the data output$_{[Re2]}$ to the second data input$_{[MUX1]}$; and
connecting the enable$_{[CAs]}$ to the signal selection$_{[MUX1]}$.

21. The method in claim 18, wherein:
in S1, the plurality of sequential cells include:
a sequential cell$_{[A1]}$; and
a sequential cell$_{[A2]}$;
in S2, on the directed graph:
the sequential cell$_{[A1]}$ is converted to a node$_{[A1]}$; and
the sequential cell$_{[A2]}$ is converted to a node$_{[A2]}$;
in S3.1.1: the node$_{[A1]}$ and the node$_{[A2]}$ are both labeled as group A;
in S3.1.2:
a clock model$_{[CA1]}$ is inserted at the node$_{[A1]}$; and
the clock model$_{[CA1]}$ is configured to include a data input$_{[CA1]}$, a data output$_{[CA1]}$, a user enable$_{[CA1]}$ and a clock input$_{[CA1]}$;
s clock model$_{[CA2]}$ is inserted at the node$_{[A2]}$; and
the clock model$_{[CA2]}$ is configured to include a data input$_{[CA2]}$, a data output$_{[CA2]}$, a user enable$_{[CA2]}$ and a clock input$_{[CA2]}$;
S3.1 further includes:
configuring for the clock model$_{[CA1]}$ a sampler$_{[CA1s]}$;
configuring for the sampler$_{[CAs1]}$ a data input$_{[CA1s]}$, an enable$_{[CA1s]}$, a clock input$_{[CA1s]}$ and a data output$_{[CA1s]}$;
configuring for the clock model$_{[CA2]}$ a sampler$_{[CA2s]}$;
configuring for the sampler$_{[CA2s]}$ a data input$_{[CA2s]}$, an enable$_{[CA2s]}$, a clock input$_{[CA2s]}$ and a data output$_{[CA2s]}$;
identifying an anchor to which the user enable$_{[CA1]}$ is connected; and
if the user enable$_{[CA2]}$ is connected to the anchor:
configuring jointly for the clock model$_{[CA1]}$ and for the clock model$_{[CA2]}$ a clock detector$_{[E12]}$;
configuring for the clock detector$_{[E12]}$ a user enable$_{[E12]}$, a clock input$_{[E12]}$ and an active-edge output$_{[E12]}$;
connecting the user enable$_{[E12]}$ to the anchor, the user enable$_{[CA1]}$ and the user enable$_{[CA2]}$;
connecting the clock input$_{[E12]}$ to the clock input$_{[CA1s]}$, the clock input$_{[CA1]}$, the clock input$_{[CA2s]}$ and the clock input$_{[CA2]}$;
connecting the active-edge output$_{[E12]}$ to the enable$_{[CA1s]}$ and to the enable$_{[CA2s]}$;
connecting the data input$_{[CA1s]}$ to the data input$_{[CA1]}$;
connecting the data output$_{[CA1s]}$ to the data output$_{[CA1]}$;
connecting the data input$_{[CA2s]}$ to the data input$_{[CA2]}$; and
connecting the data output$_{[CA2s]}$ to the data output$_{[CA2]}$.

22. A method for emulating an IC design with an FPGA, comprising the steps of:
S1) identifying in the IC design:
a primary clock;
a subcircuit;
a plurality of generated clocks, which are derived from the primary clock after being processed by the subcircuit; and
a plurality of sequential cells, wherein a user clock being connected to one of the plurality of sequential cells is the primary clock or one of the plurality of generated clocks;
S2) converting the IC design to a directed graph, including:
2.1) converting the plurality of sequential cells to a plurality of nodes, including:
2.1.1) converting a sequential cell in the plurality of sequential cells to a node, including:
i) identifying on the sequential cell:
a user clock by which the sequential cell is driven;
a data input;
a user-clock input to which the user clock is connected; and
a data output; and
ii) converting the sequential cell to a node, including:
defining a logic path having a pair of endpoints, wherein: the user-clock input constitutes one of the pair of endpoints; and the data output constitutes the other one of the pair of endpoints;
defining a node on the logic path between the pair of endpoints; and
defining an other logic path and defining a node on the other logic path between its pair of endpoints; and
2.1.2) converting the rest of the plurality of sequential to nodes; and
2.2) constructing the directed graph by connecting the plurality of nodes; and
S3) configuring the plurality of nodes on the directed graph which includes exactly one root node and a plurality of leaf nodes, including:
3.1) inserting a clock model$_{[CB]}$ at a node on the directed graph, including:
3.1.1) labeling all nodes on the directed graph as group B;
3.1.2) modifying the nodes that are labeled as group B, including:
i) configuring the clock model$_{[CB]}$, which includes a data input$_{[CB]}$, a data output$_{[CB]}$, a user enable$_{[CB]}$ and a clock input$_{[CB]}$;

ii) modifying a $node_{[B]}$ in the plurality of nodes being labeled as group B, including:

ii.1) identifying a logic path by which the $node_{[B]}$ is defined in view of S2, wherein:

an endpoint of the logic path is located at a user-clock $input_{[B]}$;

the other endpoint of the logic path is located at a data $output_{[B]}$; and a user $clock_{[B]}$ is connected to the user-clock $input_{[B]}$;

ii.2) inserting the clock $model_{[CB]}$ at the $node_{[B]}$, including:

connecting the data $input_{[CB]}$ to what was connected to the data $input_{[CB]}$;

connecting the data $output_{[CB]}$ to what was connected to the data $output_{[B]}$;

connecting the user $enable_{[CB]}$ to what was connected to the user-clock $input_{[B]}$; and connecting the clock $input_{[CB]}$ to a primary clock' which is equal to or greater than the primary clock in frequencies; and ii.3) configuring the clock $model_{[CB]}$, including:

when an active edge is occurring on the user $clock_{[B]}$ and when an active edge is occurring on the primary clock':

sampling a signal from the data $input_{[CB]}$ to obtain a data sample for a period of the primary clock' led by the active edge; and outputting the data sample to the data $output_{[CB]}$; and when no active edge occurs on the user $clock_{[B]}$ or no active edge occurs on the primary clock':

sampling nothing from the data $input_{[CB]}$; and outputting nothing to the data $output_{[CB]}$; and iii) modifying the rest of $nodes_{[B]}$ in the plurality of nodes being labeled as group B; and 3.2) configuring a phase shift for the primary clock', including:

3.2.1) identifying a path on the directed graph and configuring a phase shift for the primary clock' to which a node on the path is connected;

3.2.2) numbering on the path a total of K nodes, which includes:

a $node_{[\#1]}$, which is the root node;

a $node_{[\#N]}$;

a $node_{[\#M]}$; and a $node_{[\#K]}$, which is one of the leaf nodes, wherein:

$$1 \leq N \leq M \leq K;$$

3.2.3) letting F $(x-t_M)$=F $(x-t_N)$, wherein:

x represents time;

$t_M > t_N$;

F $(x-t_M)$ represents a waveform of the primary clock' to which the $node_{[\#M]}$ is connected;

$t_M$ indicates the waveform's phase;

F $(x-t_N)$ represents a waveform of the primary clock' to which the $node_{[\#N]}$ is connected; and $t_N$ indicates the waveform's phase; and 3.2.4) identifying an other path on the directed graph and configuring a phase shift for the primary clock' to which a node on the other path is connected.

23. The method in claim 22, wherein S3.1 further includes:

configuring for the clock $model_{[CB]}$ a clock $detector_{[E2]}$ and a $sampler_{[CBs]}$;

configuring for the clock $detector_{[E2]}$ a user $enable_{[E2]}$, a clock $input_{[E2]}$ and an active-edge $output_{[E2]}$;

configuring for the $sampler_{[CBs]}$ a clock $input_{[CBs]}$, an $enable_{[CBs]}$, a data $input_{[CBs]}$ and a data $output_{[CBs]}$;

connecting the data $input_{[CBs]}$ to the data $input_{[CB]}$;

connecting the data $output_{[CBs]}$ to the data $output_{[CB]}$;

connecting the clock $input_{[E2]}$ and the clock $input_{[CBs]}$ to the clock $input_{[CB]}$;

connecting the user $enable_{[E2]}$ to the user $enable_{[CB]}$; and connecting the active-edge $output_{[E2]}$ to the $enable_{[CBs]}$.

24. The method in claim 23, wherein the $sampler_{[CBs]}$ is configured to be a register having an enable.

25. The method in claim 23, wherein:

in S1, the plurality of sequential cells include:

a sequential $cell_{[B1]}$; and a sequential $cell_{[B2]}$;

in S2, on the directed graph:

the sequential $cell_{[B1]}$ is converted to a $node_{[B1]}$; and the sequential $cell_{[B2]}$ is converted to a $node_{[B2]}$;

in S3.1.1: the $node_{[B1]}$ and the $node_{[B2]}$ are both labeled as group B;

in S3.1.2:

a clock $model_{[CB1]}$ is inserted at the $node_{[B1]}$;

the clock $model_{[CB1]}$ is configured to include a data $input_{[CB1]}$, a data $output_{[CB1]}$, a user $enable_{[CB1]}$ and a clock $input_{[CB1]}$;

a clock $model_{[CB2]}$ is inserted at the $node_{[B2]}$; and the clock $model_{[CB2]}$ is configured to include a data $input_{[CB2]}$, a data $output_{[CB2]}$, a user $enable_{[CB2]}$ and a clock $input_{[CB2]}$;

S3.1 further includes:

configuring for the clock $model_{[CB1]}$ a $sampler_{[CB1s]}$;

configuring for the $sampler_{[CB1s]}$ a data $input_{[CB1s]}$, an $enable_{[CB1s]}$, a clock $input_{[CB1s]}$ and a data $output_{[CB1s]}$;

configuring for the clock $model_{[CB2s]}$ a $sampler_{[CB2s]}$;

configuring for the $sampler_{[CB2s]}$ a data $input_{[CB2s]}$, an $enable_{[CB2s]}$, a clock $input_{[CB2s]}$ and a data $output_{[CB2s]}$;

identifying an anchor to which the user $enable_{[CB1]}$ is connected; and if the user $enable_{[CB2]}$ is connected to the anchor:

configuring jointly for the clock $model_{[CB1]}$ and for the clock $model_{[CB2]}$ a clock $detector_{[E12]}$;

configuring for the clock $detector_{[E12]}$ a user $enable_{[E12]}$, a clock $input_{[E12]}$ and an active-edge $output_{[E12]}$;

connecting the user $enable_{[E12]}$ to the anchor, the user $enable_{[CB1]}$ and the user $enable_{[CB2]}$;

connecting the clock $input_{[E12]}$ to the clock $input_{[CB1s]}$, the clock $input_{[CB1]}$, the clock $input_{[CB2s]}$ and the clock $input_{[CB2]}$;

connecting the active-edge $output_{[E12]}$ to the $enable_{[CB1s]}$ and to the $enable_{[CB2s]}$;

connecting the data $input_{[CB1s]}$ to the data $input_{[CB1]}$;

connecting the data $output_{[CB1s]}$ to the data $output_{[CB1]}$;

connecting the data $input_{[CB2s]}$ to the data $input_{[CB2]}$; and connecting the data $output_{[CB2s]}$ to the data $output_{[CB2]}$.

26. A system for emulating an IC design with an FPGA, comprising a processor and a computer-readable storage medium in communication with the processor, wherein: the system implements the method in claim 1 when the processor executes a program in the computer-readable storage medium.

27. A non-transitory computer-readable storage medium in which at least one instruction or at least one program is stored, wherein: the at least one instruction or the at least one program is loadable and executable by a processor to implement the method in claim 1.

* * * * *